United States Patent [19]
Nakai et al.

[11] Patent Number: 5,297,029
[45] Date of Patent: Mar. 22, 1994

[54] SEMICONDUCTOR MEMORY DEVICE

[75] Inventors: Hiroto Nakai, Yokohama; Hideo Kato, Kawasaki; Kaoru Tokushige, Yokohama; Masamichi Asano, Tokyo, all of Japan

[73] Assignee: Kabushiki Kaisha Toshiba, Kawasaki, Japan

[21] Appl. No.: 993,109

[22] Filed: Dec. 18, 1992

[30] Foreign Application Priority Data

Dec. 19, 1991 [JP] Japan ............... 3-354872
Mar. 27, 1992 [JP] Japan ............... 4-68961

[51] Int. Cl.⁵ .............................................. G11C 8/00
[52] U.S. Cl. ......................... 365/238.5; 365/189.12
[58] Field of Search ............ 365/238.5, 189.12, 230.09, 365/239, 240, 230.01

[56] References Cited

U.S. PATENT DOCUMENTS 4,873,671 10/1989 Kowshik ................ 365/189.12
5,050,125 9/1991 Momodomi et al. ............ 365/185
5,210,723 5/1993 Bates ................... 365/238.5

OTHER PUBLICATIONS

NEC Technical Data Book IC Memory (pp. 1431-1458); NEC Corporation; Jul. 1991.
M. Hashimoto et al., "A 20-NS 256K X 4 FIFO Memory," IEEE Journal of Solid-State Circuits, vol. 23, No. 2, Apr. 1988, pp. 490–499.
Mitsubishi Technical Data Book IC Memory (Sec 4, pp. 114 thru 121); Mitsubishi Corp.; Sep. 1991.

*Primary Examiner*—Eugene R. LaRoche
*Assistant Examiner*—A. Zarabian
*Attorney, Agent, or Firm*—Foley & Lardner

[57] ABSTRACT

In reading data, data is transferred to data registers starting from a data read start address to the last address at a row (page), and data at the next page is transferred to the data registers starting from a start address to the last address at that page. These operations are repeated. In writing data from an intermediate address of a page, predetermined data is written in data registers not having write data. It is possible to read data at consecutive pages from a first predetermined column address to the page last address, and to read data at consecutive pages from a second predetermined column address to the page last address. For the data structure having a first data structure and a second data structure, it is possible to continuously read a set of data having both the first and second data structures and a set of data having only the second data structure, improving the efficiency of a system using a semiconductor memory device.

6 Claims, 46 Drawing Sheets

OPERATION MODE

| OPERATION MODE | CLE | ALE | NCE | NWE | NRE | NWP | Ready/Busy | I/O |
|---|---|---|---|---|---|---|---|---|
| COMMAND INPUT | H | L | L | ⌐⌐ | H | * | H/L | COMMAND INPUT |
| ADDRESS INPUT (CLOCK) | L | H | L | ⌐⌐ | H | * | H | ADDRESS INPUT |
| SERIALE READ | L | L | L | H | ⌐⌐ | * | H | DATA OUTPUT |
| DATA INPUT | L | L | L | ⌐⌐ | H | H | H | DATA INPUT |
| PROGRAM / ERASE | * | L | * | * | * | H | L | High-Z |
| READ (CELL TO REGISTER) | * | L | * | * | * | H | L | High-Z |
| PROGRAM / ERASE PROTECT | L | H | L | H | ⌐⌐ | L | L/H | * |
| ADDRESS REGISTER READ | L | L | L | H | ⌐⌐ | * | * | DATA OUTPUT |
| DATA REGISTER READ | L | L | L | H | ⌐⌐ | * | * | DATA OUTPUT |

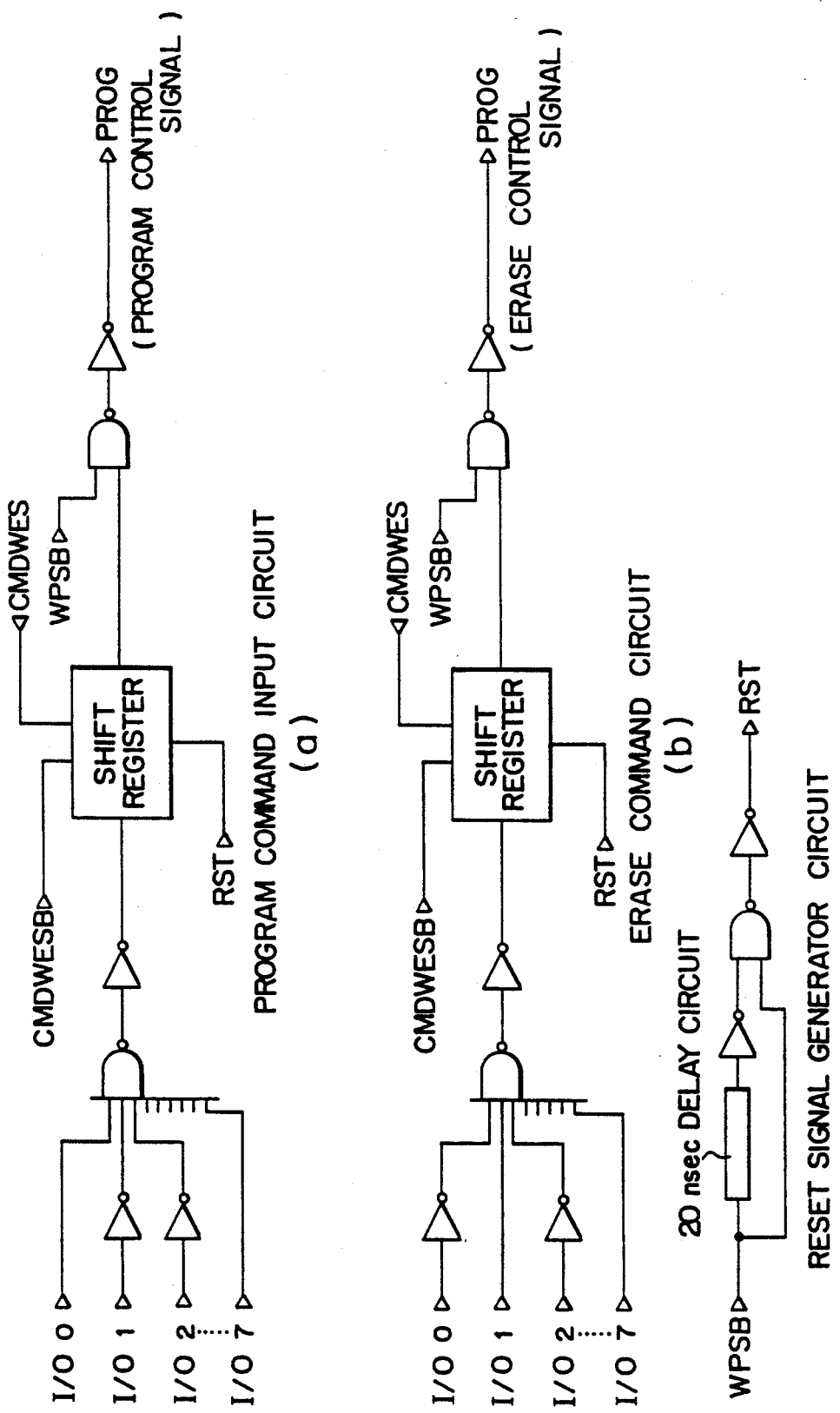

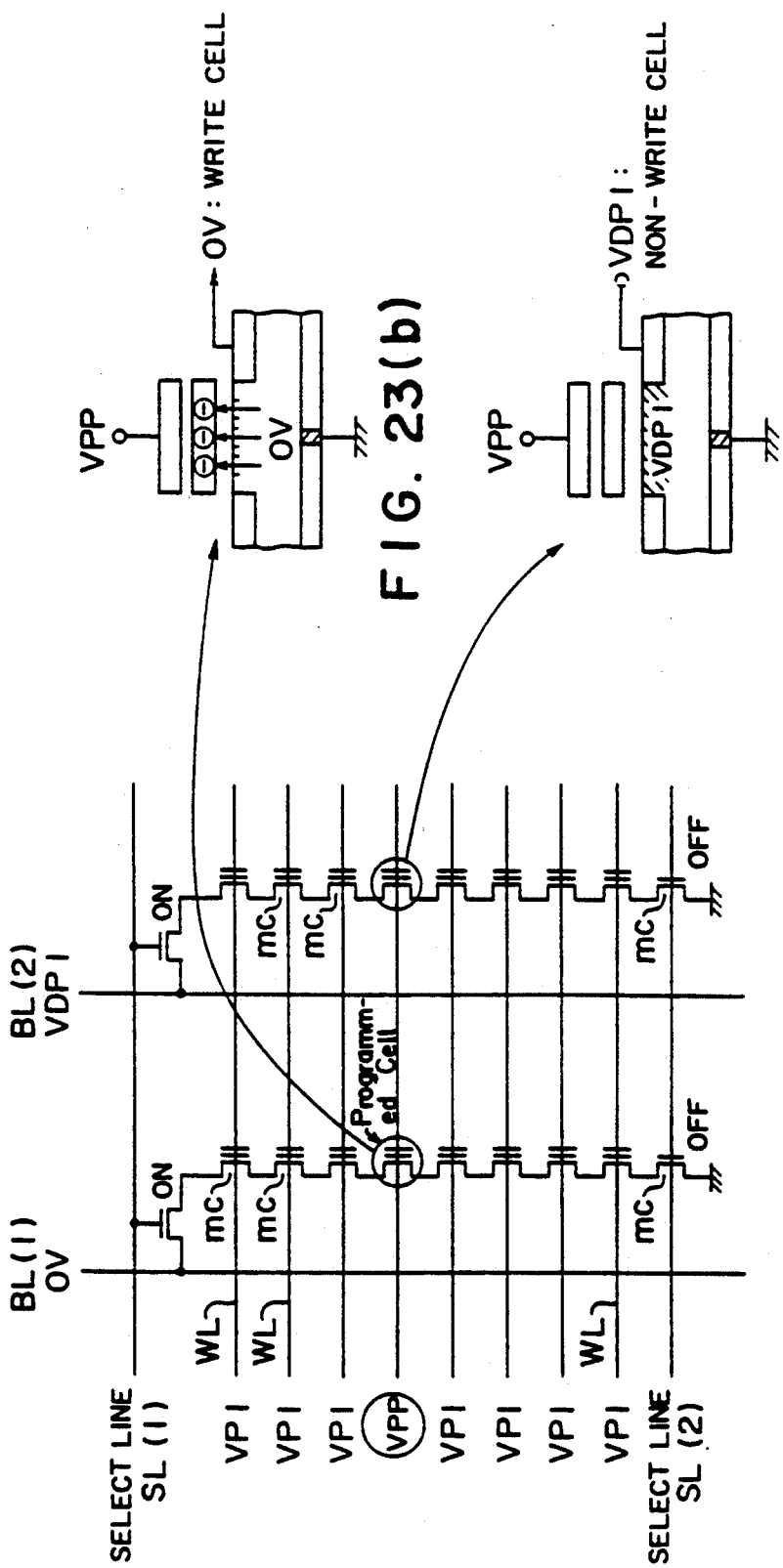

OPERATION MODE TABLE

| MODE | | NWE | NCE | NOE | $VD_{0-7}$ |
|---|---|---|---|---|---|
| READ | READ | H | L | L | DATA OUTPUT |
| | OUTPUT | * | * | H | Hi - Z |
| | STANDBY | * | H | L | |
| COMMAND INPUT | | ⎍ | L | H | DATA INPUT |
| PROGRAM / ERASE | | H | * | H | Hi - Z |
| PROGRAM / ERASE VERIFY | | H | L | L | DATA OUTPUT |

\* : $V_{IH}$ OR $V_{IL}$ (a) 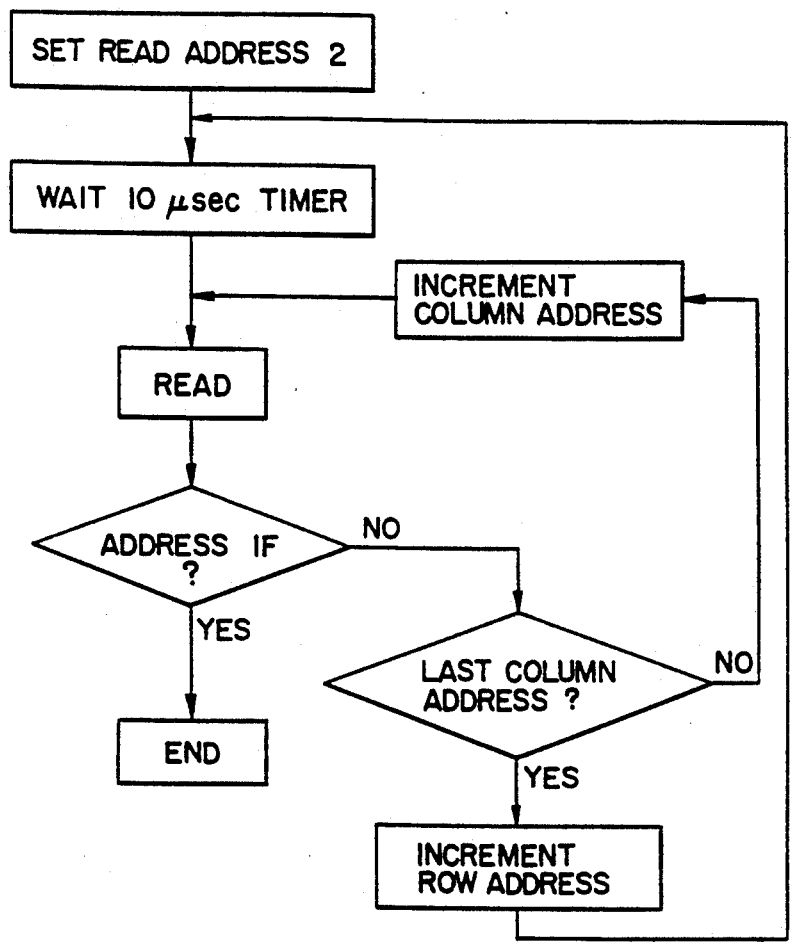
(b) 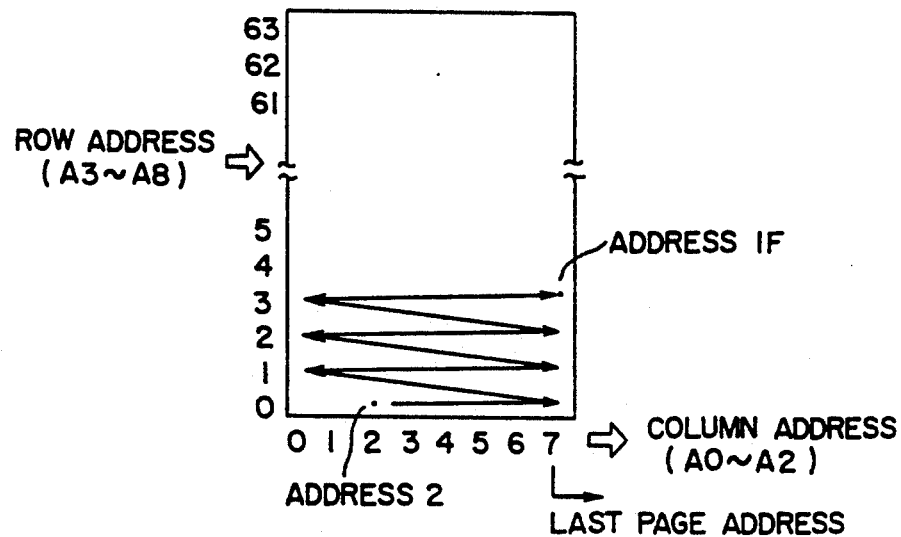
FIG. 30

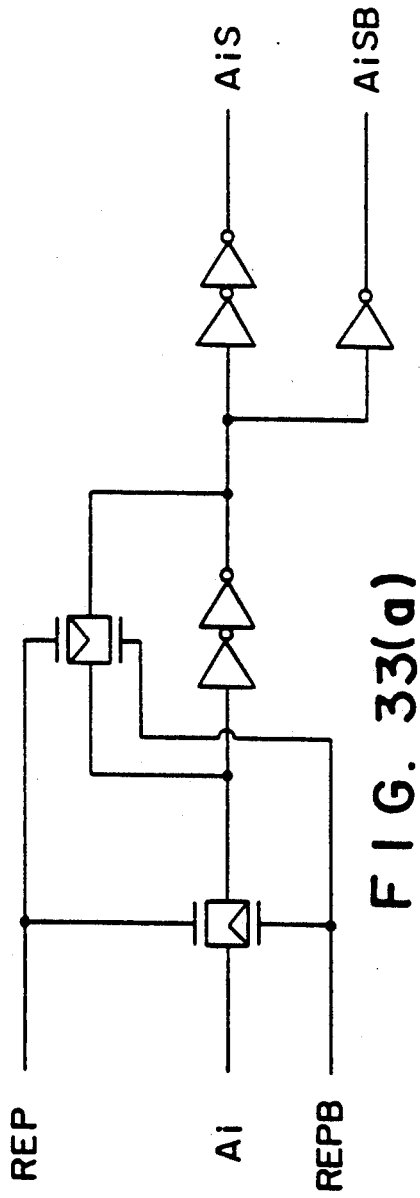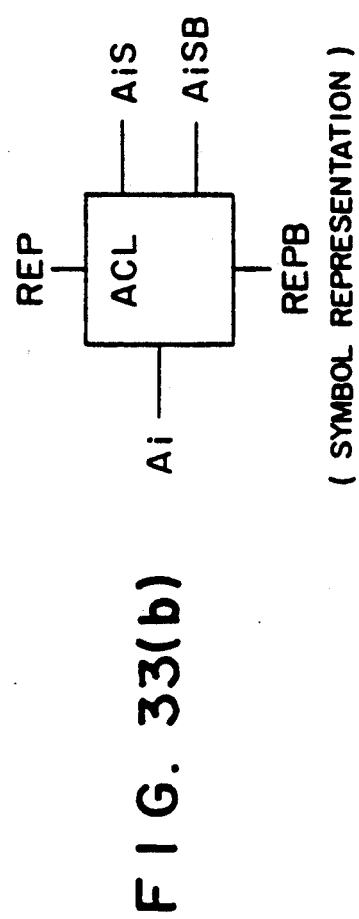
FIG. 33(a)
FIG. 33(b) (SYMBOL REPRESENTATION)

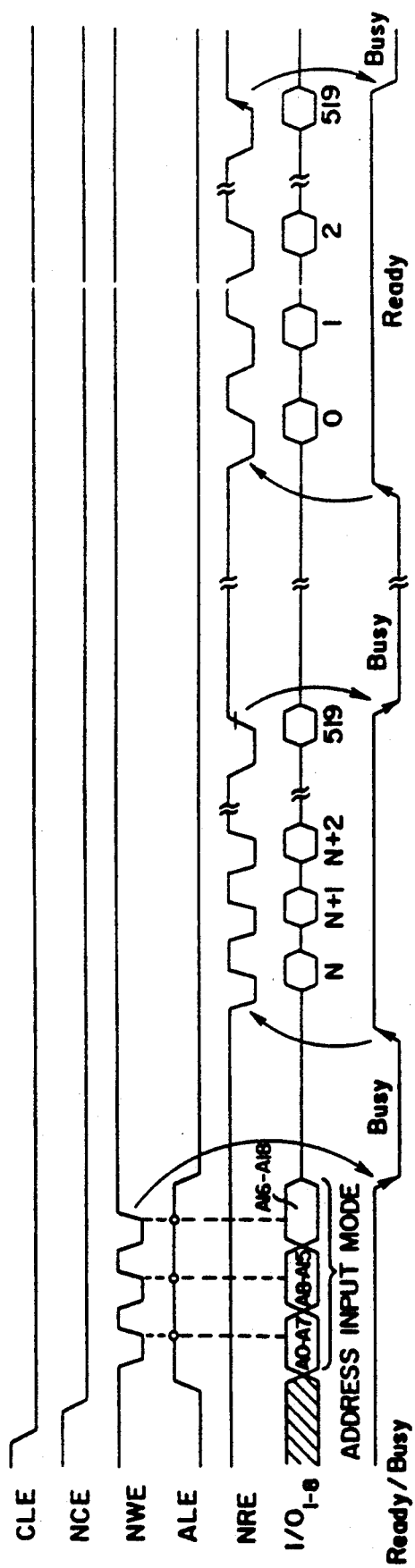

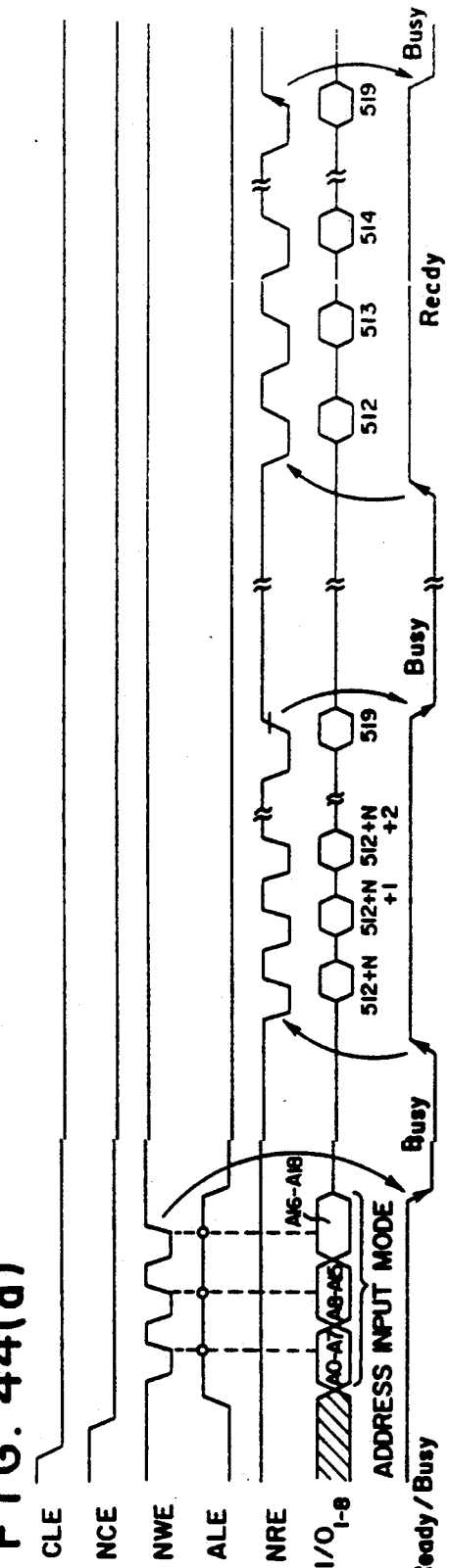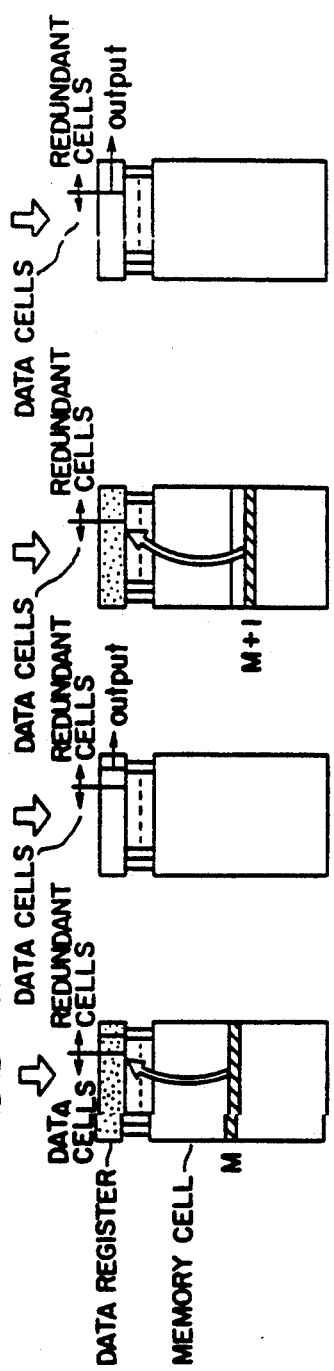

SEMICONDUCTOR MEMORY DEVICE

INDUSTRIAL APPLICATION FIELD

The present invention relates to a semiconductor memory, and more particularly to a semiconductor memory capable of reading and writing data in unit of page.

RELATED ART

In recent electrically erasable and programmable read only memories (EEPROM), particularly NAND type EEPROM, data can be read and written in unit of page (256 bits to several thousands bits) because only a small current flows during data write and erase. NAND type non-volatile semiconductor memories having a capacity of 4 M bits are practically used nowadays (refer to 1988—ISSCC An Experimental 4 MB EEPROM with a NAND Structure Cell).

FIG. 22(a) shows the structure of two NAND bundles each having eight memory cells MC of a floating gate structure and connected between a bit line and a source. The select gate of a memory cell selected for data read is set to a low level, and the select gates of remaining seven memory cells of the NAND bundle are set to a high level. The gate (select line SL(1)) of a select transistor T1 connected between the bit line and the NAND bundle, and the gate (select line SL (2)) of a select transistor T2 connected between ground GND and the NAND bundle, are both set to a high level. In non-volatile semiconductor memories of a NAND structure, as shown in FIG. 2(b), threshold values of data written memory cells distribute on the positive side, and the dose of electrons into memory cells is controlled so that the threshold values of data written memory cells become lower than the gate potential (H level) of non-selected transistors in the NAND bundle. If the threshold voltage of the selected memory cell is positive, current will not flow between the bit line BL and ground GND to set the bit line to the high level. On the contrary, if the threshold value of the selected memory cell is negative, current flows between the bit line and ground GND to set the bit line to the low level. By sensing the potential at the bit line, data in the selected memory cell can be read.

Next, the write operation will be described. As shown in FIG. 23(a), a high voltage ($V_{pp}$) of about 20 V is applied from a row decoder to the select gate of a selected memory cell, and an intermediate voltage (VPI) of about 10 V is applied to the select gates of the other seven memory cells of the NAND bundle 0 V is applied to the select gates of the other NAND bundle. The gate voltage of the select transistor between the NAND bundle containing the selected memory cell and the bit line is set to 12 V, and the gate voltage of the select transistor between the NAND bundle and the source line is set to 0 V. When the bit line is set to 0 V in this condition, the potentials of the drain, source, and channel of all the memory cells in the NAND bundle selected by the select transistors, become 0 V. Therefore, a potential difference of 20 V is generated between the select gate of the selected memory cell and its channel to inject electrons from the substrate into the floating gate. Although a potential difference of 10 V is generated between the select gates of the other seven memory cells of the NAND bundle and their channels, "0" data will not be written in the other seven memory cells because the oxide film thickness between each floating gate and channel is set so as not to allow the injection of electrons at the potential difference of 10 V. If a write inhibit drain voltage (VDPI) of about 10 V is applied to the bit line, the potential difference between the select gate and channel of the selected memory cell becomes 10 V, and data write is not effected. In the above manner, "0" data is written in the selected memory cell by setting the bit line to 0 V, and "1" data is written by setting the bit line to the VDPI voltage.

Lastly, the erase operation will be described. As shown in FIG. 24, data is erased by removing electrons from the floating gate into the substrate, by setting the substrate to 20 V ($V_{pp}$) and the select gate to 0 V. In this case, to relax the gate stress of the select transistor, the select line is set to 20 V ($V_{pp}$). In addition, not to set the P-N junctions in the memory bundle to a forward biased state, bit lines and source lines are opened and set to a potential of about $V_{pp}$.

In semiconductor memories of the NAND structure whose data write is performed using tunnelling current, current flowing in the bit line during data write is small. Therefore, it is possible to write data at the same time in several thousands memory cells.

FIG. 25 illustrates the operation modes of a practically used 4 M NAND structure semiconductor memory. As shown in FIG. 25(a), 512 bits * 8 (I/O)=4096 bit lines are laid out in the column direction, and 128 NAND bundles * 8 bits=1024 word lines are laid out in the row direction. In writing data in this memory, data is inputted from an I/O buffer circuit to respective data registers connected to respective bit lines 512 times (FIG. 25(b)), and thereafter, 4096 bits are simultaneously written in the memory. In reading data from the memory, there are provided two modes. One is a random read mode (FIG. 25(d)) in which a particular column address data is read after transferring data in each memory cell to each data register, and the other is a page read mode (FIG. 25(e)) in which all data in the data registers are only read. When a row address (page address) is switched, the random read mode enters which takes 10 $\mu$sec in reading data in a memory cell. When a column address (intra-page address) is switched, the intra-page read mode enters which takes 70 nsec in reading data, providing a high speed data read. FIG. 26 is a system diagram in block of a semiconductor memory constructed as above. Each bit line is connected to a sense amplifier circuit for judging a potential on the bit line to read data in a memory cell, and to a data register for latching read/write data. Each data register is constructed such that data can be outputted and inputted when it is selected by a column decoder output corresponding to an entered column address. A row decoder circuit is constructed such that the above-described voltages different in the read, write, and erase operations, are supplied to the selected word line, to the other seven word lines of the NAND bundle containing the selected memory cell, and to word lines of other NAND bundles. Each of the read, write, and erase modes is controlled by a command code inputted from the I/O buffer circuit. As shown in FIG. 27, a command code is received by a command register in response to a clock of an external control signal NWE, and the chip operation is determined in accordance with the command decoder output corresponding to the received command code. FIG. 28 shows timings in the random read (page read) and intra-page read modes shown in FIG. 27. The access time ($t_{acc}$) when the row address is switched, is as slow as 10 μsec. However, the access time ($t_{pac}$) when the column address is switched is as fast as 70 nsec. Therefore, an average access time for continuous data read of one page is as high as (10 μsec+70 nsec * 511)/512=89.3 nsec. FIG. 29 shows timings of input waveforms when simultaneous data write is performed after serial data input. When a command code [40] is inputted from the I/O buffer, the controller sets the chip to take a 512-byte serial data input mode, and the 512-byte data and the row address are inputted in response to clocks of the external control signal NWE. When the 512-th byte data is inputted, data of 4096 bits are automatically written. Thereafter, to check whether the data has been written correctly, a user enters a command [CO] to perform a recovery operation and a verify operation. In the recovery operation, the high voltage supplied to the word lines and bit lines during data write is discharged. In the verify operation, data at all column addresses are read while sequentially incrementing the column address. If the read-out data is different from the data intended to be written, the user is required to enter the command [40] and write data again. In a conventional memory constructed above, in reading data of a desired length from a desired address, it is necessary for the memory control chip to check the column and row addresses and access EEPROM after 10 μsec when the page address is changed, and after 70 nsec when the intra-page address is changed. FIG. 30(a) illustrates a program sequence of the memory control chip for the case where continuous data is read from address 2 to address 1F of a semiconductor memory having three column addresses (A0 to A2) and seven row addresses (A3 to A8). FIG. 30(b) conceptually shows this program sequence. The access time for reading data first is 10 μsec because memory cell data is required to be transferred to data registers. For the data from the address 2 to 7, only the column address changes so that data is read at 70 nsec while sequentially incrementing the column address. For the data at the address 8, the row address changes so that it is necessary to transfer memory cell data to the data registers, requiring the access time of 10 μsec. For the data from address 8 to F, it is continuously read at 70 nsec.

It is therefore necessary for a conventional semiconductor memory to use a program which changes the data read speed in accordance with the number of bits of one page. If the number of bits of one page of a memory to be used changes, the program for the memory control chip is required to be changed.

FIG. 31(a) illustrates the program sequence of the memory control chip for data write in a semiconductor memory having the same column and row address configuration as FIG. 30. As seen from the input waveform timings shown in FIG. 29, a conventional semiconductor memory performs data write after data of one page has been inputted. Therefore, as shown in FIG. 31(a), if data is to be written at addresses 2 to 7, unnecessary dummy data is required to be written at addresses 0 and 1. Assuming that one page has 512 bits and only one bit is to be written, unnecessary data of 511 bits is required to be inputted. Furthermore, in a conventional semiconductor memory, it is necessary to read data in the program verify mode, compare the read data with the program data, and judge whether data is required to be written again, in order to judge whether the program data has been written correctly. The program of the memory control chip for writing data in a conventional semiconductor memory becomes therefore complicated, posing a problem of a long time in writing data in a semiconductor memory.

The present invention has been made under such circumstances. It is therefore a first object of the present invention to provide a semiconductor memory having a short data write time and being capable of using a memory control chip not requiring page address management and providing an easy control of a semiconductor memory chip having a different page address.

Another object of the present invention will be discussed below.

In a conventional semiconductor memory capable of reading and writing data in unit of page, the memory control chip judges during continuous data read whether the data is read at an address in the same page of the preceding address. It is therefore necessary to change the program for the memory control chip if a semiconductor memory having a different number of bits in one page is used. Furthermore, if a number of semiconductor memories each having a different number of bits in one page are used, the memory control chip is required to manage each address length of one page of each semiconductor memory. Also, even if data having a length shorter than one page, data of one page is required to be inputted, posing a problem of a longer data write time.

Data in a hard disk is generally managed in unit of 512 bytes which are stored in an optional location of the disk. For this reason, if data larger than 512 bytes is to be stored, the information of continuity of 512-byte units of such data is required In a NAND type EEPROM used as a hard disk, the number of bits in the column direction is set to 512 bytes (4 M bits), and the continuity information is stored in redundant memory cells (2 bytes). With such an arrangement, one random data read operation enables data registers to read 512-byte (one sector) information and the next sector address (page address information).

FIG. 40 shows the structure of a data storage device constructed of two chips of such a NAND type EEPROM of 4 M bits. In this data storage device, each page has redundant memory cells of two bytes (11 bits of two bytes are actually used) to store each page address. Therefore, each page is constructed of data memory cells of 512 bytes (one sector) and redundant memory cells of 2 bytes for storing page addresses.

A continuous data reading method for such a data storage device will be described below. Consider address data representing page (1) is inputted from CPU. Data in the memory at page (1) is randomly read and transferred to data registers. The data of 512 bytes is read in response to clocks of the external control signal. In response to the following clocks of the external control signal, the redundant memory cell data of 2 bytes is read. Consider then the next page address information read from the redundant memory cells indicates the consecutive page (2). In this case, CPU continues to output clocks of the external control signal and continuously read memory cell data at page (2). With the consecutive page information, data is automatically and randomly read in response to clocks of the external control signal. It is therefore unnecessary to input address data during the random data read from page (2). If the page address next to page (2) is also consecutive, CPU continues to output clocks of the external control signal to continuously read data from page (3). As shown in FIG. 32, the page next to page (3) is a page (1023) of the other chip 2. Therefore, CPU disables the chip 1, and selects the chip 2. CPU then outputs an address of page (1023) to perform a random read at 10 μsec. The data is then serially read in response to clocks of the external control signal. Thereafter, the address of the next page (page (1024) of the chip 2) is read. Next, the page address next to the page (1024) of the chip 2 is read. The page address next to page (1024) of the chip 2 indicates page (1023) of the chip 1. Therefore, CPU disables the chip 2 and selects the chip 1 again. In this way, consecutive data each having 512 bytes is sequentially read. In the redundant memory cells at the last page, consecutive data termination information is being written. When CPU reads this termination information, it disables the chips 1 and 2 to stop reading data.

In a hard disk, only continuity data at each page is generally required to obtain data allocation information for the continuous data read. Only the continuity data at each page is also required to read data, if a memory chip is used in place of a hard disk. However, in an improved NAND type EEPROM described above, each time the continuity data at each page is read, it is necessary to input the start address of redundant cells. Therefore, there occurs a problem of making a larger load of the system controlling a memory chip.

With a conventional semiconductor memory capable of continuously read data in unit of page from an optional address, in continuously reading data from a predetermined address within a page to the last address of the page, it is necessary to input the intra-page address each time the page data read starts.

It is therefore another object of the present invention to provide a semiconductor memory capable of continuously read each page data from a predetermined intra-page address to the last address of the page, without managing the intra-page address.

SUMMARY OF THE INVENTION

In a semiconductor memory according to the present invention, data from the start address to the last address of the same page is continuously read. After reading the data at the page last address, the data of the page is transferred from memory cells to data registers. After this data transfer, a signal indicating a disabled chip access is outputted externally of the chip to automatically allow one page continuous data read.

In writing data, data of one page is supplied to data registers. In this case, a predetermined value of data is set to data registers to which no data is supplied.

According to the semiconductor memory device of the present invention, it is possible to read data at consecutive pages from a first predetermined column address within a page to the last address of the page, and to read data at consecutive pages from a second predetermined column address within a page to the last address of the page. Accordingly, in the semiconductor memory storing a set of data including first and second data structures, it is possible to continuously read a set of data including both the first and second data structures, or continuously read a set of data including only the second data structure, improving the system efficiency of the semiconductor memory.

According to the present invention, the semiconductor memory can be operated without page address management by the memory control chip, further shortening a data write time.

According to the present invention, it is possible to realize a non-volatile semiconductor memory capable of continuously reading data at pages in a memory cell block selected by an upper column address than a predetermined column address without inputting a read start address each time a page address changes, and capable of configuring a system for controlling memory chips.

BRIEF DESCRIPTION OF THE DRAWINGS

FIG. 2 is a table explaining the operation modes of a semiconductor memory device according to the present invention.

FIGS. 21(a)-21(c) show a command circuit and a reset signal generator circuit for explaining the power-on reset operation of a semiconductor memory device according to the present invention.

FIG. 23 is a diagram explaining the operation of memory cells.

FIG. 30(a)-30(b) is a control program sequence diagram for data read of a conventional non-volatile semiconductor memory device.

FIG. 33(a)-33(b) is a detailed diagram of a latch circuit

FIG. 43(a)-44(e) is a timing chart explaining an embodiment of the present invention.

FIG. 44(a)-44(e) is a timing chart explaining an embodiment of the present invention.

EMBODIMENTS

Figure 1:
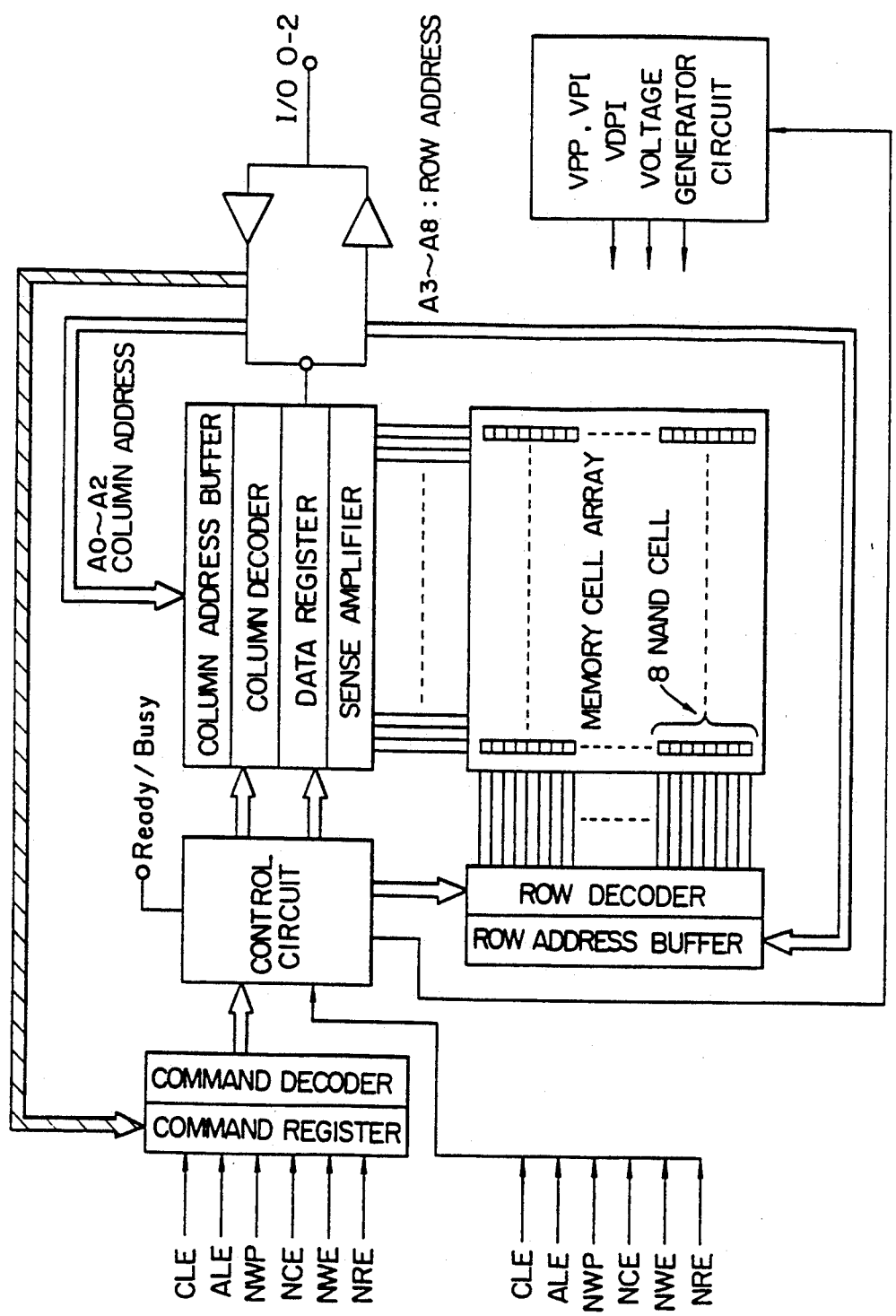
FIG. 1 is a block diagram showing a semiconductor memory according to the present invention.
Figure 26:
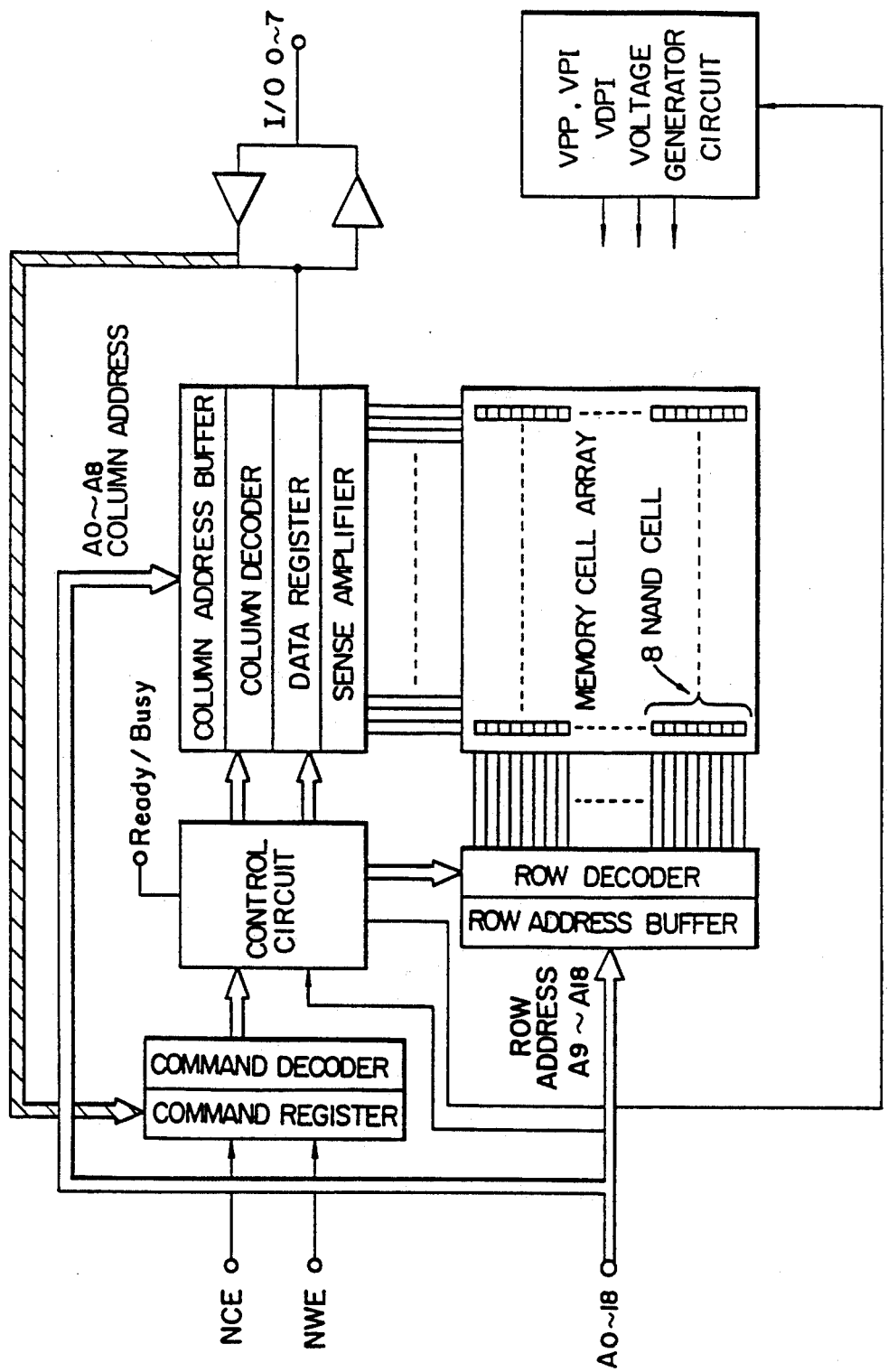
FIG. 26 is a block diagram showing a conventional non-volatile semiconductor memory device.
Figure 27:
FIG. 27 is a table explaining operation modes of a conventional non-volatile semiconductor memory device.
Figure 28:
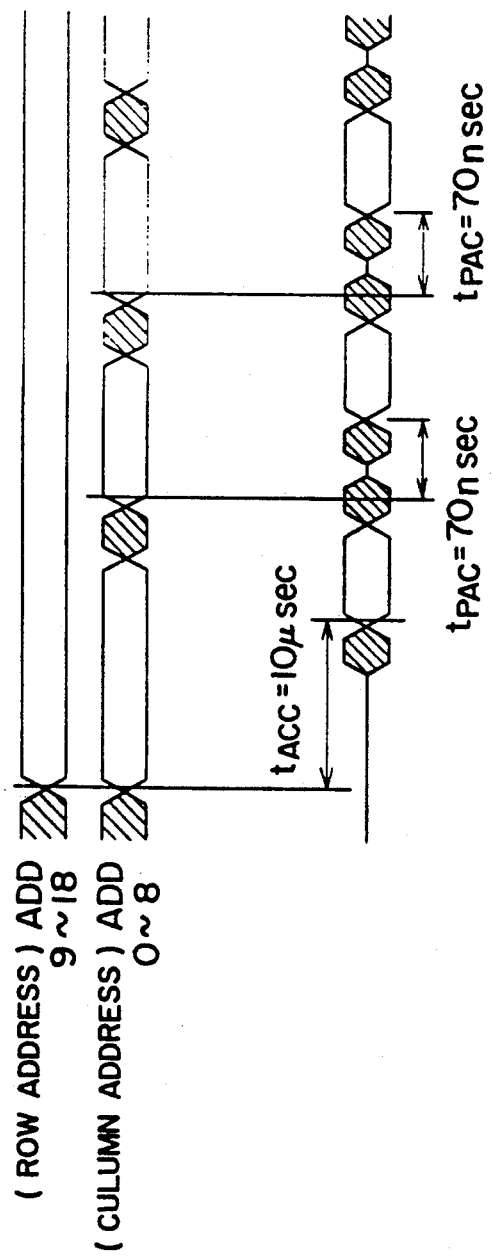
FIG. 28 is a timing chart of a data read operation of a conventional non-volatile semiconductor memory device.
Figure 29:
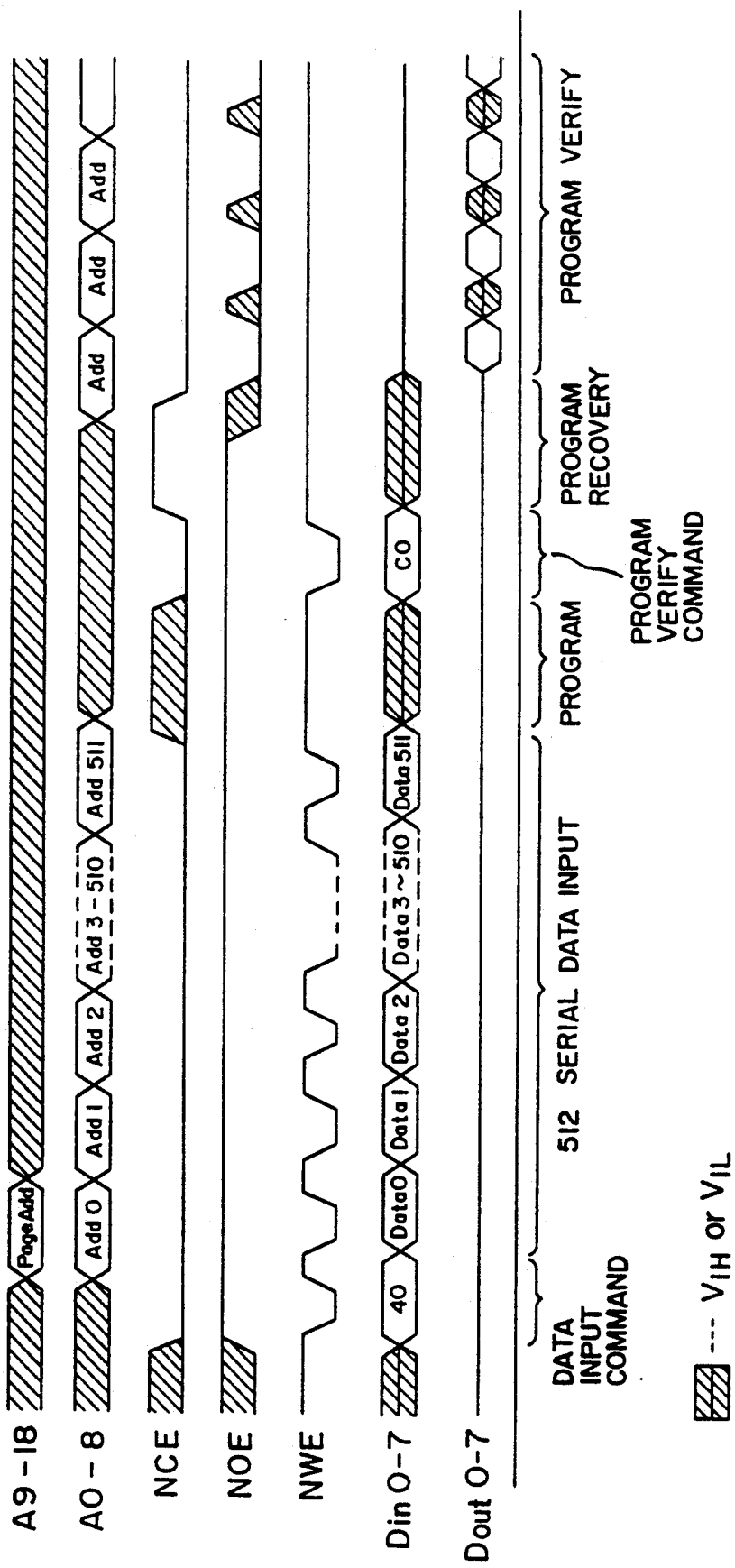
FIG. 29 is a timing chart of a data write operation of a conventional non-volatile semiconductor memory device.

An embodiment of the present invention will be described with reference to the accompanying drawings. FIG. 1 is a system diagram in block showing an embodiment of a non-volatile semiconductor memory device of the present invention. For the simplicity of description, a semiconductor memory of 512 bits * 3 I/O 1536 bits having column addresses (intra-page addresses) A0 to A2 and row addresses (page addresses) A3 to A8 is shown in FIG. 1. Memory cells are of a structure of 8 NAND cells similar to the memory device shown in FIG. 26. The relationship between a bit line potential, word line potential, and select gate potential during read/write is the same as the conventional case. An external address is inputted via an I/O buffer circuit for data read/write. Column addresses A0 to A2 are latched in a column address buffer circuit, and row addresses A3 to A8 are latched in a row address buffer circuit. External control signals are inputted via respective input pins to a command circuit and internal operation control circuit to determine the operation mode of the chip. The control circuit outputs a signal indicating whether the chip is accessible or not to the external circuit via a Ready/Busy pin. FIG. 2 shows the operation modes of the chip to be determined by the external control signals. The external control signal CLE determines a command input mode, and the external control signal ALE determines an address input mode. The external control signal NCE is a chip select signal, and the external control signal NWE operates as a clock signal in response to which input data is fetched during the command input mode, address input mode, or data input mode. The external control signal NRE is a clock signal providing an address increment function for reading continuous addresses following an inputted address during data read, and an output buffer enable function. The semiconductor memory constructed as above enters a data write or erase state when a glitch generates on an inputted data signal and an erroneous command is entered, having a possibility of destructing stored data. To prevent this, the semiconductor memory of this embodiment is provided with a program/erase protect function for inhibiting the data write or erase operation during an "L" state of the external control signal NWP. As described above, a Busy signal of "L" level is outputted from the Read/Busy output terminal when the chip is not accessible, and a Read signal of "H" level is outputted when the chip is accessible.

Figure 3:
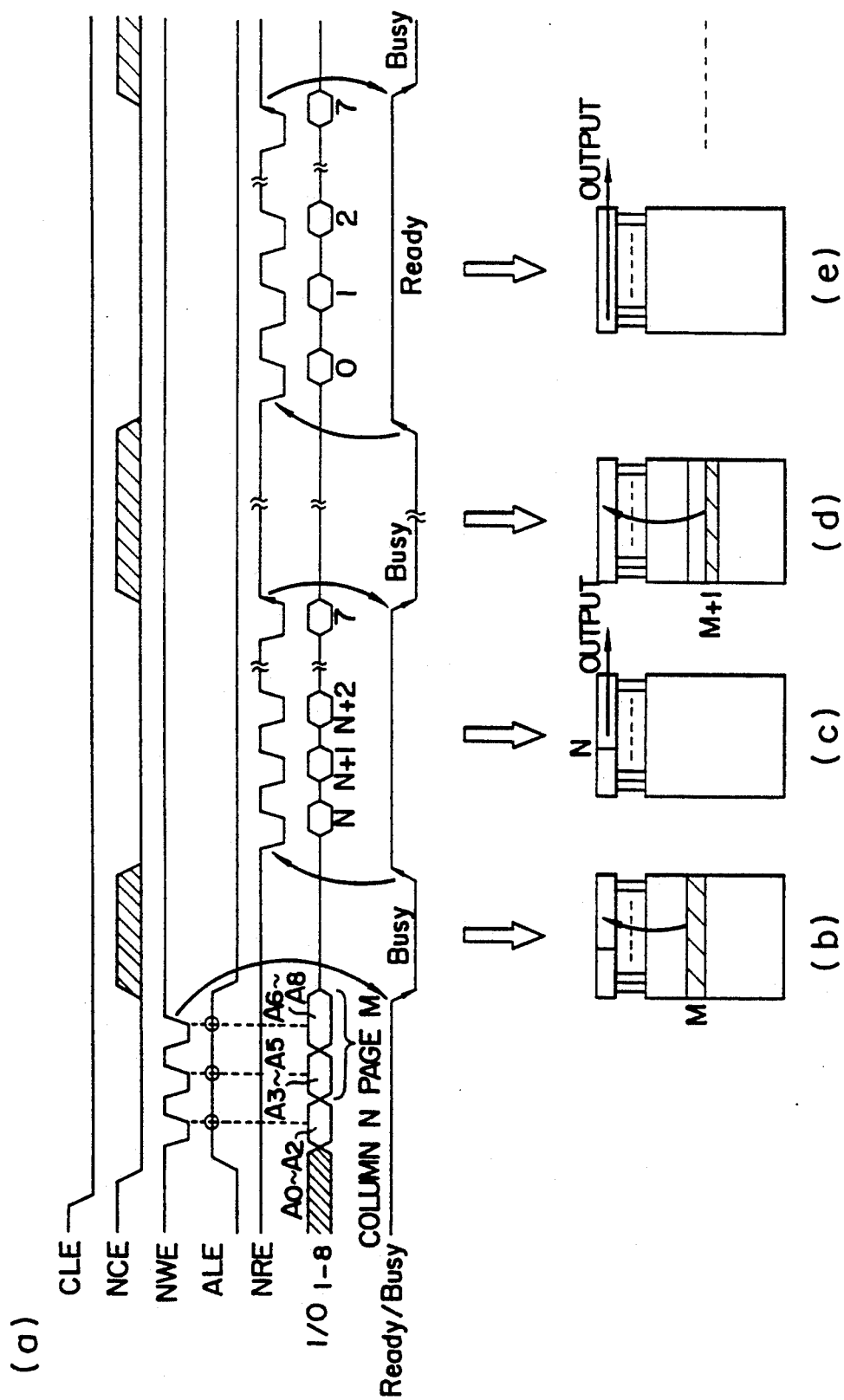
FIG. 3(a)-3(e) is a timing chart of the data read operation of a semiconductor memory device according to the present invention.

Next, the data read operation of the non-volatile semiconductor memory of this embodiment will be described. FIG. 3 shows inputted control signal waveforms and data output timings while data is continuously read starting from the column address N at page address M.

In the address input mode shown in FIG. 2, the column address and page address are inputted in the address buffers, and an access disable signal of "L" level representative of a Busy state is outputted to the external circuit. In this case, as shown in FIG. 3(b), data in memory cells connected to the selected word line is outputted to bit lines and latched by data register circuits. After completion of this latch operation, an access enable signal of "H" level representative of a Ready state is outputted to the external circuit to inform the chip controller of a data accessible state. Next, while incrementing the inputted intra-page address (column address) in response to clocks of the external control signal NRE, data is outputted to the external circuit at an access time of 70 nsec (FIG. 3(c)). When data read at the last address at the same page is completed, the page address is incremented and at the same time, the access disable signal of "L" level representative of the Busy state is outputted to the external circuit and data in memory cells connected to the word line selected by the new page address is latched in the data register circuits (FIG. 3(d)). When this latch operation is completed, the access enable signal of "H" level representative of the Ready state is outputted to the external circuit. While incrementing the intra-page address (column address) starting from address 0 in response to clocks of the external control signal NRE, data is outputted to the external circuit (FIG. 3(e)). This continuous data read is repeated until the data of a desired data length is read. After the last data is read, the external control signal NCE is set to "H" level to terminate a series of data read operations.

Figure 4:
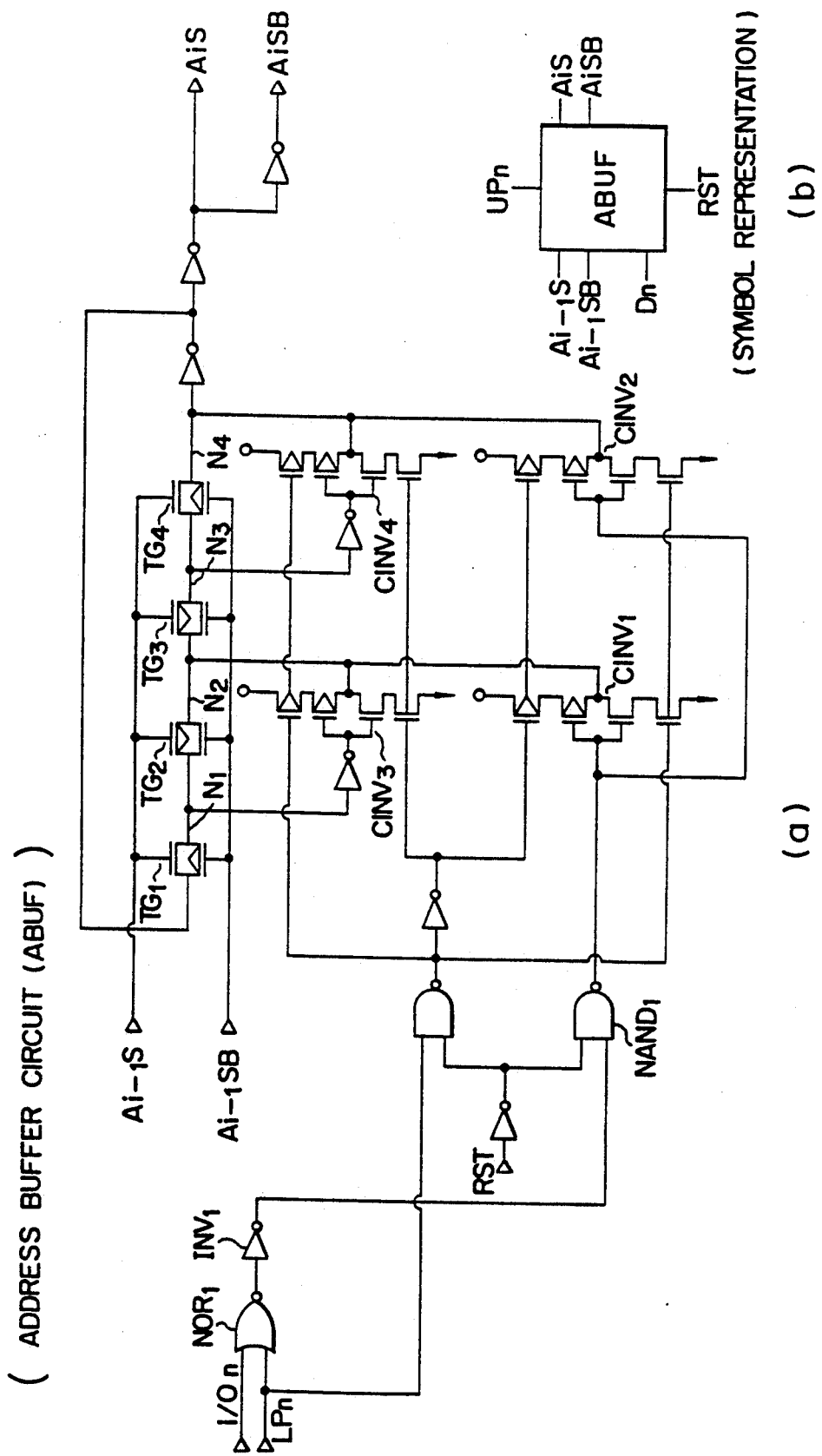
FIG. 4(a)-4(b) is a circuit diagram of an address buffer circuit according to the present invention.

FIG. 4 is a circuit diagram of the address buffer circuit constructed so as to receive an address and provide the address increment operation. This address buffer circuit is constructed of a binary counter using CMOS transfer gates TG1 to TG4, means for setting the contents of the binary counter to the logical level corresponding to the inputted address signal, and means for resetting the contents of the binary counter to a predetermined logical level. Dn is connected to an I/O terminal for receiving address data from the external circuit. A data latch control signal LPn is an internal control signal which takes "L" level for a predetermined period in response to the rising edge of the external control signal NWE during the address input operation mode. While LPn takes "L" level, address data inputted to the I/O terminal is transferred, via a NOR gate NOR1, inverter INV1, NAND gate NAND1, clocked inverter CINV1, and clocked inverter CINV2, to internal nodes N2 and N4 of the binary counter. When LPn takes "H" level after the predetermined period, the clocked inverters CINV1 and CINV2 are inactivated, whereas clocked inverters CINV3 and CINV4 are activated. Therefore, the address data is latched in the binary counter, so that a signal same in phase with the latched address data is outputted from an internal address signal output terminal AiS of the address buffer circuit, and a signal opposite in phase with the latched address data is outputted from an internal address signal output terminal AiSB. Input terminals Ai-1 S and Ai-1 SB of the address buffer circuit are connected to the internal address signal output terminals of the address buffer circuit one circuit before the first mentioned circuit. The address buffer circuits are constructed such that when the internal address signal of the preceding address buffer circuit changes two periods, the internal address of the succeeding address buffer circuit changes one period. The internal address signal in each address buffer circuit is inputted to the corresponding decoder circuit to select a word line and bit line corresponding to the internal address similar to the conventional circuit. A reset signal RST is used for resetting the internal address signal AiS to "L" level and the internal address signal AiSB to "H" level. When the reset signal changes from "L" to "H" to "L", the internal address signal is set to the above-described predetermined logical level.

Figure 5:
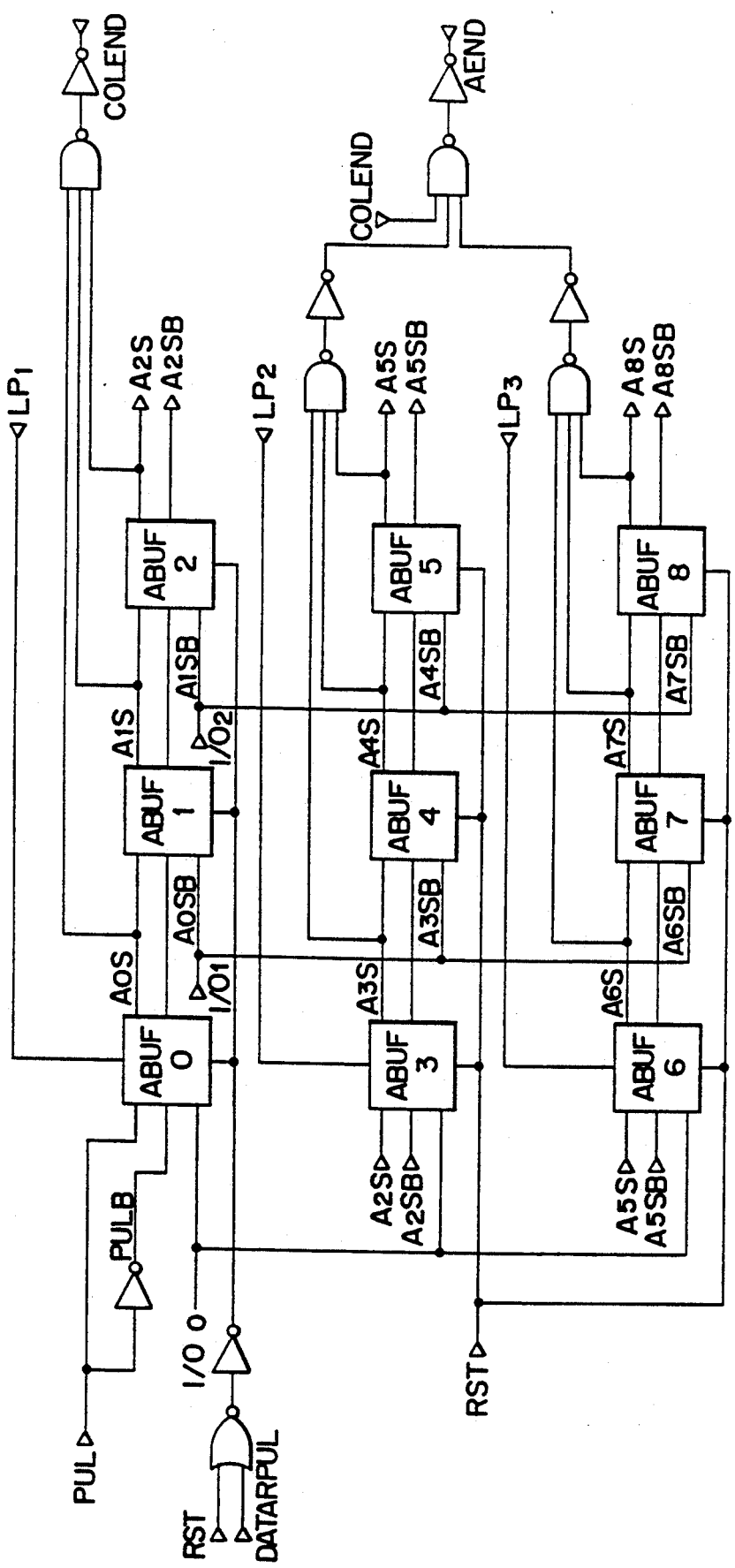
FIG. 5 is a circuit diagram of an address input means according to the present invention.

FIG. 5 is a circuit diagram explaining the operation of the address buffer circuits of a semiconductor memory of 1536 bits having column addresses A0 to A2 and row addresses A3 to A8. In FIG. 5, each of address buffer circuits ABUF0 to ABUF 8 has the same structure as that shown in FIG. 4 and corresponds to each of the addresses A0 to A8.

An address latch control signal LP1 is inputted to the address buffer circuits ABUF0 to ABUF 2 for the addresses A0 to A2, an address latch control signal LP2 is inputted to the address buffer circuits ABUF3 to ABUF 5 for the addresses A3 to A5, and an address latch control signal LP3 is inputted to the address circuits ABUF6 to ABUF8 for the addresses A6 to A8. The data input terminals Dn of the address buffer circuits ABUF0, ABUF3, and ABUF6 are connected in common to an I/O terminal I/O0, and the data input terminals Dn of the address buffer circuits ABUF1, ABUF4, and ABUF7 are connected in common to an I/O terminal I/O1. The data input terminals Dn of the address buffer circuits ABUF2, ABUF5, and ABUF8 are connected in common to an I/O terminal I/O2. Inputted to the reset signal input terminals of the address buffer circuits for the addresses A0 to A2 is an OR signal between the signal RST and a signal DATARPUL. The signal RST takes "H" level to reset the chip upon power-on, and the signal DATAPUL takes "H" level to clear the contents of the address register in the data register read mode to be described later.

The operation of the circuit shown in FIG. 5 will be described with respect to the data read mode operation shown in FIG. 3. When the external control signal NWE is changed from "H" to "L" to "H" in order to input address data from the data input terminal, an address latch control pulse signal LP1 changing from "H" to "L" to "H" generates. The other address latch signals LP2 and LP3 are set to "H". As a result, as described before, address data supplied to the data I/O terminals I/O0, I/O1, and I/O2 is latched in the address buffer circuits for the addresses A0 to A2, and the internal address signals are set to logical levels corresponding to the latched address data. Next, address data for the addresses A3 to A5 is inputted to the data I/O terminals I/O0 to I/O2 and the external control signal NWE is changed from "H" to "L" to "H". Then, the address latch control pulse signal LP2 changing from "H" to "L" to "H" generates. The other address latch control signals LP1 and LP3 are set to "H".

As a result, address data for the addresses A3 to A5 supplied to the data I/O terminals I/O0, I/O1, and I/O2 is latched in the address buffer circuits ABUF3 to ABUF5, and the internal address signals are set to logical levels corresponding to the latched address data. Lastly, address data for the addresses A6 to A8 is inputted to the data I/O terminals I/O0 to I/O2 and the external control signal NWE is changed from "H" to "L" to "H". Then, the address latch control pulse signal LP3 changing from "H" to "L" to "H" generates. The address data for the addresses A6 to A8 is therefore latched in the address buffer circuits ABUF6 to ABUF8. In this way, with three steps of the NWE pulses, address data for the addresses A0 to A8 supplied to the I/O terminals is inputted to the address buffer circuits.

Figure 6:
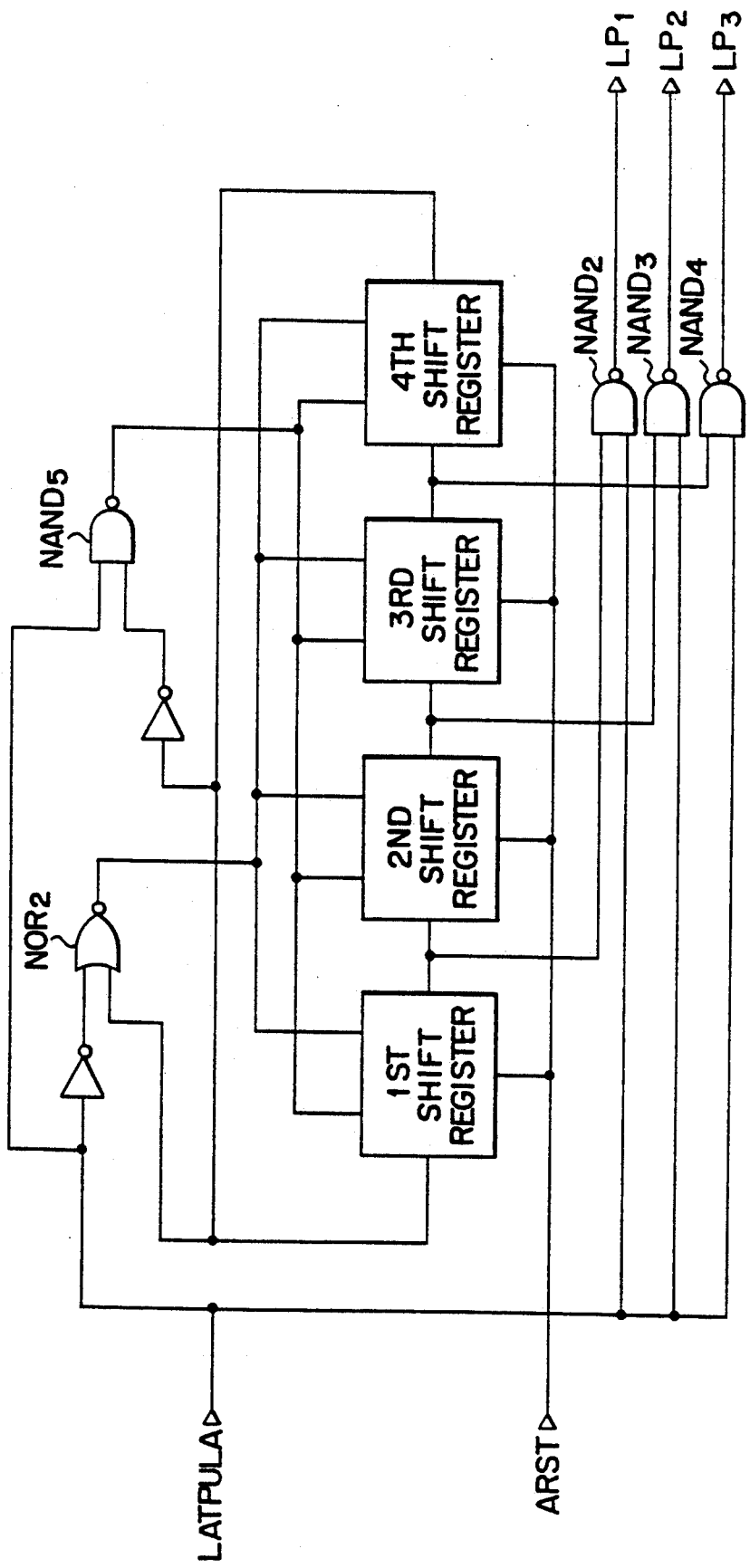
FIG. 6 is a circuit diagram of an address latch control signal generator circuit according to the present invention.
Figure 7:
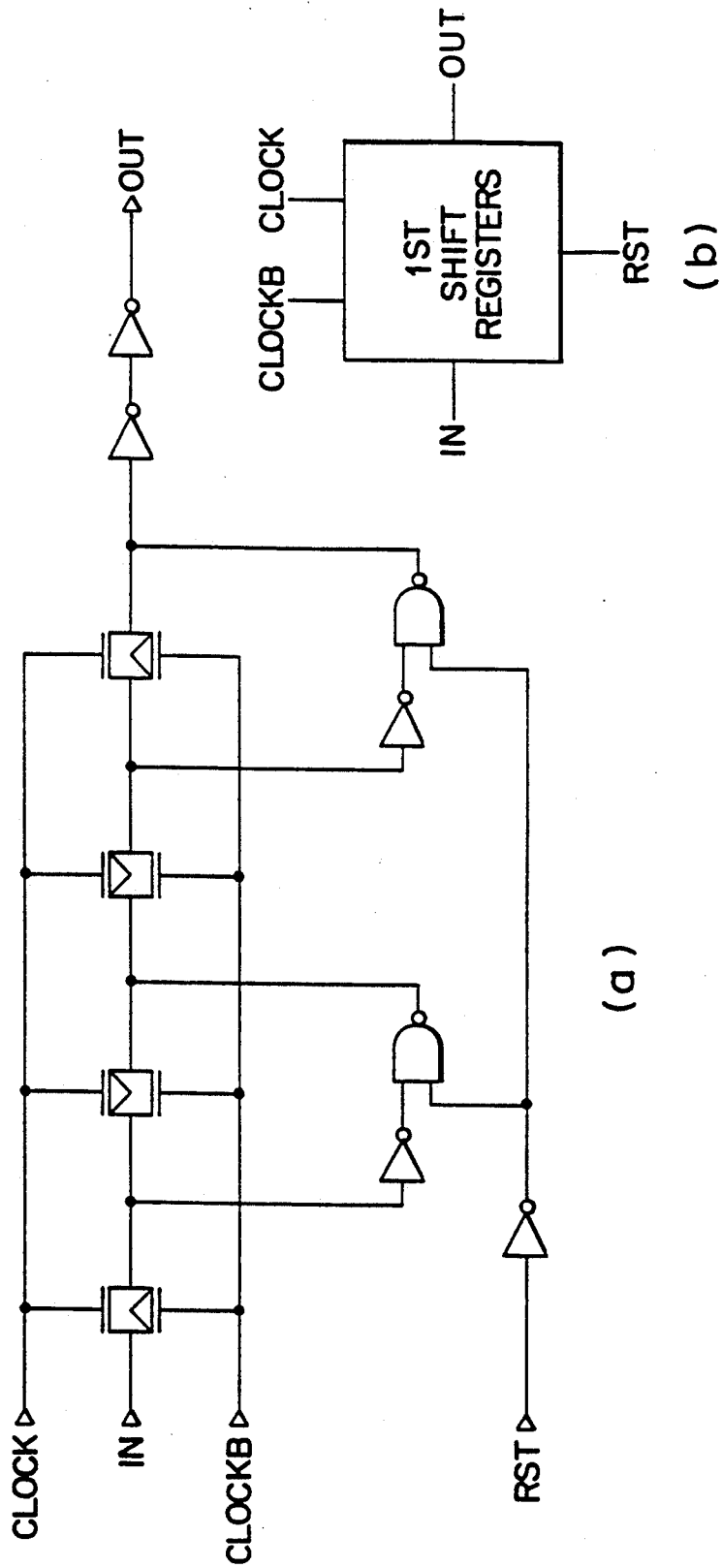
FIG. 7(a)-7(b) is a circuit diagram of a shift register circuit.
Figure 8:
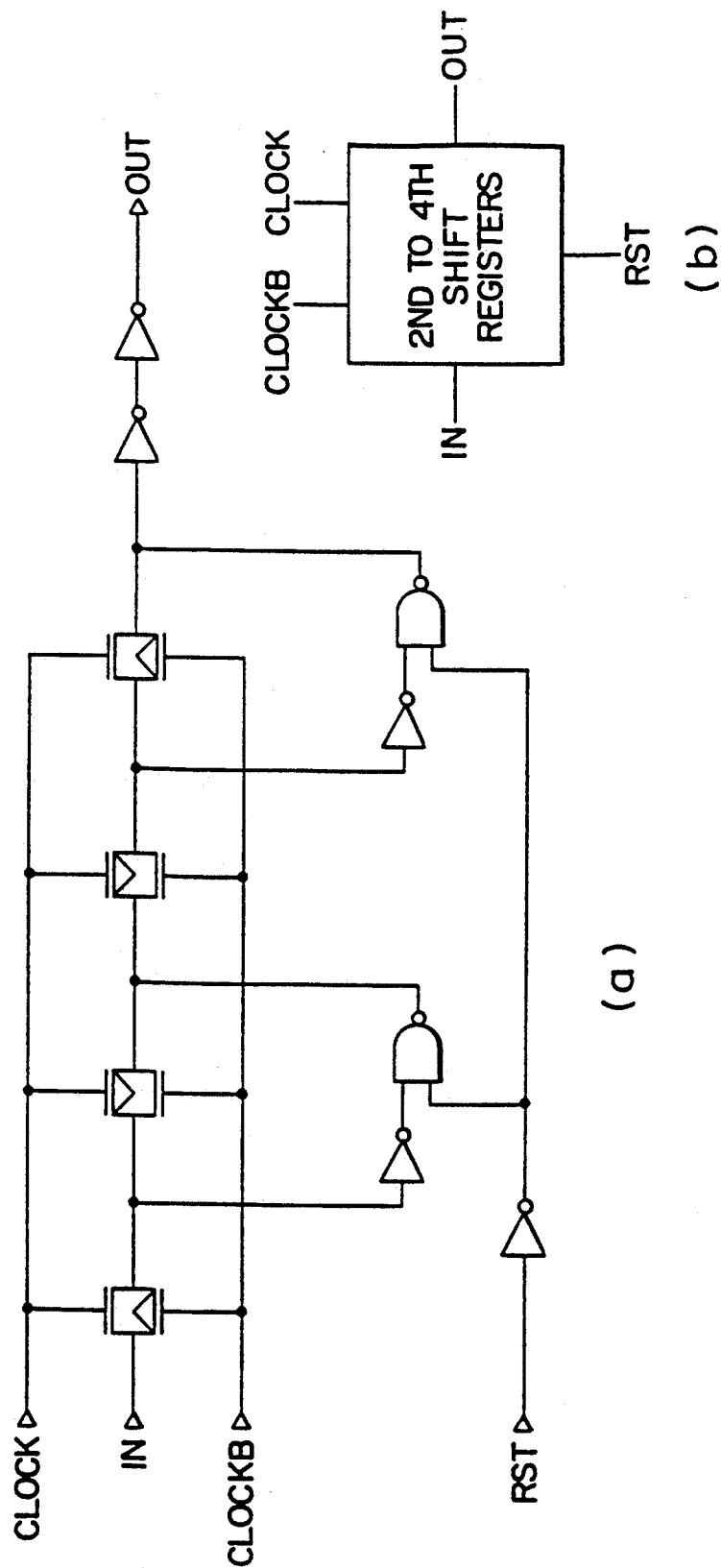
FIG. 8(a)-8(b) is a circuit diagram of another shift register circuit.

FIG. 6 is a circuit diagram of the circuit for generating the address latch control signals LP1 to LP3. Shift registers shown in FIG. 6 each have the same structure as that shown in FIGS. 7 and 8. This circuit generates negative logic data latch pulse signals LP1, LP2, and LP3 during the address data input in response to a LATPULA signal which takes "H" level for a predetermined period starting from the rising edge of the external control signal NWE. When power is switched on or the external control signal ALE changes its level from "H" to "L", the reset signal ARST takes "H" level for a predetermined period. Therefore, the output of the first shift register is initialized to "H" level, and the outputs of the second to fourth shift registers are initialized to "L" level. Next, when a positive logic LATPULA signal is outputted in response to the first step NWE clock during the address data input, a negative logic address latch control signal LP1 is outputted via an NAND gate NAND2 because the output signal of the first shift register takes "H" level. Also the contents of the shift registers are advanced by one state in response to the falling edge of the pulse signal LAT- PULA, so that the output of the second shift register takes "H" level, and the outputs of the first, third, and fourth shift registers take "L" level. When the LATPULA signal is again outputted in response to the second step NWE clock, a negative logic address latch control signal LP2 is outputted via an NAND gate NAND3 because the output of the second shift register circuit takes "H" level. The contents of the shift registers are advanced further by one step in response to the falling edge of the pulse signal LATPULA, so that the output of the third shift register takes "H" level, and the output of the first, second, and fourth shift registers take "L" level. Similarly, in response to the third step NWE clock, an address latch signal LP3 is outputted via a NAND gate NAND4. When the address input is completed at the third step NWE clock, the output of the fourth shift register takes "H" level, and a CLOCK input signal to each shift register outputted from a NOR gate NOR2 is set to "L" level. A CLOKB input signal to each shift register is set to "H" level by an NAND gate NAND5. As a result, this circuit is constructed such that even if the fourth and fifth step NWE clock signals are inputted and the pulse signal LATPULA is generated, an address latch control signal will not be outputted because the output signals of the first to third shift registers take "L" level.

After the completion of the address input in response to three-step NWE clock signals, the Busy signal is outputted when the level of the first latch data control signal LP3 changes, thereby selecting a word line corresponding to the internal address signal of the address buffer circuit, indicating the row address. After a predetermined time delay (10 μsec), data in memory cells of one page with their control gates being connected to the selected word line is read via bit lines and latched in data registers.

Figure 9:
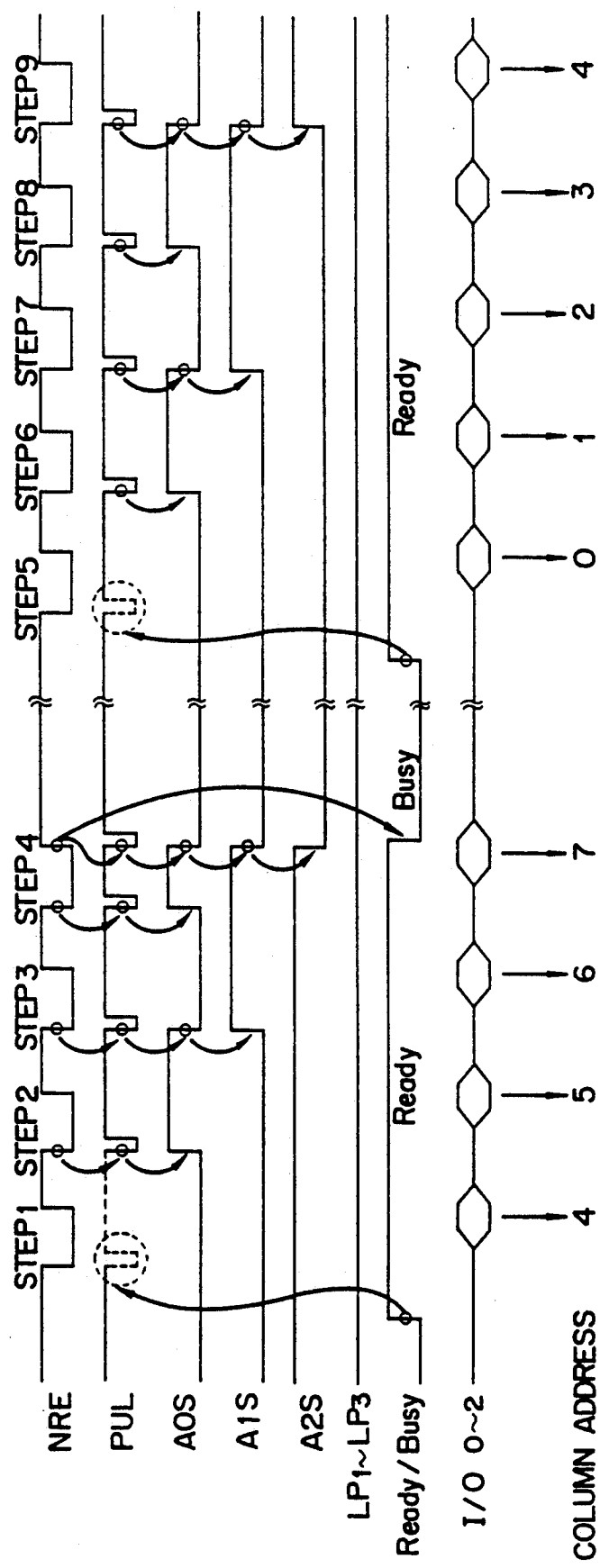
FIG. 9 is a timing chart of internal signals explaining the operation of the address input means shown in FIG. 5.

Next, the data read operation from the data registers by changing the external control signal NRE from "H" to "L" to "H" will be described with reference to FIGS. 5 and 9. A pulse signal PUL is a signal outputted during a serial data read operation when the external control signal NRE is changed from "H" to "L". This signal PUL and its inverted signal PULB are supplied to the input terminal Ai-1S and Ai-1SB or the address buffer circuit ABUF0, respectively. However, it is configured that the pulse signal PUL is not outputted when the Read/Busy signal changes its level from "L" to "H" when the column address is first read after the address data is inputted and when the column address is first read after the contents of the data registers are overwritten after the page address is changed. In the semiconductor memory constructed in this way, when the external control signal NRE is changed from "H" to "L" level after the address input (in FIG. 9, after inputting a column address 4), the contents of the data register for the address 4 are outputted from the I/O terminal which changes its high impedance state to a predetermined level. At this time, as described previously, the pulse signal PUL is not generated so that the binary output signal (internal address signal) from the address buffer circuit will not change. When the external control signal NRE changes next from "L" to "H" level, the I/O terminal takes the high impedance state. When the external control signal NRE changes again from "H" to "L" level, the pulse signal PUL generates so that the internal address signal A0S of the address buffer circuit ABUF0 changes from "L" to "H" level. Thereafter, the contents of the data register selected by the internal address signal (column address 5) are outputted from the I/O terminal. When the external control signal NRE changes from "L" to "H" level, the I/O terminal takes the high impedance state. When the external control signal NRE changes next from "H" to "L", in response to the pulse signal PUL the internal address A0S changes from "H" to "L" level. In response to this level change of A0S, the internal address signal A1S outputted from the address buffer circuit ABUF1 changes from "L" to "H" level. In this manner, the internal address signals A0A, A1S, and A2S are incremented in response to the signal PUL. When the external control signal NRE changes from "H" to "L" level at its fourth step, all internal column addresses are set to "H" level so that a signal COLEND changes from "L" to "H". When the external control signal NRE changes from "L" to "H" at the fourth step while this signal COLEND takes "H" level, the pulse signal PUL is outputted to increment the internal address and the Ready/Busy signal changes from "H" to "L" level. In this manner, after data is sequentially read starting from the entered address to the column last address in response to clocks of the external control signal NRE, the internal column address indicates address 0, and the row address (page address) is incremented. In response to the Busy signal outputted, data of memory cells with their gates connected to the newly selected word line is transferred to data registers after the predetermined read data read time (10 μsec), and a Ready signal indicating an accessible state of the chip is outputted from the Ready/Busy output terminal. When the clock external control signal NRE is inputted at the fifth step to read data after the chip enters the ready state, the signal PUL will not be outputted because this data read is performed the first time after the Ready/Busy signal changes from "L" to "H". Therefore, the contents of the data register at column address 0 are outputted from the I/O terminal.

Thereafter, data up to the last column address is read in response to clocks of the external control signal NRE, the Busy signal is again outputted from the Ready/Busy terminal as described previously, and the memory cell data at the next page address is transferred to the data registers. After data at the last column address indicated by the internal address is read, the signal COLEND changes from "L" to "H" and a signal AEND changes from "L" to "H". After data is read at the last address, the data read at the next external control signal NRE is made inhibited. To this end, when the signal AEND changes to "H" level after data is read at the last address, the Ready signal maintains held at the Ready/Busy output terminal, so that even when the external control signal NRE changes from "L" to "H", the pulse signal PUL is not outputted. Because the Busy signal is not outputted, memory cell data is not transferred to data registers. In this manner, the signal AEND is controlled such that the address is not incremented so as not to read memory cell data at address 0 after data is read at the last address in one chip.

Figure 10:
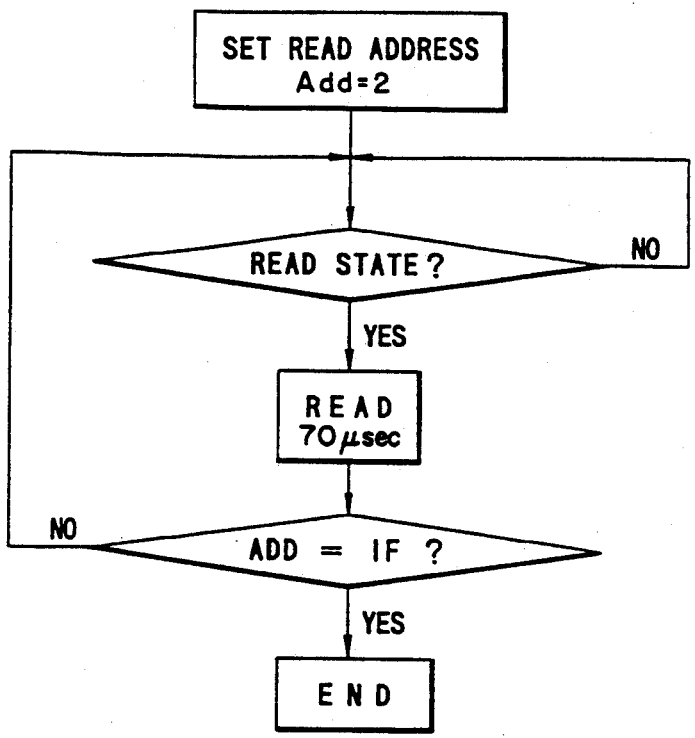
FIG. 10 is a program sequence diagram for data read of a semiconductor memory device according to the present invention.
Figure 11:
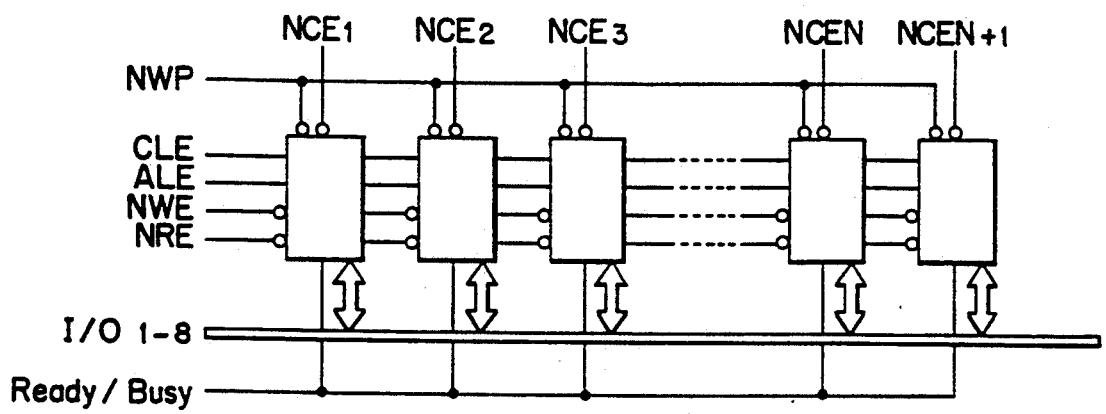
FIG. 11 illustrates an example of connections between a number of semiconductor memory devices according to the present invention.

FIG. 10 shows the program sequence for the memory control chip for the continuous data read from the semiconductor memory constructed as above. In the semiconductor memory chip of this embodiment, data can be read always at the same access time (70 nsec) if the chip is accessible, and a program is not needed for judging whether the column address (intra-page address) is the last address. Therefore, even if a chip having an optional length of intra-page addresses is used, it is not necessary to change the memory control chip program. In addition, even if a number of memories are used, these memories can be managed by a simple memory chip program. FIG. 11 shows an example of connecting a number of semiconductor memories constructed as above. By using an external control signal NCE as the highest address, this system can be managed as a singe semiconductor memory having the capacity greater than bits of one semiconductor memory.

Figure 12:
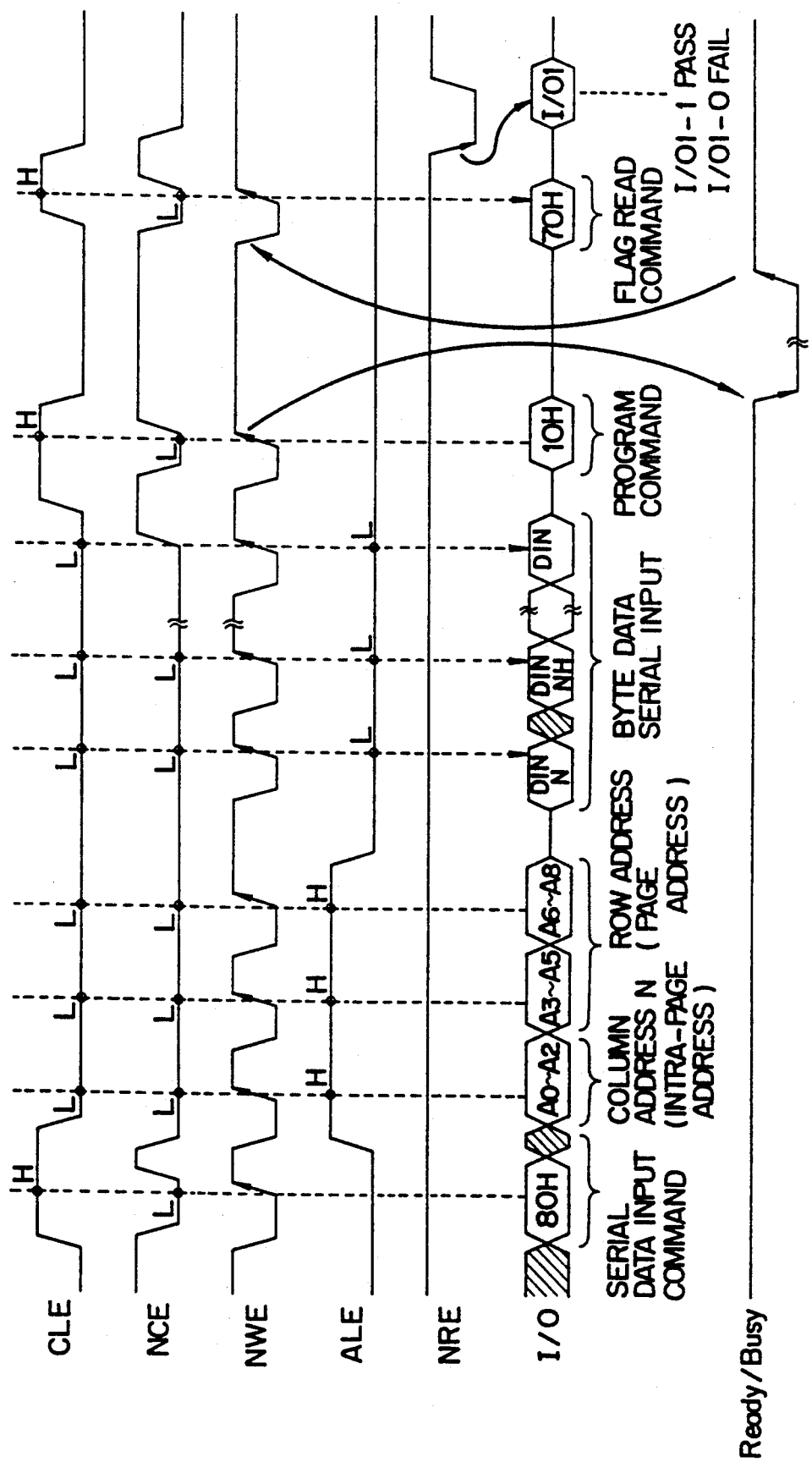
FIG. 12 is a timing chart of a data write operation of a semiconductor memory device according to the present invention.

FIG. 12 shows waveforms of external control signals and data input timing for data write into the above-described semiconductor memory. When a serial data input command 80H is inputted in the command data input mode, the chip enters an address input mode and a program start address is inputted. In the address input mode, similar to the above-described data read mode, the column address and page address are inputted to the address buffer circuits at the third step of the external control signal NWE, each internal address signal being set to a predetermined logical level corresponding to the input address data. In the above-described data read mode, after inputting address data at the third step, a Busy signal is outputted from the Ready/Busy output terminal to transfer memory cell data to data registers. In the serial data input mode, however, the Ready signal is held at the Ready/Busy output terminal and memory data is not transferred to data registers. When the serial data input command 80H is inputted, all data in data registers are initialized to "H" level.

Figure 13:
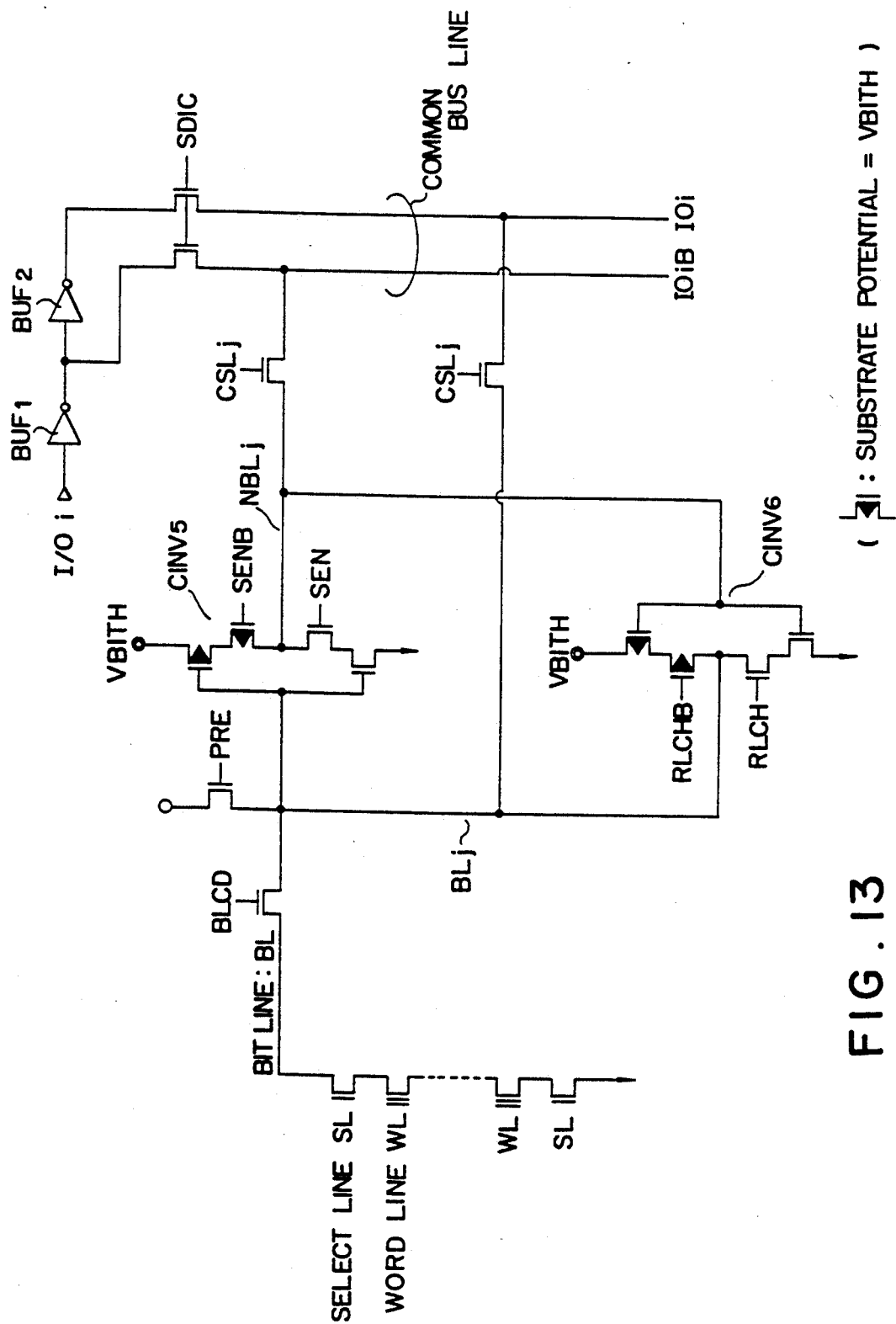
FIG. 13 shows a data register circuit.
Figure 14:
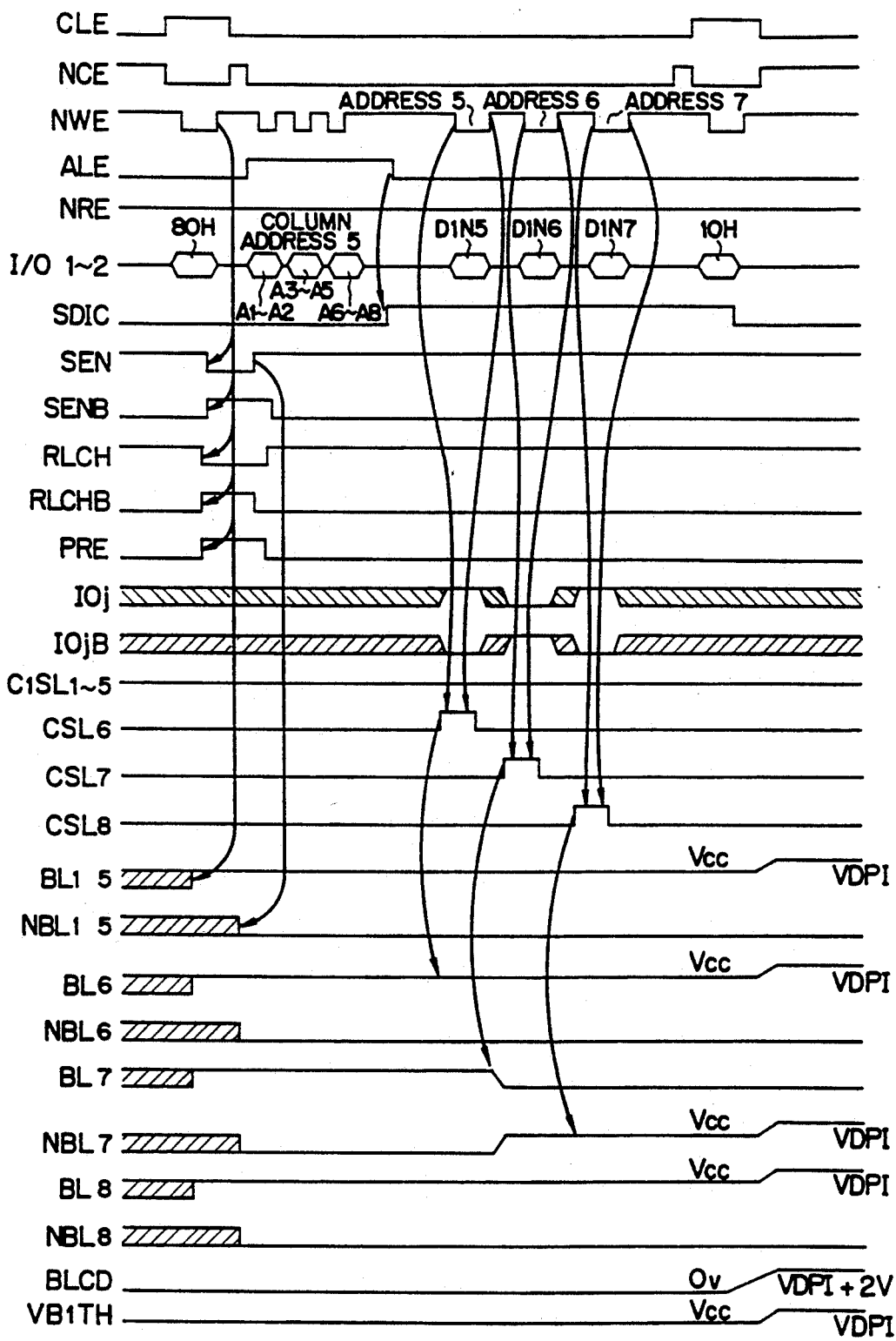
FIG. 14 is a timing chart of a data write operation of a semiconductor memory device according to the present invention.

This operation will be described with reference to the data register circuit shown in FIG. 13 and the timing chart shown in FIG. 14. FIG. 13 shows the data register circuit provided for each bit line. Clocked inverters CINV5 and CINV6 provide a data latch function, and the clocked inverter CINV5 provides a function of a sense amplifier during data read. An N-channel transistor with a signal PRE supplied to its gate is used when pre-charging the data latch circuit portion. At this time, the bit line is electrically disconnected from the data latch circuit portion by an N-channel transistor with a signal BLCD supplied to its gate. This data register circuit is connected, via a column gate transistor with a column decoder output signal CSLj inputted to its gate, to a common bus line IOi/IOiB provided for each I/O. When a serial data input command 80H is inputted from the I/O terminal, all the column gate transistors are made non-conductive, signals SENB and RLCHB are set to "H" level, and signals SEN and RLCH are set to "L" level. Therefore, the clocked inverters CINV5 and CINV6 become inactive. At the same time, a precharge signal PRE changes to "H" level, precharging nodes BLj of all data registers to "H" level. After this precharge, the signal SEN changes from "L" to "H" level and the signal RLCHB changes from "H" to "L" level, so that the nodes NBLj are set to "L" level. After setting the levels of the nodes BLj and NBLj, the signal SENB changes from "H" to "L" and the signal RLCH changes from "L" to "H", so that the set data is latched by the data register circuit. Upon this initializing operation, the nodes BLj of all data registers are set to "H" level, and data of all data registers is set to "1". After completion of the address input, a signal SDIC changes from "L" to "H" so that the write data and inverted write data are transferred from the I/O terminal to the common bus line IOi/IOiB. Next, a column decoder output signal CSL6 corresponding to the column address (address 5) inputted when the external control signal NWE takes "L" level becomes "H" level. Because the current drive capability of buffer inverters BUF1 and BUF2 for driving the common bus line is set sufficiently larger than that of the clocked inverters CINV5 and CINV6, the latch contents in the data register selected by the column decoder output signal CSL6 is overwritten with the write data on the common bus line. In this manner, data input for the addresses 5 to 7 is performed in response to clocks of the external control signal NWE. As a result, as the contents in the data registers for the column addresses 0 to 4, the data "1" when initialized is latched, and as the contents in the data registers for the column addresses 5 to 7, data inputted from the I/O terminal is latched. When a program command 10H is inputted in the command input mode after the data input mode, data is written in memory cells of the chip.

During this data write, the potential of the power source BVITH of the latch circuit changes from $V_{cc}$ to VDPI of 10 V. At the same time, the potential of the signal BLCD changes from 0 V to a high potential of about 12 V so that the bit line and the latch circuit are electrically connected. As a result, the bit line having the data register with data "1" is set to the VDPI potential, and the bit line having the data register with data "0" is set to 0 V. Electrons are therefore injected in the floating gate of the memory cell connected to the bit line having the data register with data "0" and selected by the word line, to write data "0" in the memory cell. During the data write operation, the Busy signal is outputted from the Ready/Busy output terminal, and after the predetermined data write time, the Ready signal is automatically outputted. Whether the data write operation has been correctly performed can be checked by entering a flag read command 70H in the command input mode and reading the automatic verify results stored in the internal register from the I/O terminal. Such a flag read function is practically used also in conventional semiconductor memories, and so the description is omitted.

Figure 15:
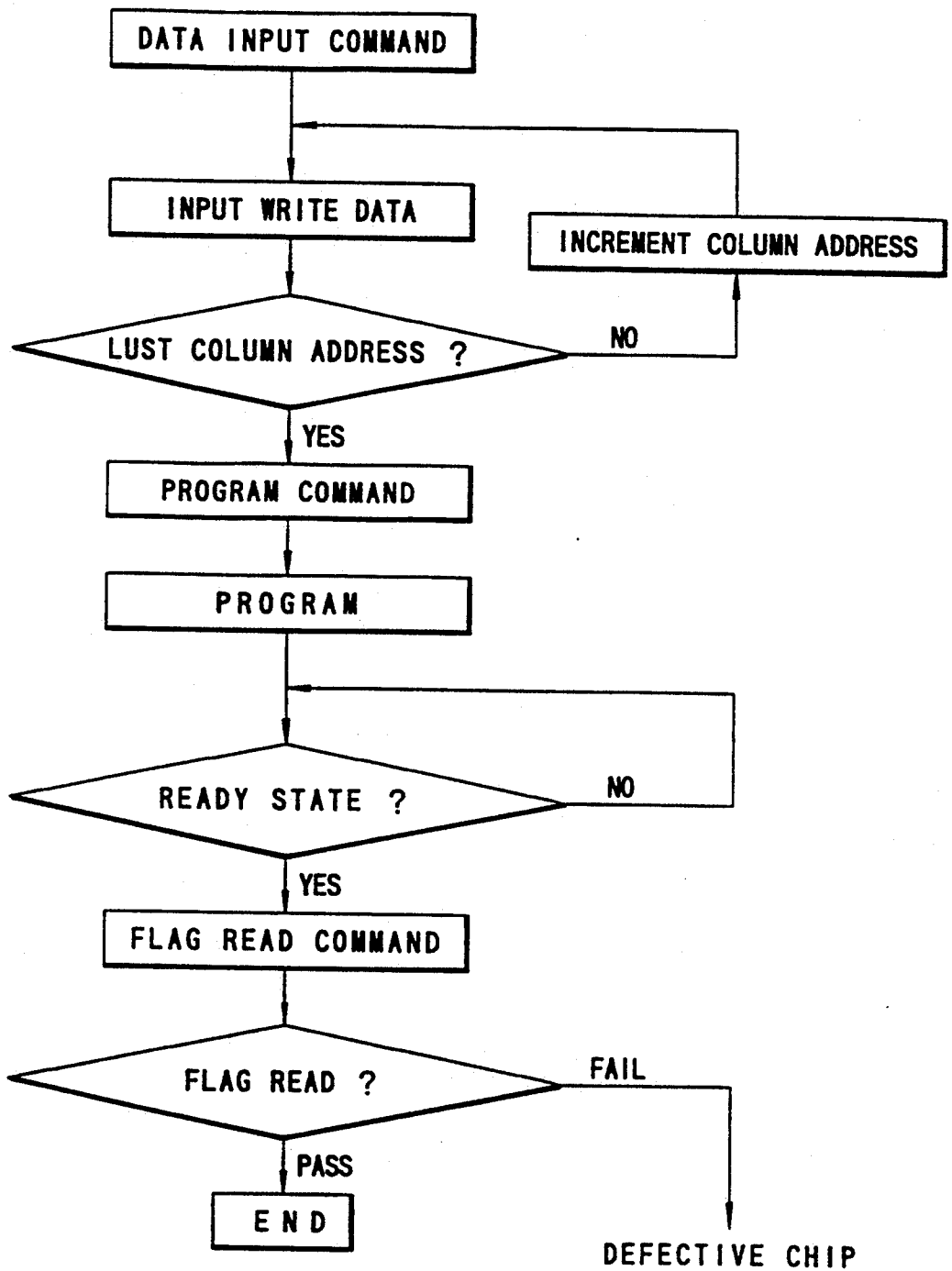
FIG. 15 is a control program sequence diagram for data write of a semiconductor memory device according to the present invention.
Figure 31A:
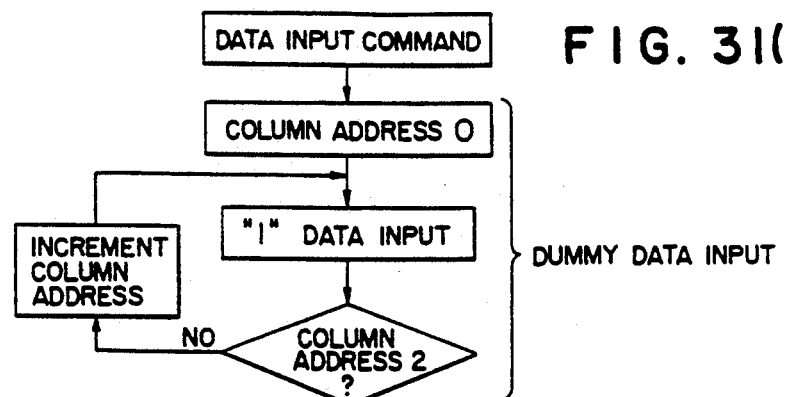
FIG. 31(a)-31(b) is a control program sequence diagram for data write of a conventional non-volatile semiconductor memory device.
Figure 31B:
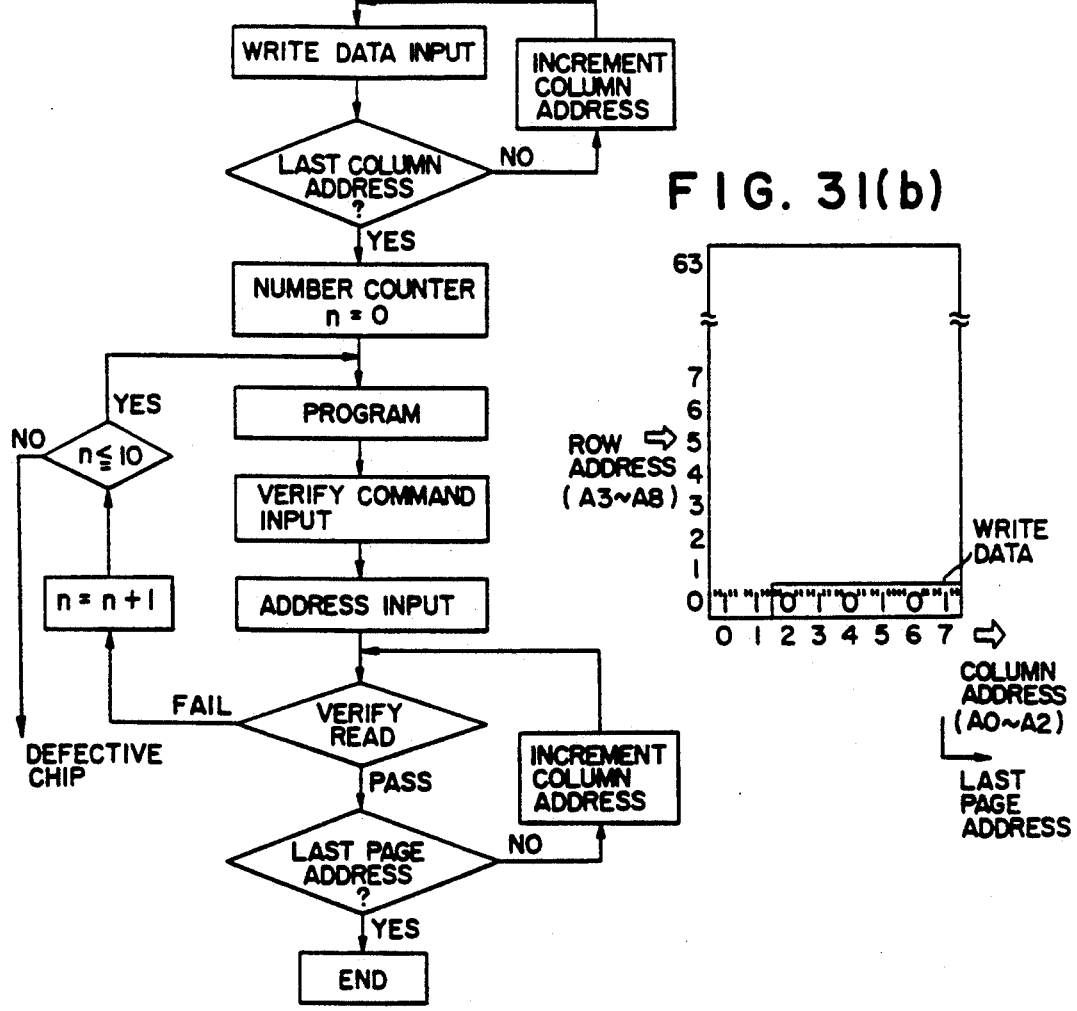

FIG. 15 shows the program sequence for the memory control chip whereby data at addresses 2 to 7 is written in the semiconductor memory constructed as above. According to the semiconductor memory of this embodiment, it is possible to enter data starting from an intermediate address of a page and automatically initialize the data at addresses before the start column address to predetermined data. It is therefore unnecessary to enter a dummy data input command as shown in the conventional example shown in FIG. 31, enabling to shorten the program time.

Next, an address register read function of the semiconductor memory of this embodiment will be described. This function is used when reading the internal address information normally latched in the address register after the address input after the data read or data write, or after incrementing the internal address in response to clocks of the external control signal NWE.

Figure 16:
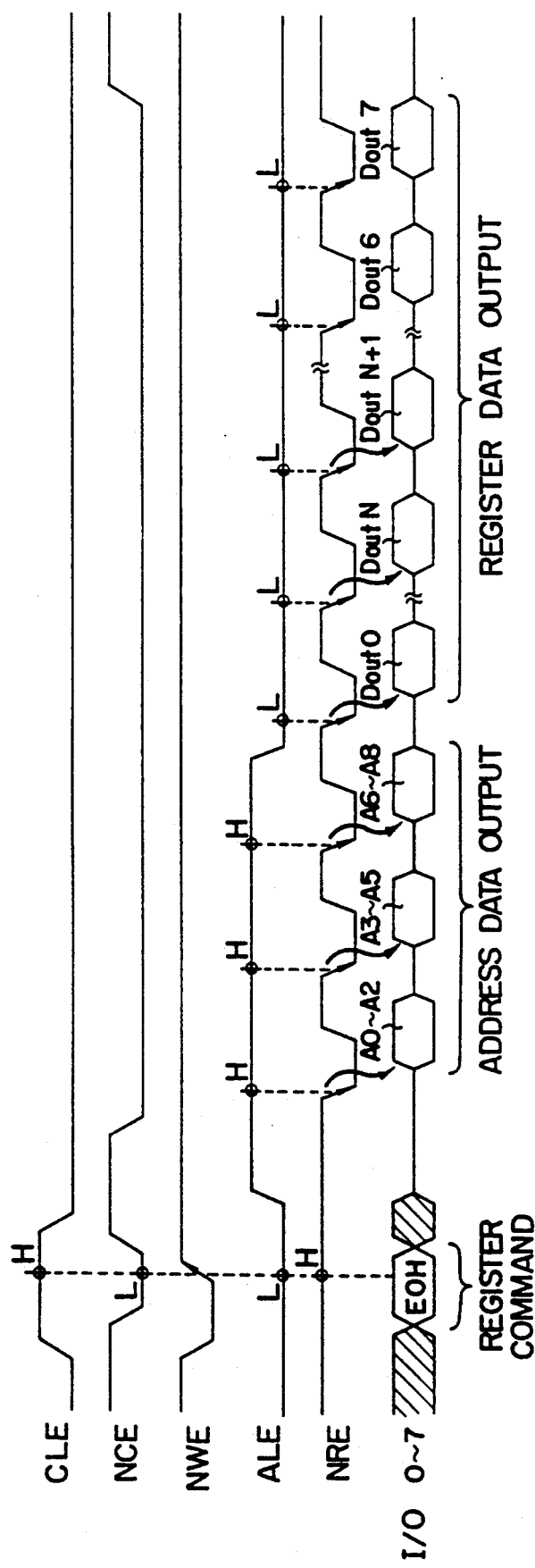
FIG. 16 is a timing chart explaining the register read operation of a semiconductor device according to the present invention.
Figure 17:
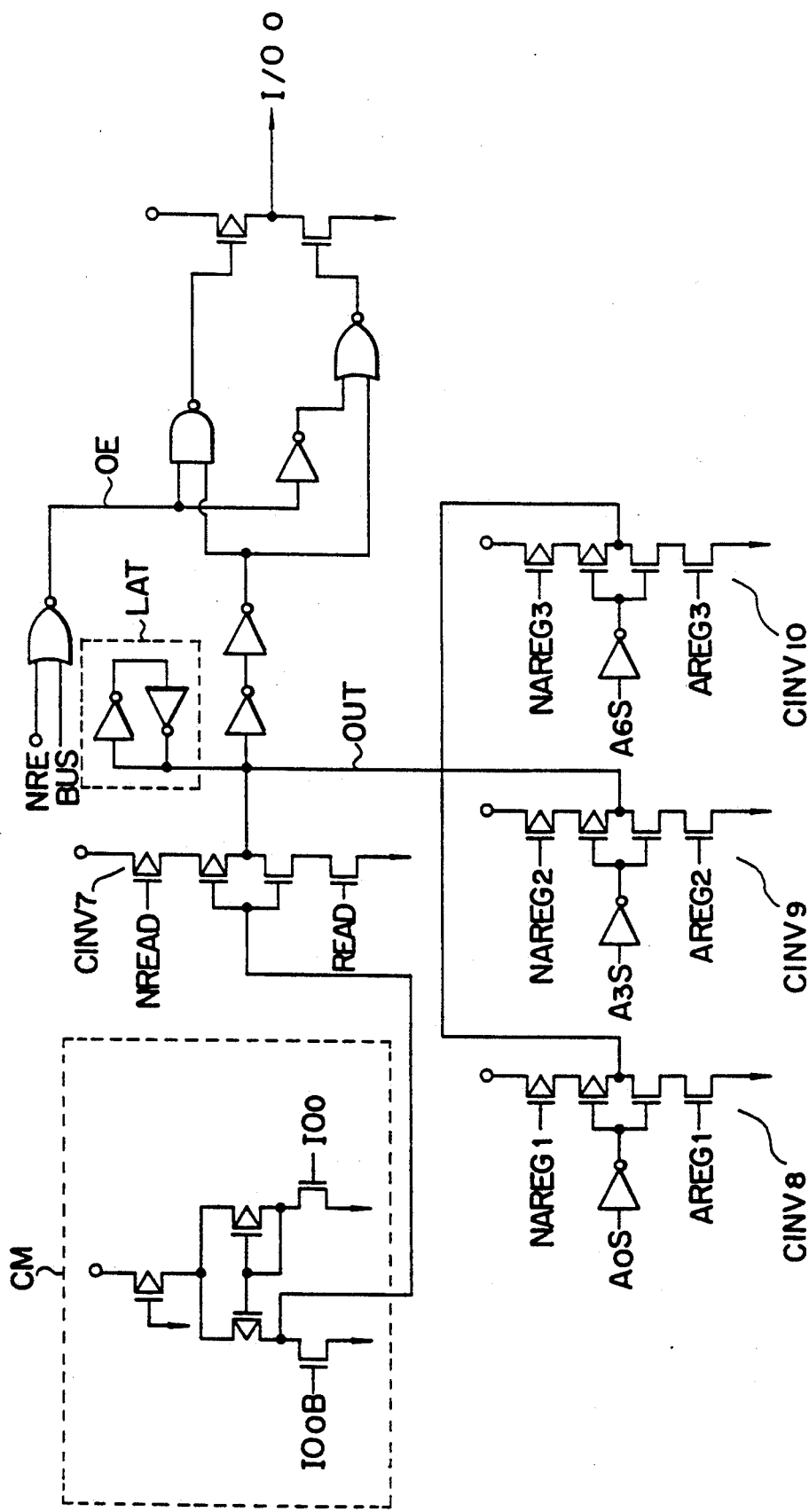
FIG. 17 is a circuit diagram of an output circuit of a semiconductor memory device according to the present invention.
Figure 18:
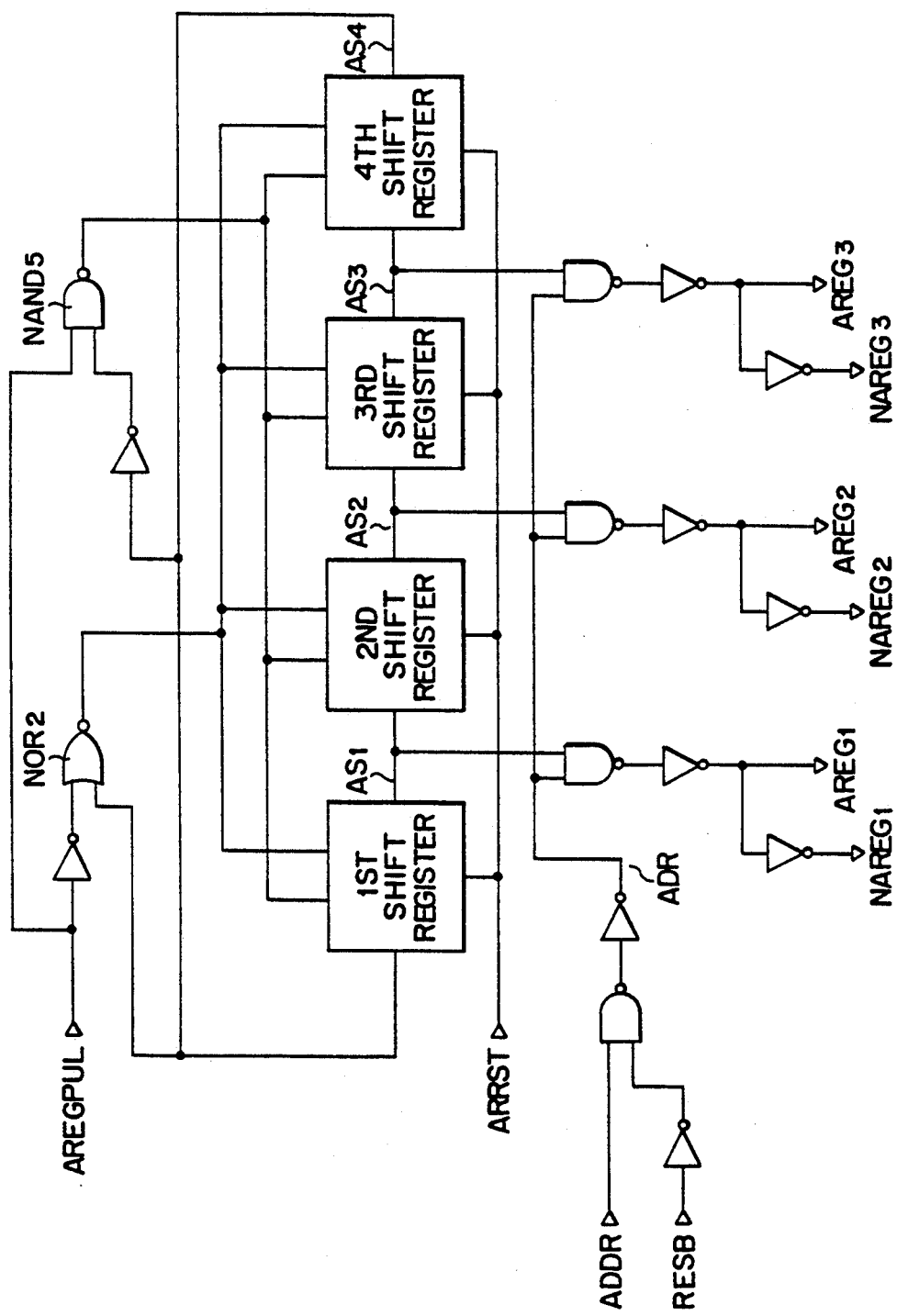
FIG. 18 is a circuit diagram of an address register read control circuit according to the present invention.

FIG. 16 is a timing chart of external control signals when reading the contents of the address register of the embodiment circuit. FIG. 17 is a circuit diagram of the output buffer of the non-volatile semiconductor device of the embodiment. FIG. 18 is a circuit diagram of the address register read control circuit for generating signals AREG1 to AREG3 and signals NAREG1 to NAREG3 shown in FIG. 17. First to fourth shift registers shown in FIG. 18 have the same structure as that shown in FIGS. 7 and 8. When EOH is entered in the command input mode, the chip enters a register read mode.

Figure 19:
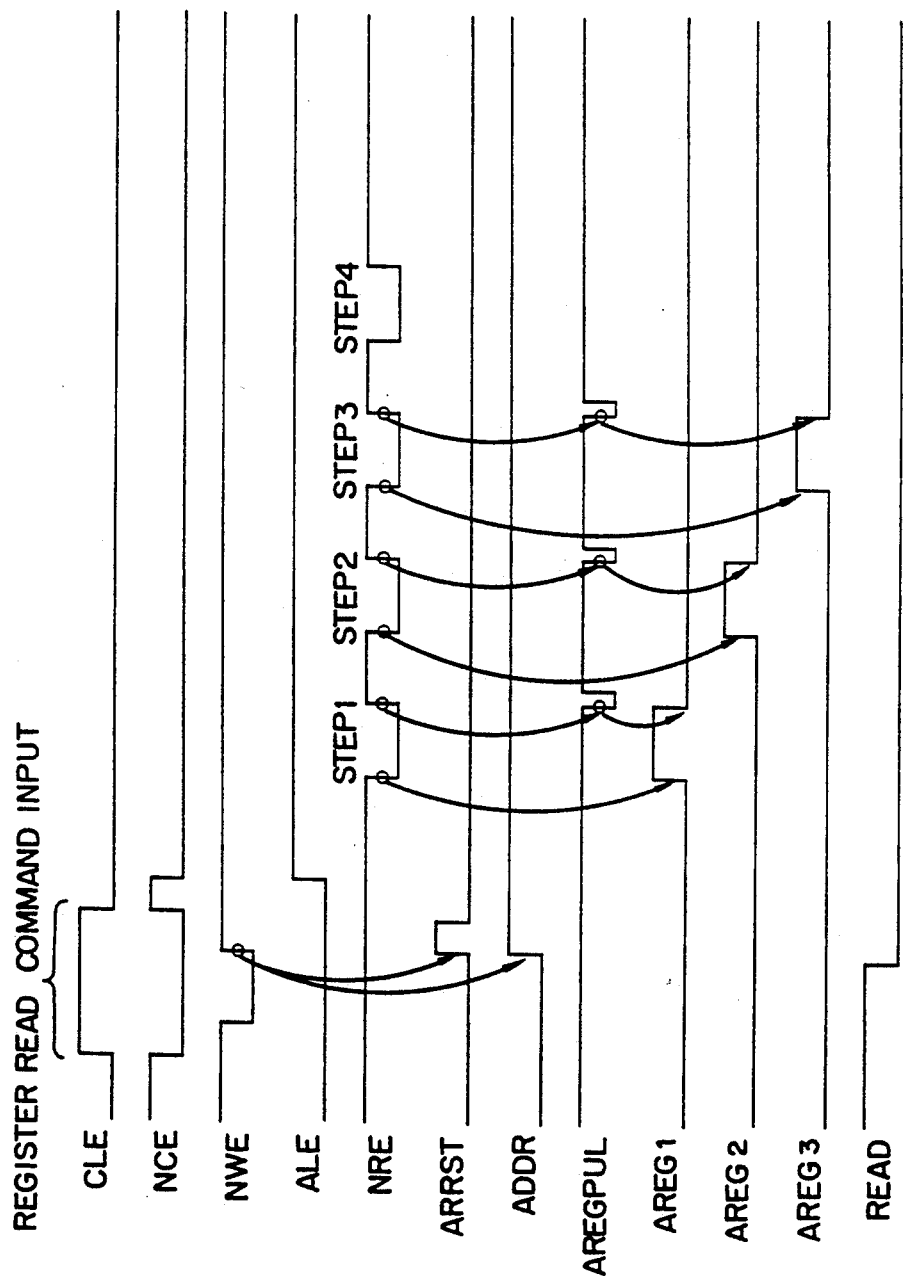
FIG. 19 is a timing chart of internal signals explaining the operation of the output circuit shown in FIG. 17.
Figure 20:
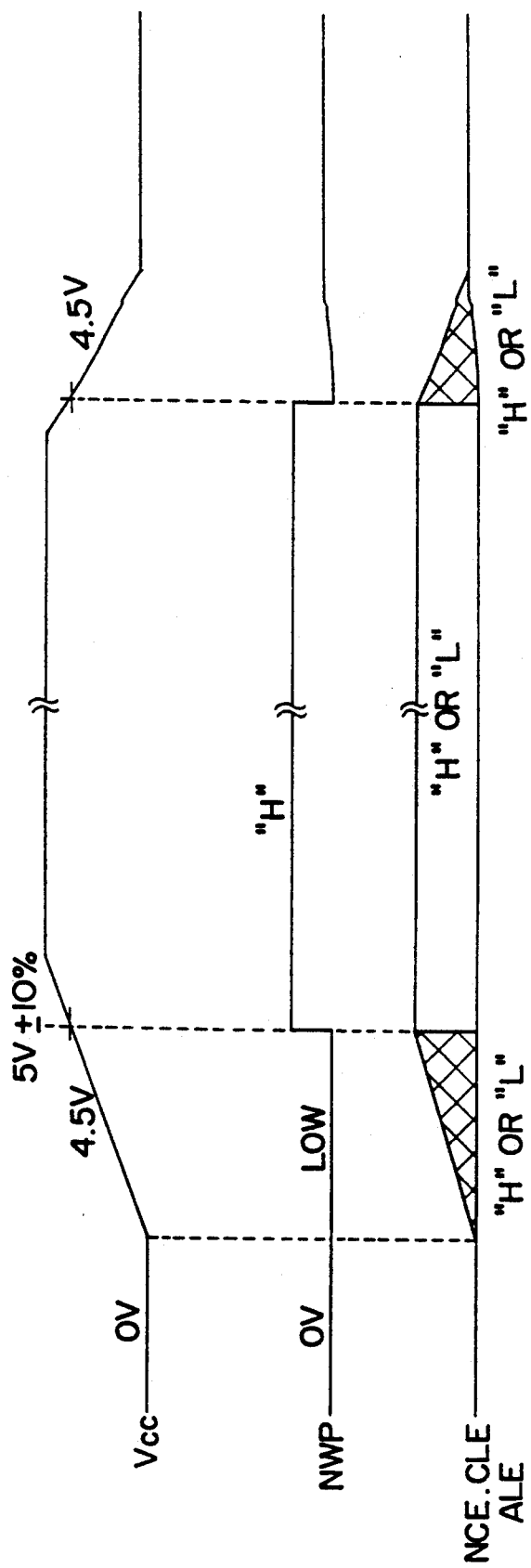
FIG. 20 is a timing chart explaining the power-on reset operation of the semiconductor memory device according to the present invention.
Figure 22A:
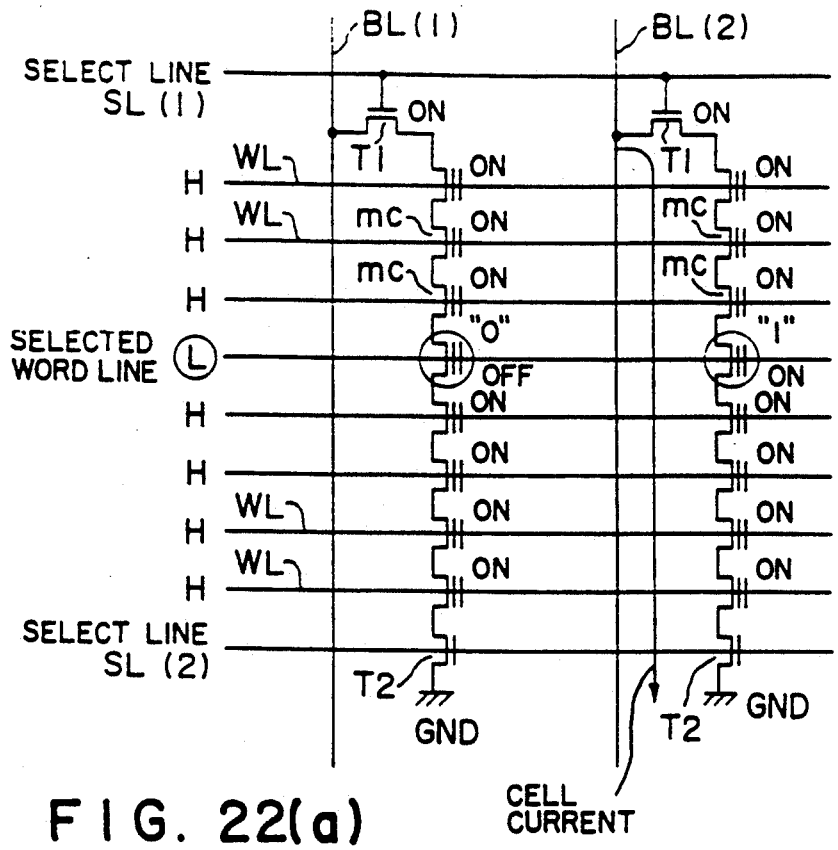
FIG. 22(a)-22(b) is a diagram explaining the operation of memory cells.
Figure 22B:
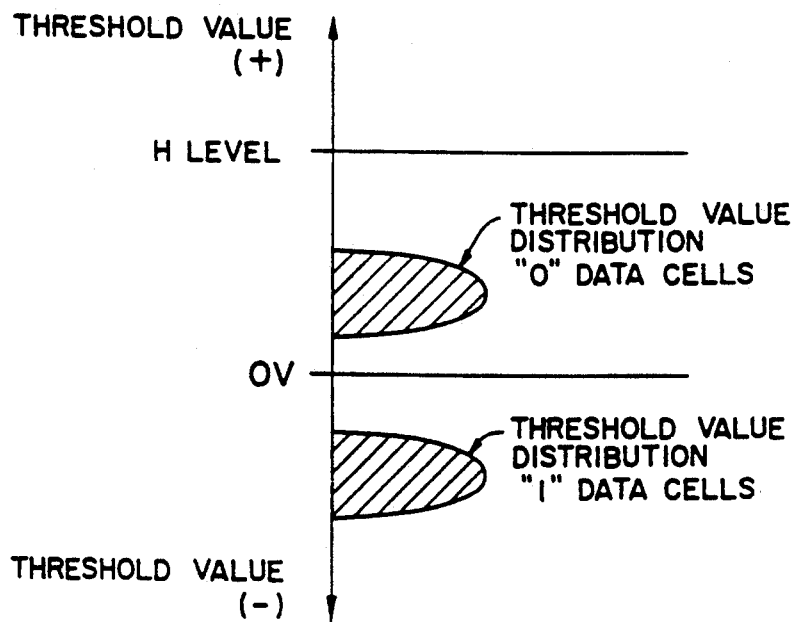
Figure 24A:
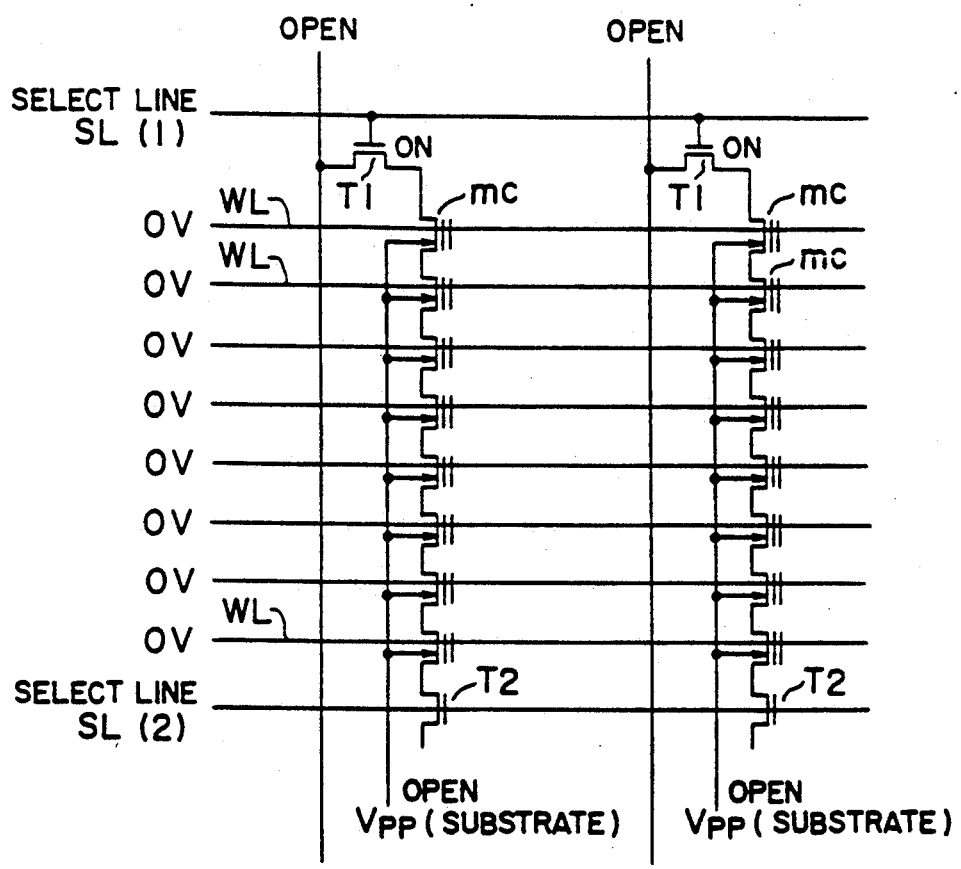
FIG. 24(a)-24(b) is a diagram explaining the operation of memory cells.
Figure 24B:
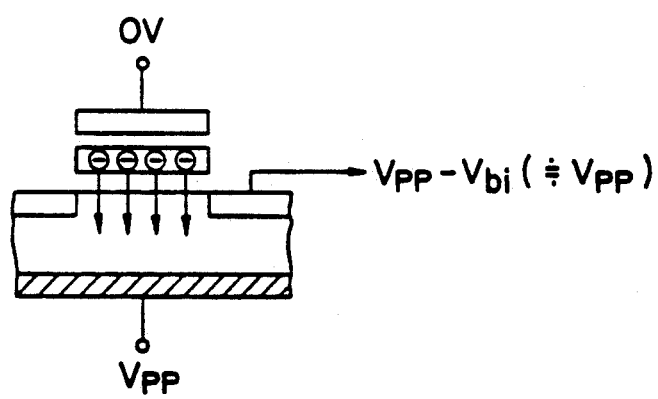
Figure 25A:
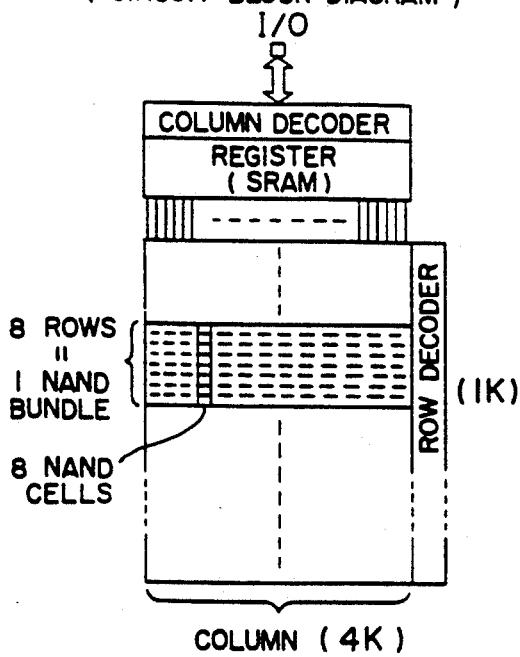
FIG. 25(a)-25(e) is a diagram explaining a conventional data read operation.
Figure 25B:
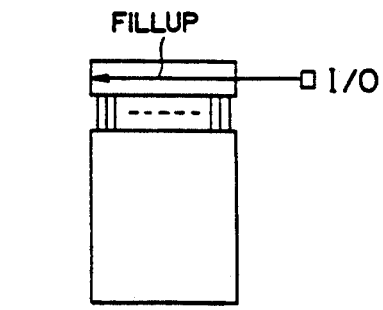
Figure 25D:
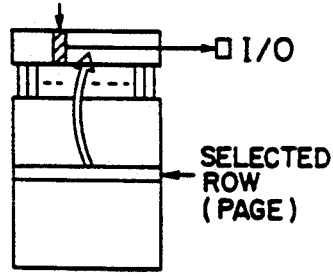
Figure 25C:
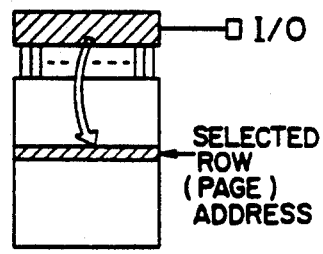
Figure 25E:
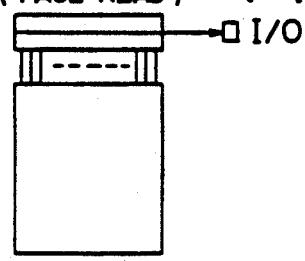

The signal ADDR shown in FIG. 18 changes from "L" to "H" level, and output nodes AS1, AS2, AS3, and AS4 of the shift registers shown in FIG. 18 are reset to "H", "L", "L", and "L" levels respectively in response to a positive logic pulse signal ARRST having a predetermined duration. If the chip takes the data read mode before the register read mode, the control signal READ/NREAD of the clocked inverter CINV7 shown in FIG. 17 are set to "H"/"L" levels. Therefore, data on the common bus line IOiB detected by the current mirror circuit CM has been transferred to the node OUT. When the register read mode is effected, the signal READ changes from "H" to "L" level and the clocked inverter CINV7 becomes inactive. However, because the latch circuit LAT formed by an inverter having a smaller current drive capability than the clocked inverters CINV7 to CINV10 is connected to the node OUT, the level at the node OUT is held to the level before the register read mode. Next, when the external controls ignal NRE is changed to "L" level in order to read the contents of the address register, the level of the node ADR shown in FIG. 18 changes from "L" to "H" level. As a result, the clocked inverter CINV8 shown in FIG. 17 becomes active and the data corresponding to the logical level of the internal address signal AOS is latched at the node OUT. A signal BUS shown in FIG. 17 is an internal Busy signal having an opposite phase to the signal outputted to the Ready/Busy output terminal, and takes "L" level because the chip is accessible during the register read mode. When the external control signal NRE changes to "L" level, a node OE changes from "L" to "H" level and a signal having the same phase as the internal address signal AOS latched at the node OUT is outputted to I/O0 terminal. Signals having the same phase as the internal address signals A0l, A1S, and A2S are adapted to be outputted to the I/O terminals I/O0, I/O1, and I/O2. Therefore, the internal addresses A0 to A2 can be read at the same time in response to a clock of the external control signal NRE. When the external controls ignal NRE is changed next from "L" to "H" level, the node ADR takes "L" level and the clocked inverter CINV8 becomes inactive. In response to the level change of the external control signal NRE, a negative logic pulse signal AREGPUL such as shown in FIG. 19 generates so that the output node AS1 of the shift register shown in FIG. 18 changes from "H" to "L" and the output node AS2 changes from "L" to "H". As a result, upon the level change of the external control signal NRE at the second step from "H" to "L", the signal AREG2 takes "H" level so that data corresponding to the logical level of the internal address signal A3S is latched via the clocked inverter CINV9 at the node OUT. At the same time, the level of the node OE changes from "L" to "H" so that a signal having the same phase as the internal address signal A3S is outputted to the I/O0 terminal. At the same time, signals having the same phase as the internal addresses A4S and A5S are outputted to the I/O1 and I/O2 terminals. When the external control signal NRE changes at the second step from "L" to "H", in response to the pulse signal AREGPUL the output node AS2 of the shift register circuit shown in FIG. 18 changes from "H" to "L" and the output node AS3 changes from "L" to "H". When the external control signal NRE changes at the third step from "L" to "H" level, the output node AS4 of the shift register changes to "H" level so that the output level of the shift register does not change in response to the signal AREGPUL. As a result, even if the external control signal NRE is inputted at the fourth step, the signals AREG1 to ARGE3 do not take "H" level, but the signal having the same phase as the internal address A0S last latched at the node OUT is outputted to the I/O0 terminal. When the register read command EOH is again inputted, the contents of the shift register are reset in response to the pulse signal ARRST to allow to read again the internal addresses A0 to A8.

Next, the data register read function will be described. This function is used for checking the contents of the data register after inputting data. As shown in FIG. 16, when a register read command EOH is entered in the command input mode, a positive logic pulse signal DATARPUL generates which clears the internal column address latched in the address buffer circuit shown in FIG. 5 to address 0. As described with the data read operation, in response to clocks of the external control signal NRE, the contents of the data register inputted in the data input mode can be continuously read from the internal address 0 to the last column address. Although in the read mode, the Busy signal is automatically outputted from the Ready/Busy output terminal when the data at the last column address is read, in the register read mode the Ready signal is held at the Ready/Busy output terminal in response to the level change of the signal ADDR and the Busy signal is not outputted. Further, although in the data read mode, the row address is automatically incremented when the data at the last column address is read, in the register read mode the row address is not incremented because of the signal ADDR. As a result, after checking the contents of the data registers in the data register read mode, it is possible to write the contents of the data register inputted before the data registers read mode correctly in memory cells at a particular row address.

Next, the operation of resetting the internal address resister and data register upon power-on of the semiconductor memory of this embodiment will be described In this embodiment, an external control signal NWP is set to "L" level upon power-on and it is set to "H" level after the power-on, to reset the internal address register and data register. The external control signal NWP is used for preventing the chip from erroneously overwriting the contents of the data registers and reading/writing data from/to memory cells to be caused by noises on other external control signals, the external control signal NWP controlling to execute or not execute operation modes associated with such erroneous operations. As shown in the operation mode table of FIG. 2, the chip is constructed such that the data input, program/erase, data transfer from memory cells to data registers, are inhibited when the external control signal NWP takes "L" level. In order to inhibit the data input operation, the signal PUL shown in FIG. 5 is set to "H" level while the external control signal NWP takes "L" level so that the increment operation of the internal address is not performed. Inhibited therefore are the generation of the precharge signal PRE for the reset operation of the data register circuit, the data transfer from the common bus to the data registers and the latch operation respectively under the control of signals SEN/SENB, RLCH/RLCH5, and CSLj.

FIGS. 21(a) to 21(c) are circuit diagrams of a program/erase command input circuit. A signal CMDWES changes from "H" to "L" level in response to the external control signal NWE in the command input mode. A signal CMDWESB is a signal opposite in phase to the signal CMDWES. When a predetermined command code is inputted to the I/O terminal in the command mode, the corresponding control signal of the command input circuit takes "H" level. The internal operation of program/erase is controlled by an output signal PROG/ERASE of the command circuit shown in FIG. 21. Therefore, by inhibiting the signal PROG/ERASE to take "H" level in response to the internal signal WPSB same in phase with the external control signal NWP, the program/erase operation can be inhibited when the external control signal NWP takes "L" level. The data transfer operation from memory cells to data registers is performed when detecting the level change from "L" to "H" of the internal signal opposite in phase to the signal outputted from the Ready/Busy output terminal. Therefore, by holding this signal to "L" level in response to the internal signal WPSE, the data transfer operation can be inhibited when the external control signal NWP takes "L" level. As above, the external control signal NWP is used for inhibiting overwriting the contents of the data registers, the data write/erase operation for a memory cells, and for initializing the contents of the internal registers and data registers upon power-on. FIG. 21(c) shows a reset pulse generator circuit. When the external control signal NWP changes from "L" to "H" level, a positive logic reset pulse RST generates. This reset signal RST is inputted to the address buffer circuits shown in FIG. 4. Therefore, the output signals AiS of all address buffer circuits are reset to "L" in response to the positive logic reset signal RST, to reset the internal addresses to address 0. A positive logic reset signal ARST is inputted to the data latch control signal generator circuit shown in FIG. 6 at the same time when the reset signal RST is outputted. Therefore, the level at the output node of the shift register of the data control signal generator circuit is set to the predetermined level described previously. A reset signal ARRST is inputted to the address register read control circuit shown in FIG. 18 at the same time when the reset signal RST is outputted. Therefore, each output node of each shift register circuit is reset to the predetermined level described previously. Data latched at each data register is reset to data "1" in response to the reset signal RST. The reset operation by the reset signal RST is the same as the data register initial setting operation after the data input command 80H is entered in the data input mode. With this reset operation, there are executed a precharge operation by the signal PRE while the column gate transistor CSLj is non-conductive and a latch operation by the signal SEN/SENB and RLCH/RLCHB. According to the non-volatile semiconductor device constructed as above, it is possible to inhibit the write/erase operation by fixing the external control signal NWP to "L" level even if the external control signals NCE, CLE, and ALE are unstable upon power-on, and to reliably reset the latch circuits of the chip by changing the external control signal NWP from "L" to "H" after the power source voltage takes a predetermined level.

Figure 32:
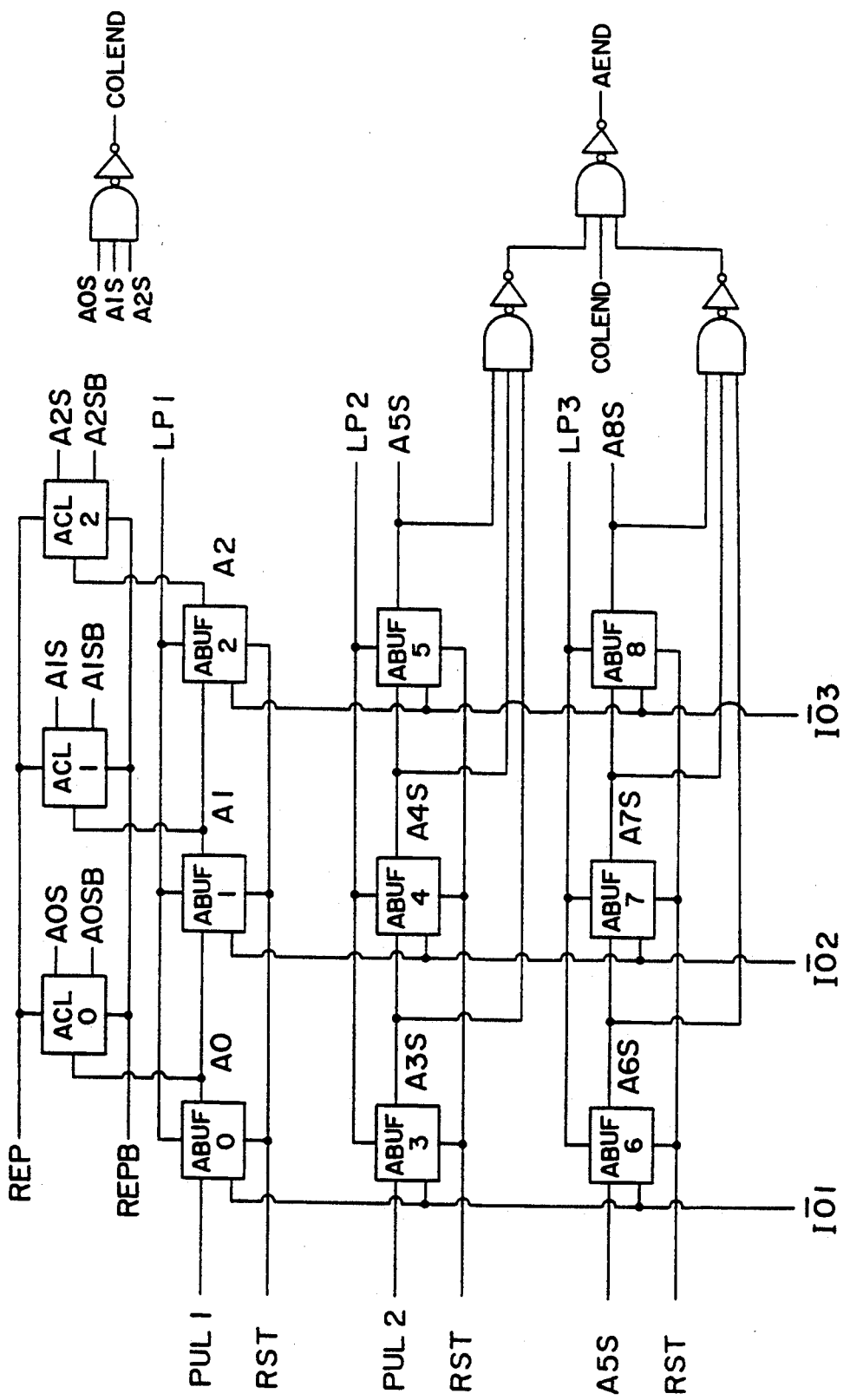
FIG. 32 shows another example of the address buffer

Another embodiment of the present invention will be described. FIG. 32 shows address buffer circuits each address buffer labeled with ABUF having the same structure as that shown in the first embodiment. In the second embodiment, another stage of latch circuits ACLi are connected to the output side of the column address buffers for addresses A0 to A2. Each latch circuit ACLi has the structure shown in FIG. 33. Latch control signals REP and REPB are opposite in phase.

When REP takes "H" level, the output signals A0 to A2 of the address buffers ABUF0 to ABUF2 are fetched to hold them while REP takes "L" level. Since the latch circuits hold current addresses in the manner described above, it is possible to shorten the time required for incrementing the contents of the address buffer circuits by incrementing them in advance.

Figure 35:
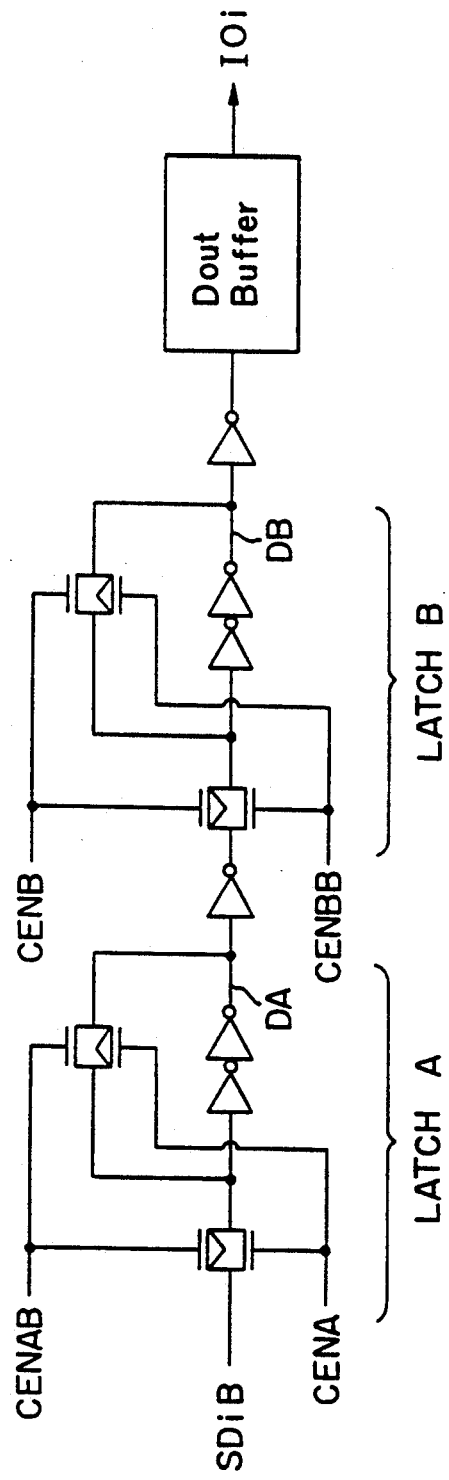
FIG. 35 shows a circuit for transferring data in a data register to a data output buffer.

FIG. 35 shows a circuit for transferring data latched at the data register to the data output buffer. SDiB is a signal representing the data which was latched by the data register, inputted via the bus lines IOi and IOiB shown in FIG. 13 to the current mirror sense, and amplified. When a signal CENA takes "H" level, SDiB is inputted to a latch A and latched when CENA takes "L" level. When CENBB takes "H" level, the data is transferred to a latch B and latched when CENBB takes "L" level. By using this circuit, it becomes possible to receive data at the next address from the data register at the latch A while outputting the data in the latch B to the external circuit of the chip.

Figure 34:
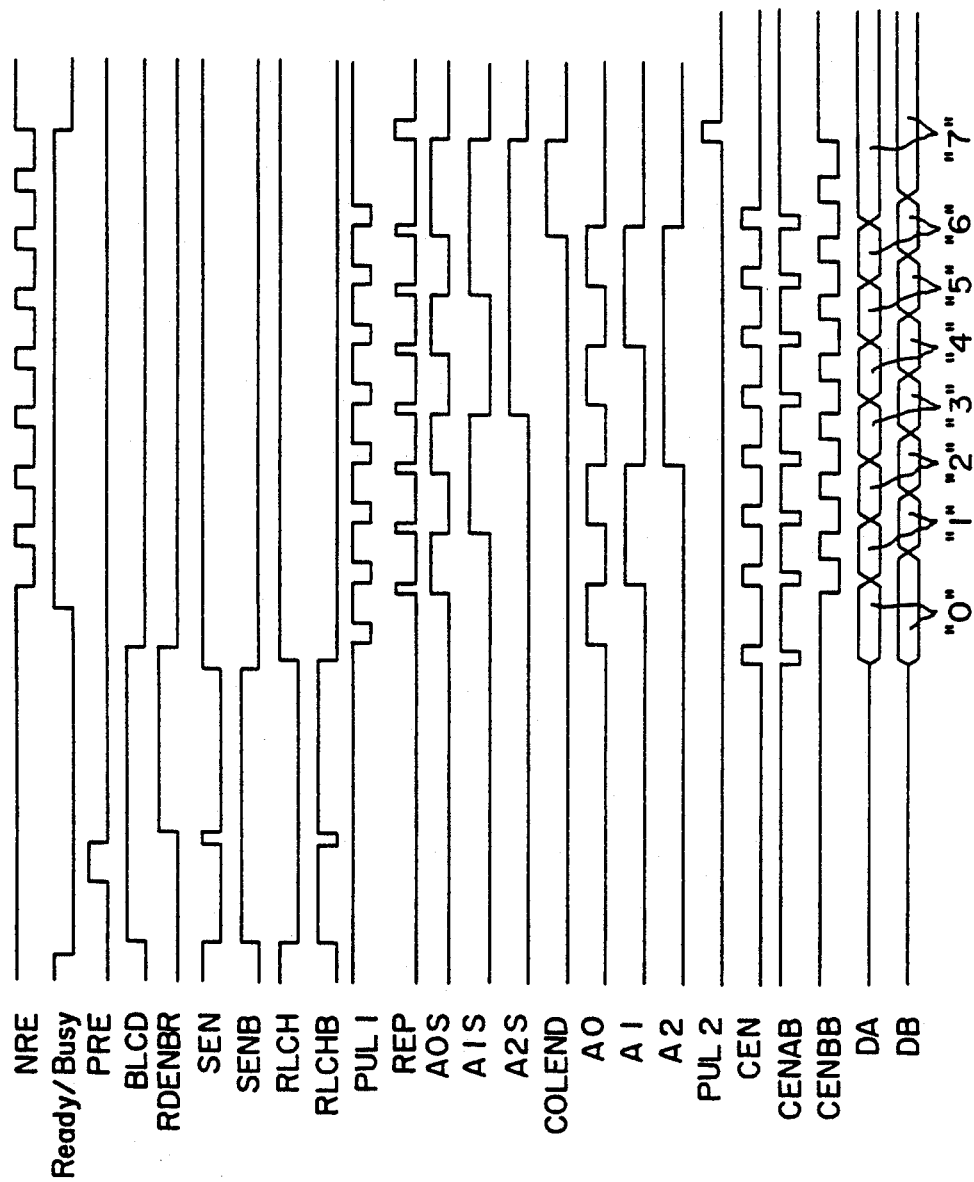
FIG. 34 is a timing chart of main signals during one cycle of a random access and serial access.
Figure 36:
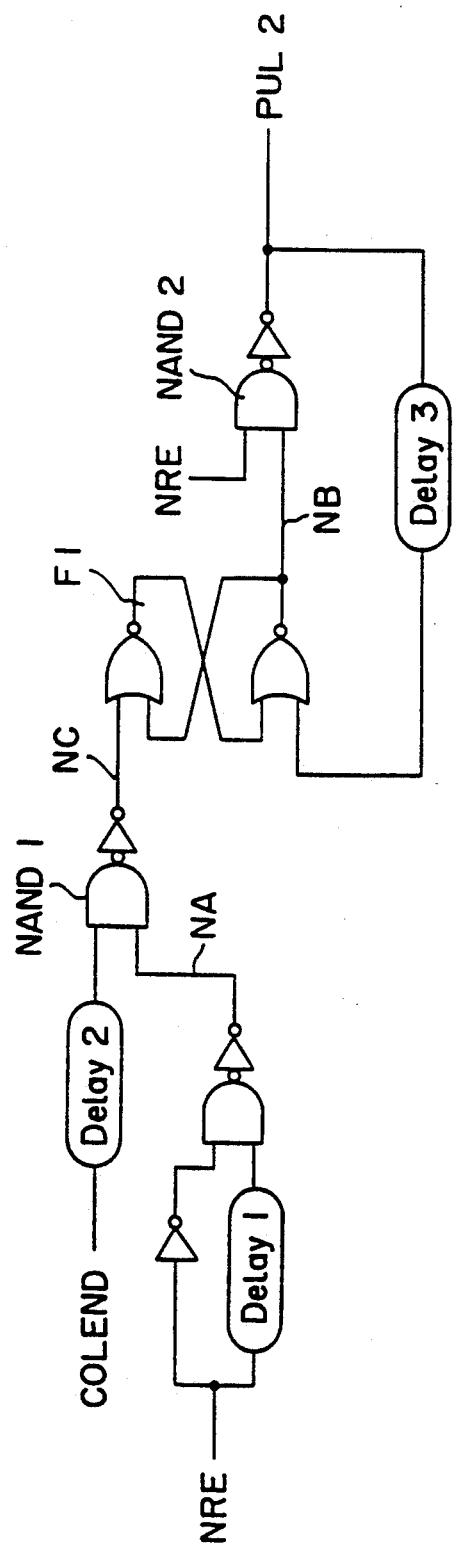
FIG. 36 shows a circuit for outputting a pulse signal PUL2.

The serial data read of this circuit according to the present invention will be described. FIG. 34 is a timing chart of main signals during one cycle of the random access and serial access. Signals PRE, BLCK, SEN, SENB, RLCH, and RLCHB are shown in FIG. 13. During the random access, the signal changes as shown in FIG. 34. After inputting three steps of addresses or after the serial access, the random read starts. When the Ready state enters, the word line selected by the previous operation is released and a word line to be accessed is selected. Thereafter, the signal PRE takes "H" level to precharge the bit line and data register. At this time, BLCD takes "H" level so that the bit line nd data register are connected together. Thereafter, PRE takes "L" level, and then the signal SEN changes from "L" to "H" to "L" and the signal RLCHB changes from "H" to "L" to "H". As a result, the node BLj of the data register is latched to "H" level. Thereafter, the signal RDENBR takes "H" level to apply a predetermined voltage to the control gate of a selected one of eight NAND cells. After the predetermined time lapse, the signal SEN changes from "L" to "H" and the signal SENB changes from "H" to "L", so that CINV5 shown in FIG. 15 is activated to sense the data. Thereafter, RLCH changes from "L" to "H" and RLCHB changes from "H" to "L" to latch the sensed data of one page. After the predetermined time lapse, data of the column start address is transferred from the data register to the output latches A and B. Namely, in response to the signal CEN, the output gate CSLij of the data register corresponding to the start address opens and the data is transferred to the current mirror sense amplifier. At the same time, CENAB is changed from "H" to "L" to "H" to transfer the data to the latch A. At this time, CENA changes from "L" to "H" to "L". CENBB is a signal operating generally in the same phase with NRE. When CENAB first changes from "H" to "L" to "H", the input gate of the latch B is open and so the data is transferred to the latch B. At the same time, the column address counters ABUF0 to ABUF2 are incremented once by PUL 1, the outputs indicating the next address. However, the internal address still indicates the start address because REP remains "L" level. The above operations are executed in the random access time period, and the Ready/Busy signal is set to "H" to inform the external circuit of the chip of the random read completion. In the following serial access, when the external control signal NRE takes "L" level, the start address data is outputted via the data output buffer from the latch B to the external circuit. At the same time, the chip performs the transfer operation of the next address data to the latch A. Namely, in response to the clock of the control signal NRE when the start address is outputted, the signal REP is outputted to receive the next address data in ABUF0 to ABUF2 at the address output latches ACL0 to ACL2 (thereafter, the contents of the column address buffer is incremented by using the signal PUL1, to obtain the second next address as the data in ABUF0 to ABUF2). In response to the signals CEN and CENAB, the next address data in the data register corresponding to the next address is transferred to the latch A. Thereafter, the control signal NRE takes "H" level, and the start address data is outputted, CENBB also takes "H" level, to thereby transfer the next address data in the latch A to the latch B. As above, address n data is outputted in response to a clock of the external control signal NRE and at the same time address n+1 data is transferred from the data register. Therefore, the serial access time as viewed from the outside of the chip is the time required for the data in the latch B to be outputted from the data output buffer, shortening the cycle time of data output. In this embodiment, data in the address buffers ABUF0 to ABUF2 indicates the address two addresses after the presently outputting address, and data in the address output latches ACL0 to ACL2 indicates the address one address after the presently outputting address. As a result, it is necessary to provide a signal for incrementing the row addresses AsS to A8S after the last column address data is outputted. As shown in FIG. 32, in this embodiment, as an input signal to the address buffer ABUF3, a signal PUL 2 is inputted. FIG. 35 shows the circuit which outputs the signal PUL2. When the address data one address after the last column address is outputted during the serial access by NRE clocks, the address output latches ACL0 to ACL2 indicate the last column address. In response to this, a signal COLEND is outputted to indicate the last column address. When a clock of the control signal NRE is outputted to output the last column address data, in response to the rising edge of the NRE signal a pulse signal is outputted to the node NA of the circuit shown in FIG. 36. At this time, one of the gates of NAND1 is inputted with "H". Therefore, a flip-flop F1 is set and the node NB takes "H" level. When the last address data is outputted and the control signal NRE takes "H" level, PUL2 is set to "H" level through NAND2 and holds this "H" level until the flip-flop F1 is reset through a delay circuit DELAY3. The delay time of the delay circuit DELAY3 is set not to receive the pulse outputted to the node NA in response to a clock of the control signal NRE when the signal COLEND takes "H" level for the address one address after the last column address. As above, PUL2 is outputted upon detection of an output of the last address data, and the contents of the address buffers A3 to A8 are incremented to perform the random access of the next page.

Next, the description will be given for the case wherein data can be written correctly even if there is a defective bit line.

Figure 37:
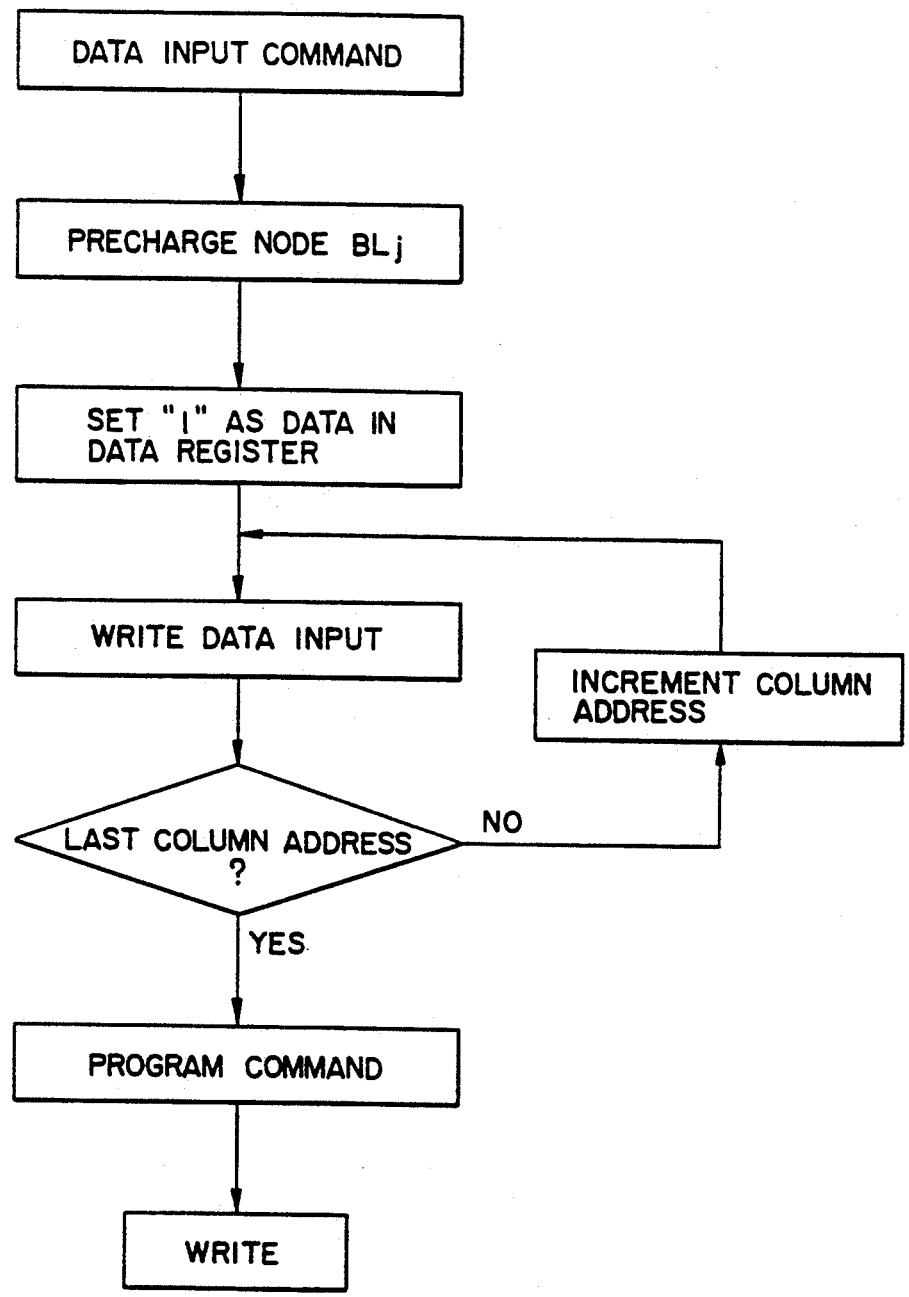
FIG. 37 is a flow chart illustrating a conventional data write operation to a data register.

FIG. 37 is a flow chart explaining the internal preset operation of the embodiment chip described above after entering the data input command. In the operation following this flow chart, the following problem occurs if there is a defective bit line Al short-circuited to the source line.

Generally, the column address of such a defective bit line is stored in a redundant circuit by means of a blown fuse or the like. When the address of the defective bit line is selected, the bit line of the column redundance circuit is selected in place of the defective bit line. However, the precharge operation and the initial data preset operation of data registers, respectively shown in FIG. 37, are performed for all bit lines irrespective of the column address Therefore, as shown in FIG. 13, the data register for the defective bits to be remedied by the redundant circuit is preset with write inhibit data "1" because the transistor with the signal PRE inputted to its gate becomes conductive. In this case, the following problem occurs. In the data latch circuit shown in FIG. 13, the potential of the power source VBITH of the latch circuit for the data register changes from the external power source potential $V_{cc}$ to the power source VDPI potential (10 V) supplied from the voltage booster built in the chip, and the signal BLCD changes from 0 V to the internal power source potential 12 V. Under these conditions, the node BLj of the data register connected to the defective bit line becomes "H" level by the preset operation. Therefore, the P-channel transistor of the clocked inverter CINV6 becomes conductive to flow a leakage current from the power source VBITH to the ground. The power source potential VDPI supplied from the voltage booster has a small current supply capability, generally of 1 mA or smaller. Therefore, as the leakage current flows through the defective bit line, the power source VBDI potential becomes lower than 12 V. The potentials of other write inhibit bit lines also become lower than 12 V, causing an erroneous data write.

Figure 38:
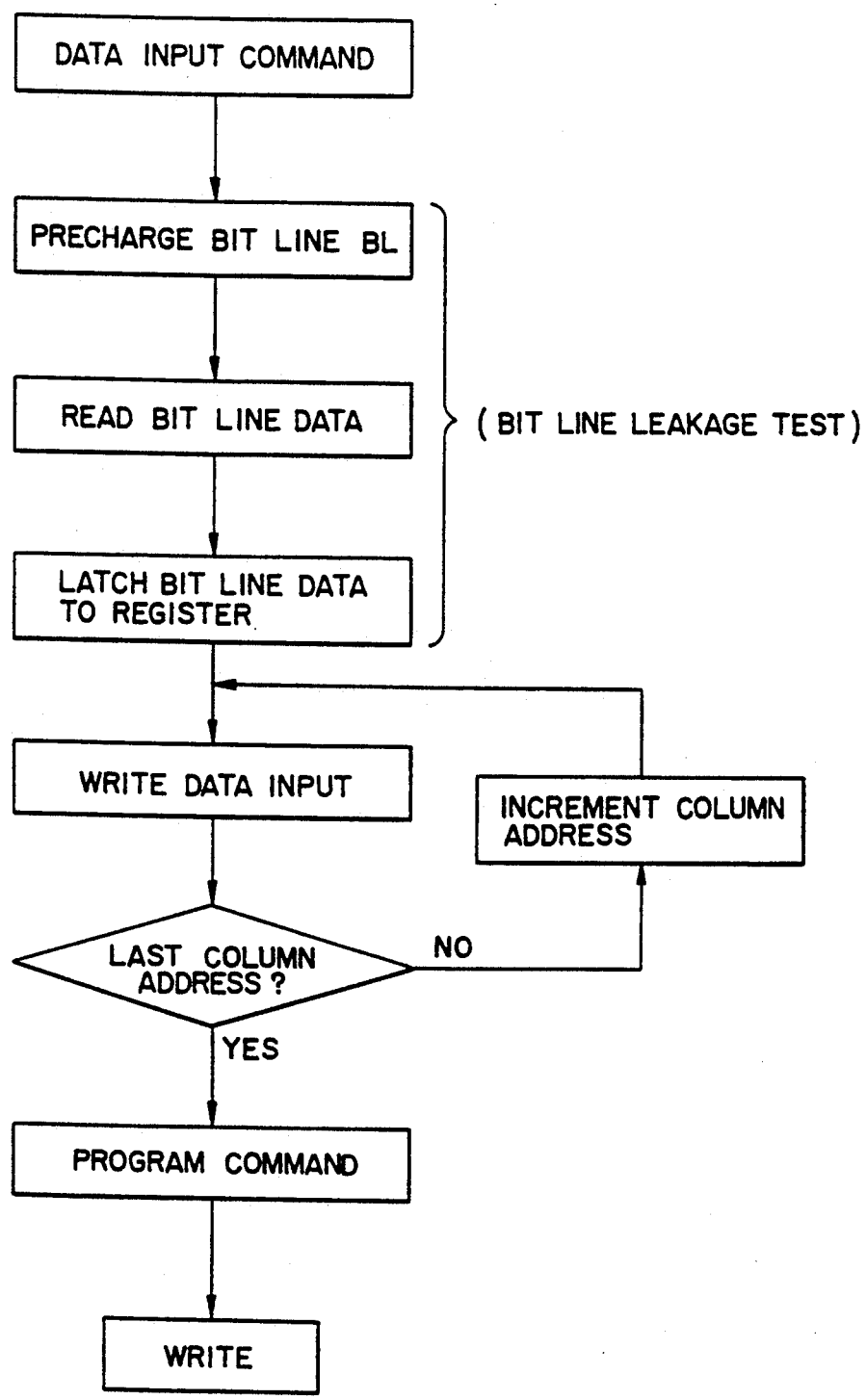
FIG. 38 is a flow chart illustrating a data write operation to a data register according to an embodiment of the present invention.
Figure 39:
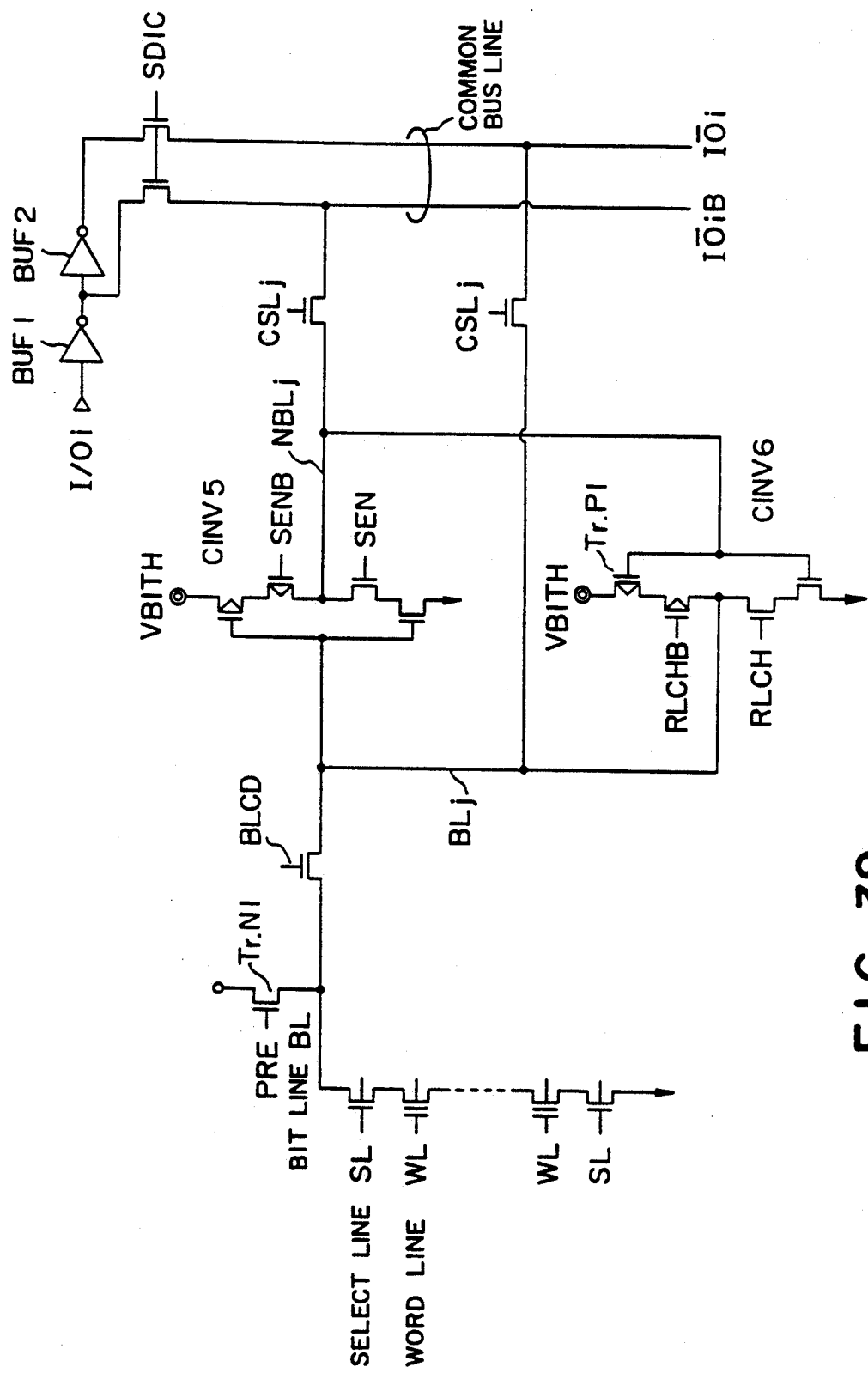
FIG. 39 is a circuit diagram showing an example of a sense amplifier/data register according to an embodiment of the present invention.
Figure 40:
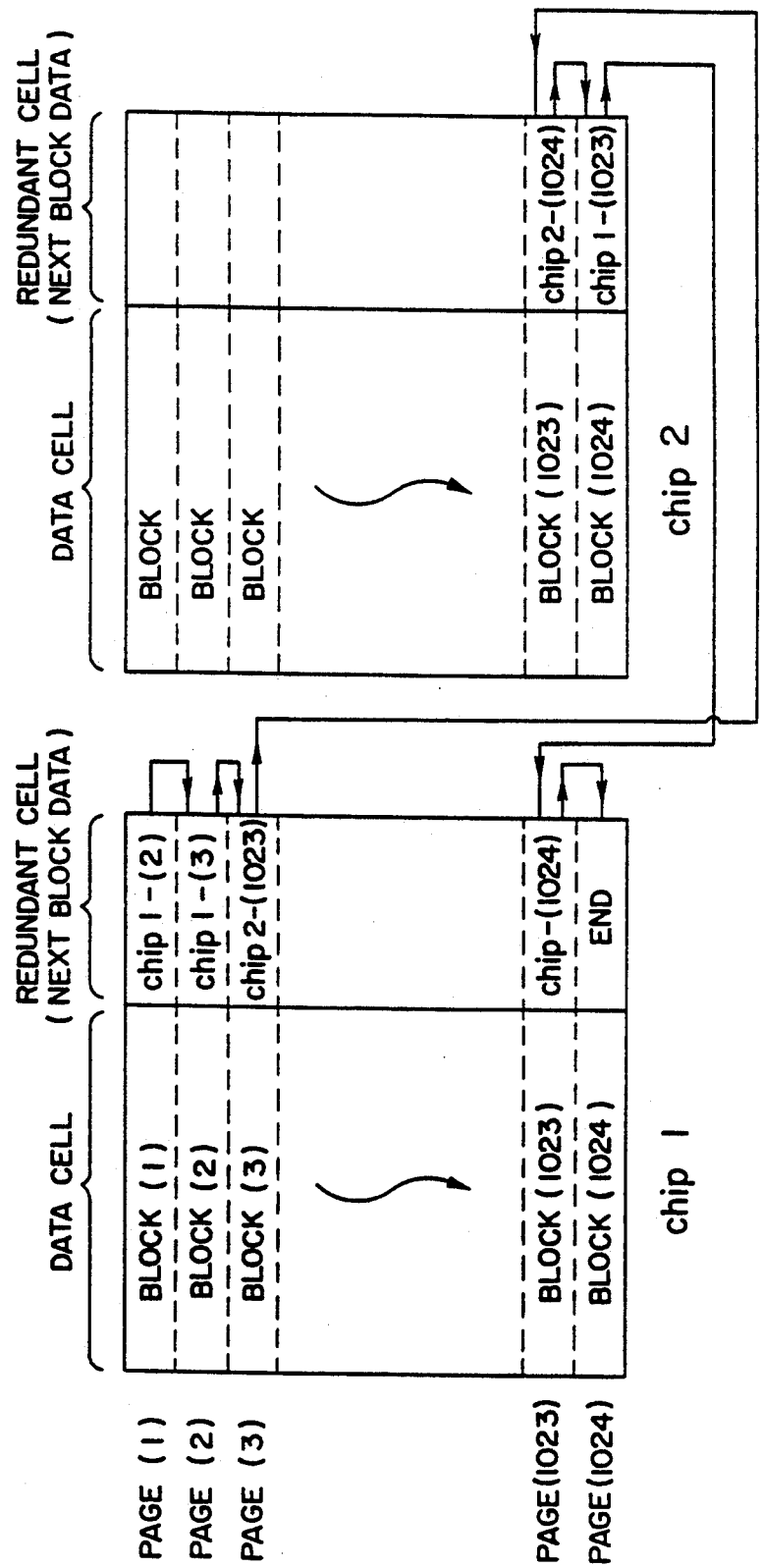
FIG. 40 is a block diagram showing a conventional semiconductor memory system.

FIG. 38 is a flow chart illustrating the write operation eliminating such a problem according to another embodiment of the present invention. FIG. 39 is a circuit diagram of a sense amplifier and data register of this embodiment. In this embodiment, when the data input command is entered, each bit line is charged via an N-channel transistor RiNi connected to the bit line. After a predetermined data read time after the bit line is charged, the signal BLCD is set to "H" level to transfer the data on the bit line to the data register. During this predetermined time, all select lines are set to a non-select state. As a result, the level at the bit line with leakage lowers to "L" level, and the level at the normal bit line without leakage maintains "H" level. The level of the bit line is latched by the data register. After this bit line leakage test, the data register connected to the defective bit line is latched with write data "0" irrespective of the data in the memory cell, and the level at the node BLj of the data register is preset to "L" level. The data register connected to the normal bit line is latched with write data "1", and the level at the node BLj of the data register is preset to "H" level. As shown in FIG. 38, upon completion of the bit line leakage test mode, write data at the address designated in the address input mode is inputted to the data register, to thereafter perform the data write.

In this embodiment, the contents of the data register connected to the defective bit line are data "0" as described above. Therefore, the P-channel transistor TrP1 of the clocked inverter CINV6 of the data register is non-conductive. From this reason, even if the BLCD is set to 12 V after the start of the data write operation, a leakage current will not flow from the power source VBITH to the ground, preventing the voltage of the VBITH from lowering.

The data register preset operation using the bit line leakage test may be executed when a reset command for FF or the like is inputted. In such a system, prior to the data write, i.e., prior to entering the data input command, an FF reset command is executed. As a result, the contents of the data register connected to the defective bit line are preset to data "0", and the contents of the data register connected to the normal bit line are preset to data "1". The data input command is entered thereafter to input data at the designated address and thereafter write data.

As described above, according to this embodiment of the present invention, the contents of the data registers of one page are continuously read starting from the entered address, thereafter a Busy signal representing the access inhibition of the chip is outputted to the external circuit, and the row address is automatically incremented to transfer data in the memory cells to the data registers. Accordingly, memory cell data of a desired data length can be continuously read without the address management of one page by the external circuit of the chip.

Furthermore, when data from the address designated by the input address to an optional address is inputted, the contents of the data registers at the addresses of the designated page are automatically set to predetermined data. Accordingly, the data write for data smaller than one page can be executed without inputting one page data, shortening the data write time. Still further, the chip reset operation upon power-on is performed using a program/erase protect signal, reliably resetting the chip contents without using a power-on reset circuit.

Figure 41:
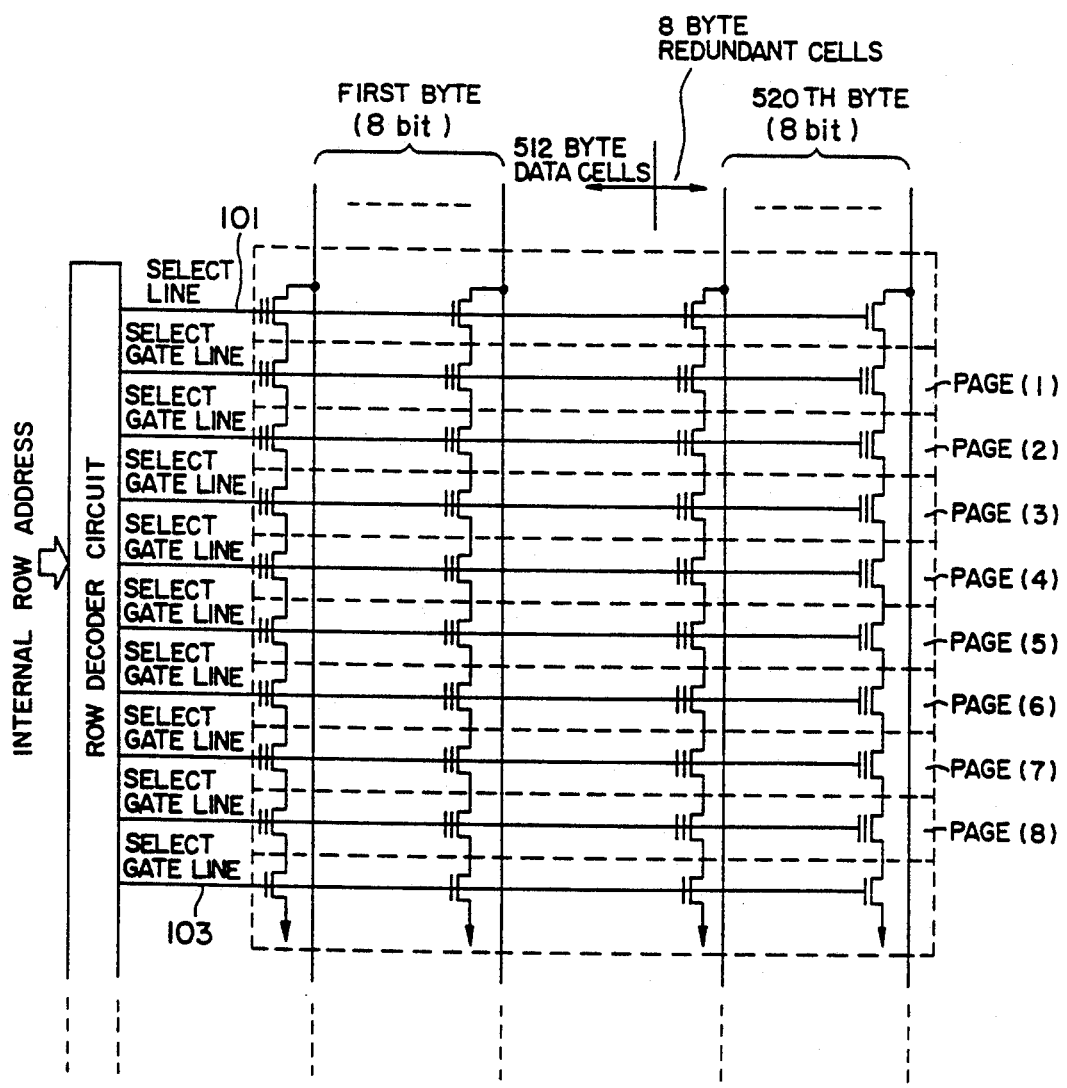
FIG. 41 is a circuit diagram showing an embodiment of the present invention.
Figure 42:
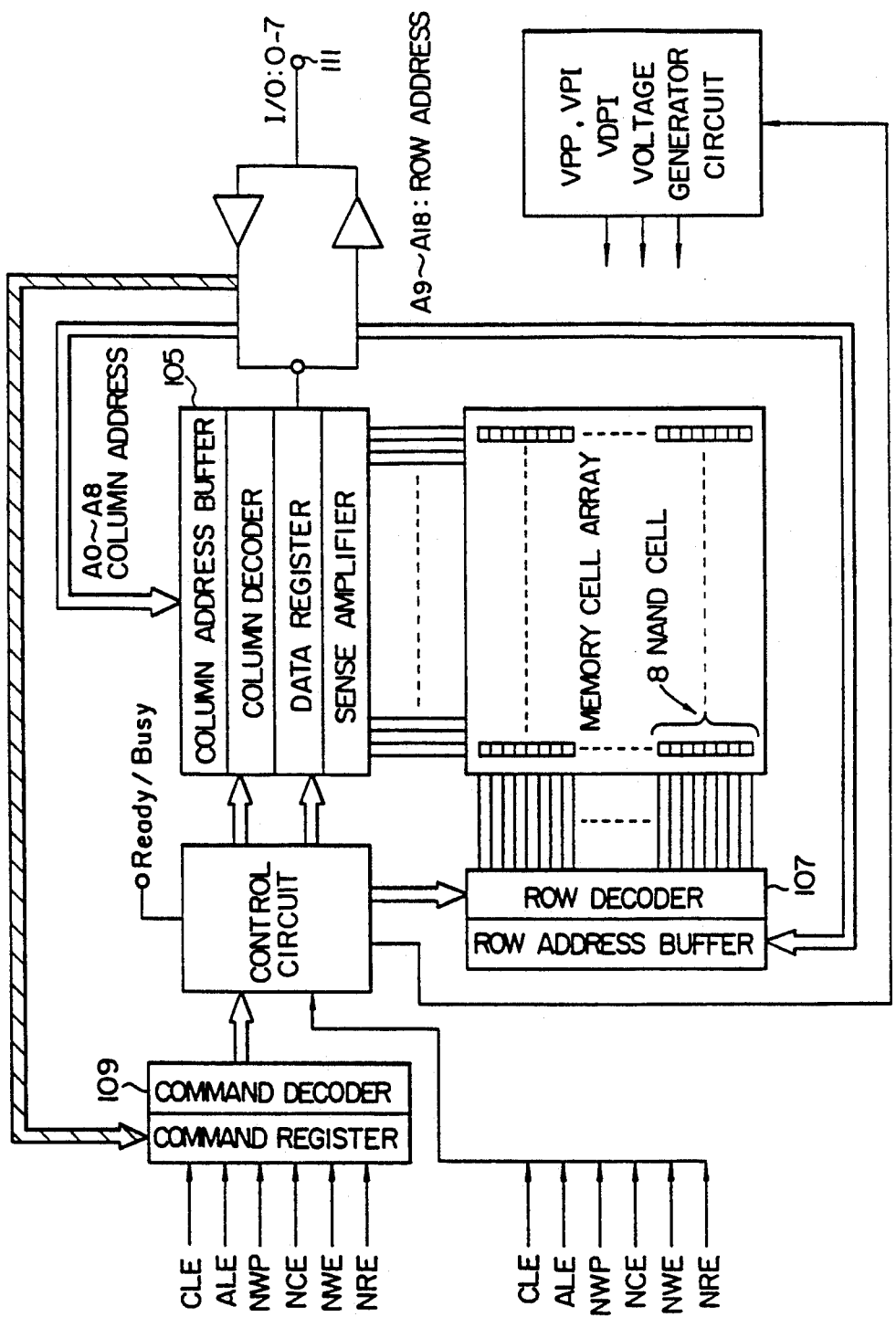
FIG. 42 is a block diagram showing an embodiment of the present invention.

Another embodiment of the present invention will be described with reference to associated drawings FIG. 41 is a circuit diagram showing the layout of memory cells for pages (1) to (8). In this example, 8-byte memory cells are provided in the column direction. One NAND bundle has serially connected eight memory cells, a drain side select lines, and a source side select line 103. A plurality of NAND bundles disposed in parallel in the column direction for eight pages. FIG. 42 is a system diagram in block showing the non-volatile semiconductor memory device according to the present invention. The different point of the device shown in FIG. 42 from that shown in FIG. 1 is only the number of bits for the I/O0 to I/O7, column addresses A0 to A8, and row addresses A9 to A18. The column address A0 to A8 inputted from an I/O pin 111 is stored in a column address buffer circuit 105. The row address A9 to A18 is stored in a row address buffer circuit 107. The other circuit portions are the same as FIG. 1.

The data read operation of the non-volatile semiconductor memory of this embodiment will be described. First, the operation in the first data read mode of the non-volatile semiconductor memory of the embodiment will be described with reference to FIG. 43. FIG. 43 is a diagram showing inputted external control signal waveforms and data output timings when memory cell data is continuously read from an address designated by inputted column address (intra-page address) N and page address M.

First, in the address input mode shown in FIG. 2, the column address and page address are received in the address buffers, and an access disable signal of "L" level indicating the Busy state is outputted to the external circuit. As shown in FIG. 42(b), memory cell data of page M connected to the selected word line, i.e., at row address M, is outputted to bit lines and latched in the data register circuits. After this latch operation, an access enable signal of "H" level indicating the Ready state is outputted to inform the chip controller of the ready state of data read. Next, as shown in FIG. 43(c), in response to a clock of the external control signal NRE sent from the chip control system, data is outputted at the access time of 70 nsec starting from the inputted intra-page address (column address) N while incrementing the internal column address. Next, when data is read at the last intra-page address (column address 519), as shown in FIG. 43(d), the internal page address (internal row address) is incremented, the access disable signal of "L" level indicating the Busy state is outputted to the external circuit, and memory cell data connected to the word line selected by the new internal page address (M+1) is latched by the data register circuits. After this latch operation, the access enable signal of "H" level indicating the Ready state is outputted to the external circuit. As shown in FIG. 43(e), in response to a clock of the external control signal NRE, data is outputted starting from the intra-page address (column address) 0 at page (M+1) while incrementing the internal column address. These operations are repeated for the data of a desired length. After reading the last data, the external control signal NCE is set to "H" level to terminate a series of data read operations.

Next, the operation in the second data read mode of the non-volatile semiconductor memory of the embodiment will be described with reference to FIG. 44. FIG. 44 is a diagram showing inputted external control signal waveforms and data output timings when memory cell data is continuously read from an address designated by inputted column address N and page address M in the address input mode. Similar to the first data read mode, in the address input mode, the column address and page address are received in the address buffers, and the access disable signal of "L" level indicating the Busy state is outputted to the external circuit. As shown in FIG. 44(b), similar to the first data read mode, memory cell data of page M is outputted to bit lines and latched in the data register circuits. After this latch operation, the access enable signal of "H" level indicating the Ready state is outputted to inform the external circuit of the ready state of data read. Next, in response to a clock of the external control signal NRE, data is outputted starting from the inputted intra-page address (column address). In the second data read mode, the address buffer is constructed such that the internal address indicates address 512+N basing upon the column address N inputted in the address input mode. Therefore, address N in the 8-byte redundant cells becomes the start address for the serial data read. As shown in FIG. 44(c), memory cell data in the data registers is sequentially outputted to the external circuit at the access time of 70 nsec starting from address N in redundant cells, in response to clocks of the external control signal NRE, while incrementing the internal intra-page address (internal column address). After data at the last intra-page address (column address 19) is serially read, the internal page address is incremented and the access disable signal of "L" level indicating the Busy state is outputted to the external circuit. As shown in FIG. 44(d), memory cell data connected to the word line selected by the incremented next internal address (M+1) is latched to the data register circuits. After this data latch, the access enable signal of "H" level indicating the Ready state is outputted to the external circuit. Different from the first data read mode, the internal intra-page address (internal column address) is reset to the start address (address 512) of redundant cells. Therefore, when a clock of the external control signal NRE is supplied from the external circuit after the chip enters the Ready state, as shown in FIG. 44(e) memory cell data is continuously read starting from the intra-page address 512 (address 0 of 8-byte redundant cells) in response to the external control signal NRE. The first serial data read after the address input starts from the designated column address, whereas the serial data read after incrementing the internal page address starts from the address 0 (column address 512) of redundant cells. These continuous data read operations continue to the last address of the chip. After reading the last data, the external control signal NCE is set to "H" level to terminate the data read.

As the address buffer circuit, the circuit shown in FIG. 4 is used. As described previously, the address buffer circuit is constructed so as to perform the address input and increment operations.

Figure 45:
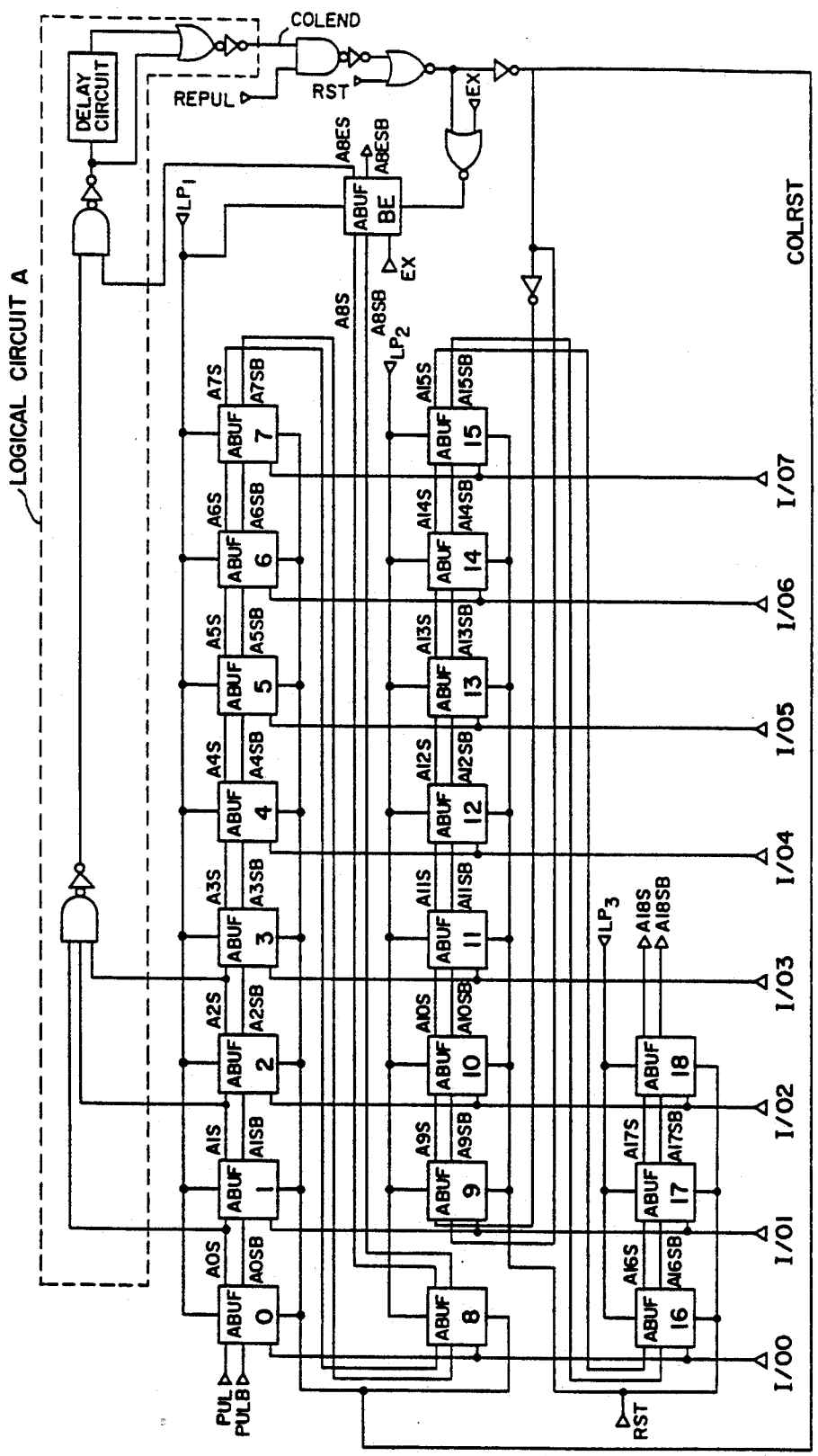
FIG. 45 is a circuit diagram of an embodiment of the present invention.

FIG. 45 is a circuit diagram of address buffer circuits explaining the internal address operation of a 4 M-bit non-volatile semiconductor memory having column addresses A0 to A8 and row addresses A9 to A18 according to the present invention. The structure of each address buffer circuit labeled ABUF0 to ABUF18, and ABUF8E is the same as the address buffer circuit shown in FIG. 4. The address buffer circuits ABUF0 to ABUF18 output internal addresses A0S to A18S. A control signal LP1 is supplied to the latch signal input terminal (LPn) of each of the address buffer circuits ABUF0 to ABUF7, and ABUF8E. A control signal LP2 is supplied to the latch signal input terminal of each of the address buffer circuits ABUF8 to ABUF15. A control signal LP3 is supplied to the latch signal input terminal of each of the address buffer circuits ABUF16 to ABUF18. Data input terminals Dn of the address buffer circuits ABUF0, ABUF8, and ABUF16 are connected in common to an I/O0 terminal. Data input terminals of the address buffer circuits ABUF1, ABUF9, and ABUF17 are connected in common to an I/O1 terminal. Similarly, data input terminals of the address buffer circuits ABUF2, ABUF10, and ABUF18 are connected in common to an I/O2 terminal. Data input terminals of the address buffer circuits ABUF3 and ABUF11 are connected to an I/O3 terminal, data input terminal of the address buffer circuits ABUF4 and ABUF12 are connected to an I/O4 terminal, data input terminals of ABUF5 and ABUF13 are connected to an I/O5 terminal, data input terminals of ABUF6 and ABUF14 are connected to an I/O6 terminal, and data input terminals of ABUF7 and ABUF15 are connected to an I/O7 terminal. Supplied to reset terminals (RST) of the address buffer circuits ABUF0 to ABUF8 for the column addresses A0 to A8 is a signal COLRST which is an OR signal between a signal RST taking "H" level for resetting the internal of the chip upon power-on and a pulse signal COLEND taking "H" level when data at the last column address is read. Supplied to the reset terminals of the address buffer circuits ABUF9 to ABUF18 for the row addresses A9 to A18 is the reset signal RST. Inputted to the reset terminal of the address buffer circuit ABUF8E added for the selection of redundant memory cells disposed from the 512-th byte in the column direction is a NOR signal between a signal opposite in phase to the signal COLRST and an internal control signal EX taking "L" level in the first data read mode and "H" level in the second data read mode.

Connected to input terminals Ai-1S and Ai-1SB of the address buffer circuits ABUF1 to ABUF8, and ABUF10 to ABUF18 are internal address signal output terminals AiS and AiSB for the lower addresses of the address buffer circuits. The input terminal Ai-1S of the address buffer circuit ABUF0 for the lowest column address is supplied with a pulse signal PUL taking "L" level for a predetermined time in response to the falling edge of the external control signal NRE. The other input terminal Ai-1SB thereof is supplied with the inverted signal PULB of the pulse signal PUL. The input terminal Ai-1S of the address buffer circuit ABUF9 for the lowest row address is inputted with an inverted signal of the signal COLRST. The other input terminal Ai-1SB thereof is inputted with the signal COLRST. The input terminal Ai-1S of the address buffer circuit ABUF8E is connected to the internal address signal output terminal AiS of the address buffer circuit ABUF8, and the other input terminal Ai-1SB thereof is connected to the internal address signal output terminal AisB of the address buffer circuit ABUF8.

The internal address signals A0S to A8S, and A8ES and their inverted signals outputted from the address buffer circuits ABUF0 to ABUF8, and ABUF8E are inputted to the column decoder circuit as described previously. In this embodiment, the column address has 10 bits. It is therefore possible to select bit lines of one byte among 1024 bytes at a maximum. The redundant memory cells are constructed of eight bytes so that the last column address is address 519. In this embodiment, in order not to select an internal address after address 519, there is provided a last column address detector means for detecting when the last column address 519 is detected. When the last column address is selected, the level at the internal address output terminal of each column address buffer takes the following values: A0S="H", A0SB="L"; A1S="H", A1SB="L"; A2S="H", A2SB ="L"; A3S="L", A3SB="H"; A4S="L", A4SB="H": A5S ="L", A5SB="H"; A6S="L", A6SB="H", A7S="L", A7SB ="H"; A8S="L", A8SB="H", A8ES="H", A8ESB="L". In this embodiment, a logical circuit A is constructed such that the signal COLEND changes from "L" to "H" level when the last address is selected and A8ES, A0S, A1S, and A2S all take "H" level. Using a change of the signal COLEND, it is checked whether the last column address is selected or not. A signal REPUL shown in FIG. 37 is an internal pulse signal taking "H" level for a predetermined time when the external control signal NRE changes from "L" to "H" level.

The operation of the address input mode wherein address data inputted from the I/O terminal to the address buffer circuit is stored will be described below.

The external control signal NWE is changed from "H" to "L" to "H" in order to input address data from the data input terminals. Then, an address latch control signal LP1 generates which changes from "H" to "L" to "H". The other address latch control signals LP2 and LP3 are set to "H". As a result, as described previously, address data A0 to A7 supplied to the I/O0 to I/O7 terminals are latched by the address buffer circuits and the internal address signals are set to logical levels corresponding to the inputted address data. Next, the external control signal NWE is changed from "H" to "L" to "H" in order to input address data A8 to A15 from the data input terminal I/O0 to I/O7. Then, the pulse address latch control signal LP2 generates which changes from "H" to "L" to "H". The other address latch control signals LP1 and LP3 are set to "H". As a result, address data A8 to A15 supplied to the I/O0 to I/O7 is latched by the address buffer circuits ABUF8 to ABUF15 and the internal address signals are set to logical levels corresponding to the inputted address data.

Lastly, address data A16 to A18 is supplied to the I/O0 to I/O7 terminals and the external control signal NWE is changed from "H" to "L" to "H". As a result, the address latch control signal LP3 generates which changes from "H" to "L" to "H". The address data A16 to A18 are latched by the address buffer circuits ABUF16 to ABUF18. In the above manner, with the three steps of the NWE pulse, address data A0 to A18 supplied to the I/O terminals are inputted to the address buffer circuits.

The circuit for generating the address latch control signals LP1 to LP3 is the same as shown in FIG. 6.

The serial data read operation in the first and second data read modes will be described next.

Figure 46:
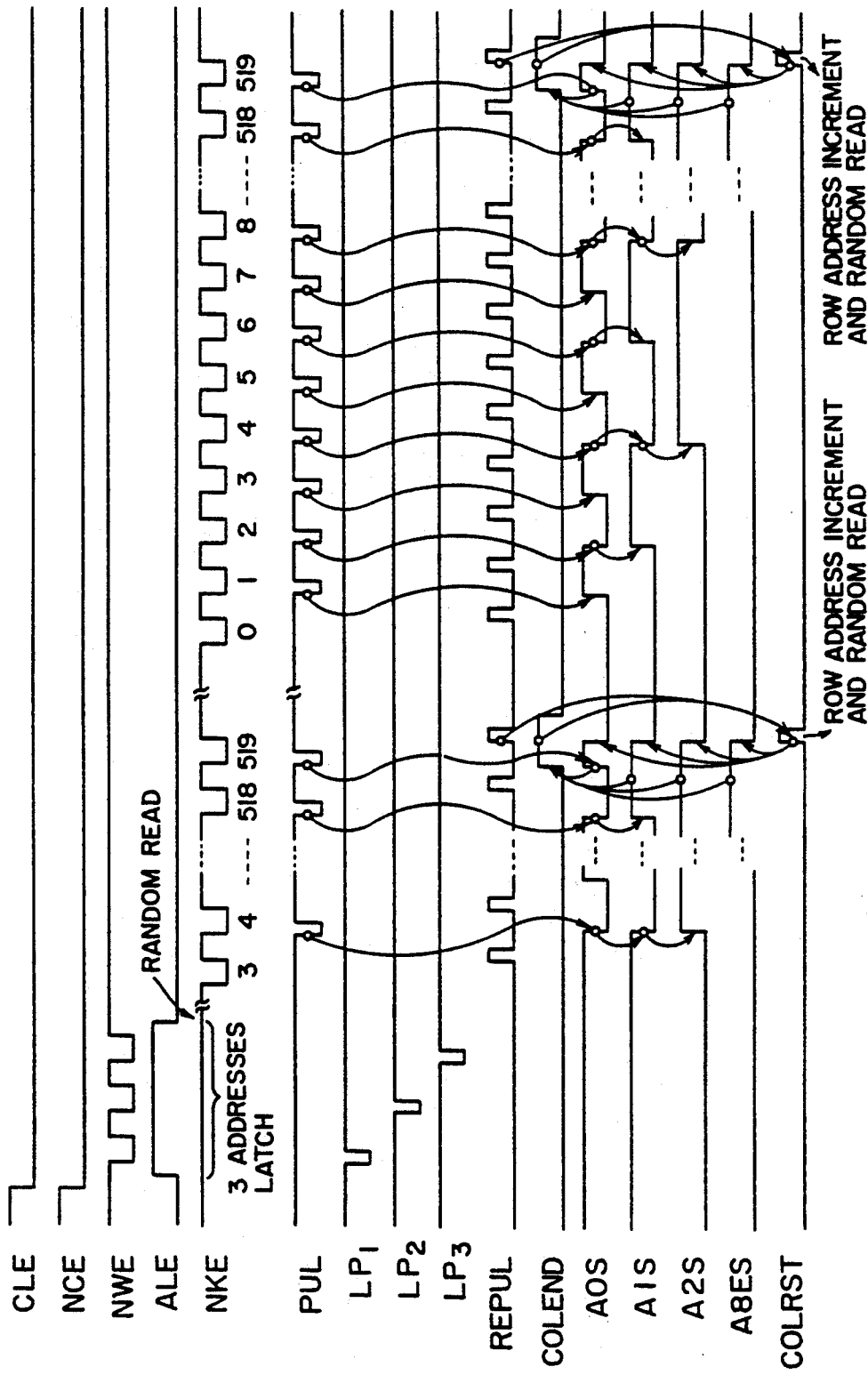
FIG. 46 is a timing chart explaining an embodiment of the present invention.

First, the operation of the first data read mode will be described. The first and second data read modes can be effected when a predetermined command is entered from the external circuit in the command input mode. When the predetermined command is entered, the internal control signal EX changes from "L" to "H" level. When this command is entered again, the internal control signal EX changes from "H" to "L" level. Instead of using the command, the internal control signal EX may be replaced with an externally inputted internal control signal. The internal control signal may be designed as desired by a chip designer. In this embodiment, in the first data read mode in which the column data read start address is set to address 0 after the random data read, the internal control signal EX takes "L" level, and in the second data read mode in which the column data read start address is set to address 512, the internal control signal EX takes "H" level. In the first data read mode with the internal control signal EX set to "L" level, when the negative logic address latch control signal LP1 is outputted in the address input mode, the address buffer circuit ABUF8E latches the internal address signal of "L" level, the output signal A8ES of the address buffer circuit is set to "L" level, and A8ESB is set to "H" level. FIG. 46 is a timing chart of external and internal control signals explaining the first data read mode wherein column address 3 is set in the address input mode of the first data read mode.

The data read operation when the external control signal NRE is changed from "H" to "L" to "H" after the first random data read, will be described in the following. The pulse signal PUL is outputted when the external control signal NRE changes from "H" to "L" to "H" in the data read mode. As described previously, the signal PUL and its inverted signal PULB are supplied to the input terminals Ai-1S and i-1SB of the address buffer circuit ABUF0. However, for the data read from the column address immediately after the address input and for the data read from the column address immediately after the page address is switched and the data register contents are changed, this pulse signal PUL is not outputted even when the Ready/Busy signal changes from "L" to "H". In the semiconductor memory constructed as above, the external control signal NRE changes from "H" to "L" level after the address input. Since the internal address signal A8ES is set to "L" level, the contents of the data register at address 3 are outputted to the I/O terminal which changes from the high impedance state to a predetermined level corresponding to the output data.

The pulse signal PUL does not generate at the first NRE clock as described above. Therefore, the internal address signal to be outputted from the address buffer circuit does not change, but the data at address 3 is outputted to the external circuit. When the external control signal NRE changes next from "L" to "H" level, the I/O terminal takes the high impedance state. When the external control signal NRE changes from "H" to "L" level again, the pulse signal PUL generates. As a result, the internal address signal A0S of the address buffer circuit ABUF0 changes from "H" to "L" level. In response to the level change of the internal address signal A0S, the internal address signal A1S of the address buffer circuit ABUF1 changes from "H" to "L" level. In response to the level change of the address signal A1S, the internal address signal A2S changes from "L" to "H" level. Thereafter, the contents of the data register (at column address 4) selected by the internal address are outputted to the I/O terminal. When the external control signal NRE changes thereafter from "L" to "H" level, the I/O terminal takes the high impedance state.

As above, the internal column address determined by the internal column address signals A0S to A8ES is sequentially incremented. When the external control signal NRE changes from "H" to "L" level at the 517-th step, the internal address signals A0S, A1S, A2S, and A8ES are all set to all "H" level as described previously, changing the signal COLEND from "L" to "H" level. A pulse signal REPUL is a positive logic signal to be outputted in response to the level change from "L" to "H" of the external control signal NRE. When the external control signal NRE changes from "L" to "H" level while the signal COLEND takes "H" level, the positive logic pulse signal COLRST corresponding to the pulse signal REPUL is outputted to increment the internal row address. At the same time, the Busy signal is outputted to start the random data read. Also at this time, the column address buffers ABUF0 to ABUF8, and ABUF8E are reset and the internal column addresses indicate address 0. In this manner, the serial data read is executed in response to clocks of the external control signal NRE. After data at the last column address in redundant memory cells is read, the internal column address takes address 0 and the internal row address (page address) takes incremented row address. After a predetermined random data read time, memory cell data at the incremented row address is transferred to data registers, and the Ready signal is outputted to the Ready/Busy terminal. Thereafter, at the first serial data read upon input of the clock of the external control signal NRE, the signal PUL will not be outputted as described previously because the Ready/Busy signal changed from "L" to "H" level. Therefore, the contents of the data register at address 0 are outputted to the I/O terminal.

Thereafter, the data serial read is executed up to the last column address in response to clocks of the external control signal. Thereafter, the Busy signal is again outputted to the Ready/Busy terminal, and memory cell data at the next page address is transferred to data registers. The serial data read thereafter continues in response to clocks of the external control signal NRE.

Figure 47:
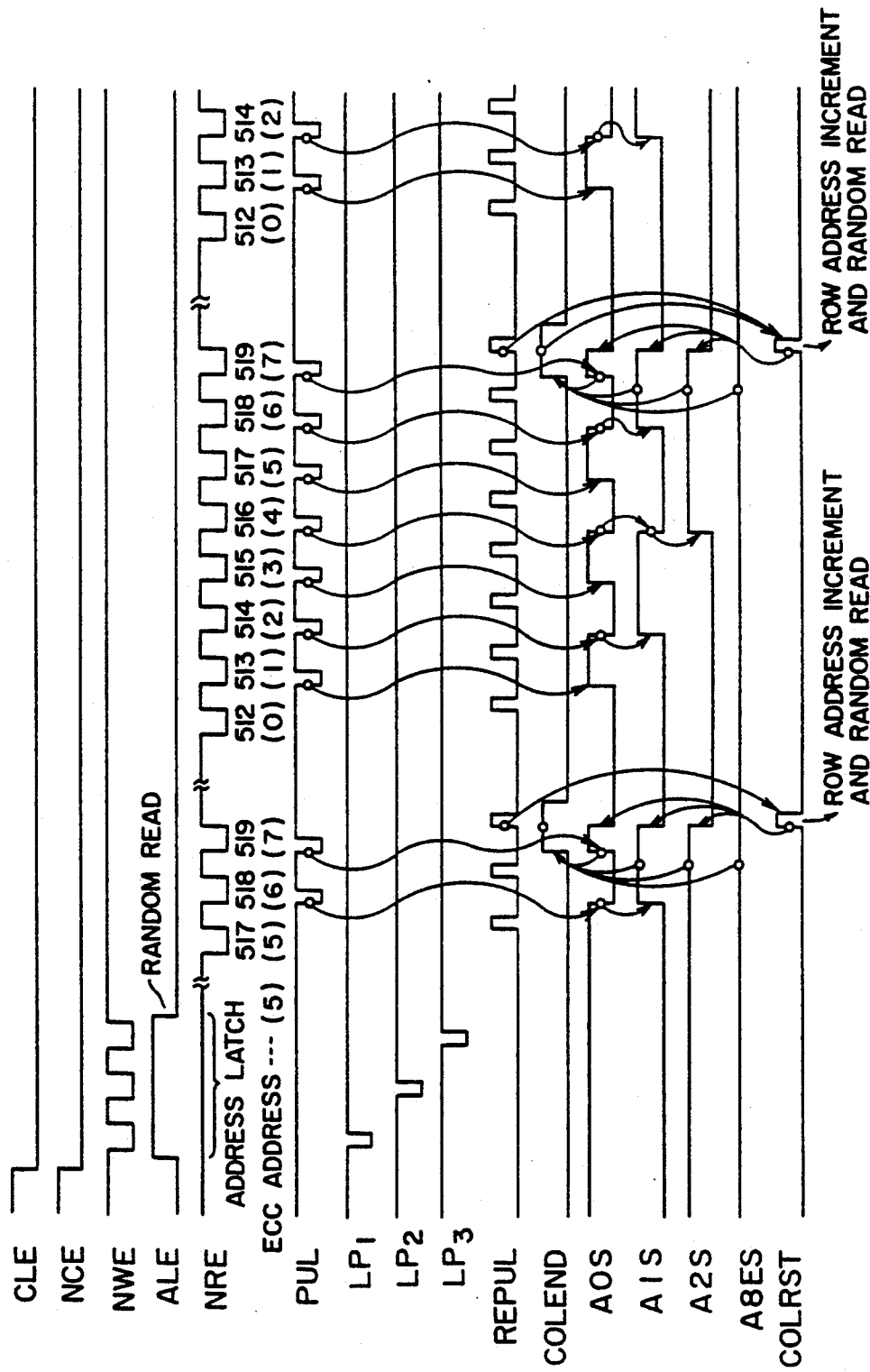
FIG. 47 is a timing chart explaining an embodiment of the present invention.

Next, the operation of the second data read mode will be described. In the second data read mode, the internal control signal EX takes "H" level. In the address input mode, the negative logic address latch control signal LP1 is outputted. As a result, the address buffer circuit ABUSF8E latches the internal address signal of "H" level, the output signal A8ES of the address buffer circuit is set to "H" level, and A8ESB is set to "L" level. Therefore, when address N is designated in the address input mode, the internal column address takes address 512+N. In other words, when address N is designated in the second data read mode, it means that address N in a redundant memory cell block is designated. FIG. 47 is a timing chart of external and internal control signals explaining the second data read mode wherein column address 5 is set in the address input mode of the second data read mode. The operations of the address input mode and the random data read mode thereafter are the same as those described with the first data read mode. Thereafter, the serial data read mode starts in response to a clock of the external control signal NRE. Since A8ES takes "H" level, data in the data registers is sequentially read from the column address 517 (512+5) to the last column address 519. In the second data read mode, the internal column address signal A8ES is fixed to "H" level, and the internal address determined by the internal column address signals A0S to A8S is incremented by the signal PUL. When the external control signal NRE changes at the third step from "H" to "L" level, the internal address signals A0S, A1S, A2S, and A8ES all take "H" level. As a result, similar to the first data read mode, the signal COLEND changes from "L" to "H" level When the external control signal NRE changes from "L" to "H" level while the signal COLEND takes "H" level, the pulse signal COLRST is outputted. Therefore, similar to the first data read mode, the row address is incremented, and the address buffers ABUF0 to ABUF8 are reset by the reset signal COLRST. However, in this case, the reset terminal of the address buffer circuit ABUF8E is inputted with a NOR signal between the inverted signal of the pulse signal COLRST and the signal EX of "H" level in the second data read mode. Therefore, even if the pulse signal COLRST is outputted, the address buffer circuit ABUF8E is not reset. As a result, the internal address signals A0S to A8S are set to "L" level, and A8ES is set to "H" level. The internal address after reading data at the last column indicates address 512. Thereafter, similar to the first data read mode, the random data read is performed to read memory cell data to data registers. Then, the Ready signal is outputted to the Ready/Busy terminal. After the random data read, the external control signal NRE is changed to perform the serial data read of memory cell data at the incremented row address, so that the contents of the data registers are sequentially read starting from the column start address 512 of the redundant memory cell block. After data is read up to the last column address in response to clocks of the external control signal NRE, the Busy signal is again outputted to the Ready/Busy terminal, and memory cell data at the next page addresses is transferred to data registers. Thereafter, the serial data read is again executed starting from the column start address of the redundant memory cell block.

The circuit of this embodiment described above has the first and second data read modes. In the first data mode, inputted data is read starting from the corresponding memory cell address, the serial data read continues up to the last column address of the redundant memory cells, and thereafter, data at the next page is read starting from address 0. In the second data mode, inputted data is read starting from an optional redundant memory cell address, the serial data read continues up to the last column data, and thereafter, data at the next page is read starting from address 0 of redundant column memory cells. As a result, the chip control is easy and the load on the external system is small, for the case where only redundant memory cell data is continuously read. The embodiment circuit shown in FIG. 41 is constructed of memory cells of 512 bytes in the column direction and redundant memory cells of 8 bytes in the column direction. However, as appreciated from the contents of the present invention, the invention is not limited only to such a memory structure. Furthermore, in this embodiment, page continuity information is stored in redundant memory cells. The invention is also applicable to the case where the data structure is constructed of (A1+B1)+(A2+B2)+...+(An+Bn) (A and B are the same data length), and data of the data structure (B1+B2+...+Bn) is required to be continuously read. In this case, there are provided column address buffer circuits as many as they are sufficient for designating the data length of A+B, and a circuit for controlling the address buffer reset operation enabling the internal column address to indicate the start address of data B after data at the last column address is read in the second data read mode. This can be easily realized through modification of the embodiment circuit of the present invention.

For example, the number of overwrite times may be stored in a redundant bit of a page. When this number exceeds the number of write/erase times allowed by the ratings of the NAND cell structure EEPROM, such information is written in a redundant bit of the page so as not to access this page thereafter. With such a system design, the reliability of the semiconductor memory device can be further improved. In such a case, it is necessary to continuously read the number of write/erase times stored in a redundant bit at a predetermined time interval, and to write a flag data "0" level in the redundant bit when the number exceeds the predetermined value. Accordingly, if data only in the redundant bits is continuously read in the second data read mode, it is possible to check the numbers of overwrite times of all pages at high speed.

Furthermore, by applying this embodiment to the fundamental data structure of A+B+C, the same data in the memory chip can be continuously read in different data lengths of A+B+C, B+C, and C. In such a case, at the serial data read after reading data at the last column address, the address buffer circuit is controlled such that the internal column address indicates address 0 in the first data read mode, that the internal column address indicates the start address of data B in the second data read mode, and that the internal column address indicates the start address of data C in the third data read mode.

We claim:

1. A semiconductor memory device having a plurality of memory cells disposed in a matrix form, data in said memory cells at a selected row being transferred in parallel to a plurality of data registers, the data transferred in said data registers being serially outputted to an external circuit, and the above-described operations being repeated to allow a page data read operation, comprising:

address input means for storing a data read start address inputted from said external circuit;

address control means for incrementing an internal address stored in said address input means;

read means for transferring data in said memory cells to said data registers after outputting data of one page from said data registers; and busy signal output means for outputting a busy signal indicating a disabled access to said external circuit while said read means is transferring data.

2. A semiconductor memory device having a plurality of memory cells disposed in a matrix form, and a plurality of data stored from an external circuit in a plurality of data registers being written simultaneously in said memory cells at a selected row to allow a page data write operation, comprising:

address input means for storing a data write start address inputted from said external circuit;

address control means for incrementing an internal address stored in said address input means;

data input means for writing data from said external circuit into said data registers among said plurality of data registers designated by said internal addresses; and data setting means for setting data in the other data registers not written with data to a predetermined write data.

3. A semiconductor memory device having a plurality of memory cells disposed in a matrix form, data in said memory cells at a selected row being transferred in parallel to a plurality of data registers, the data transferred in said data registers being serially outputted to an external circuit, the above-described operations being repeated, a plurality of data stored from said external circuit in said plurality of data registers being written simultaneously in said memory cells at a selected row, to allow page data read and write operations, comprising:

address input means for storing a data read start address inputted from said external circuit;

address control means for incrementing an internal address stored in said address input means;

read means for transferring data in said memory cells to said data registers after outputting data of one page from said data registers;

busy signal output means for outputting a busy signal indicating a disabled access to said external circuit while said read means is transferring data;

data input means for writing data from said external circuit into said data registers among said plurality of data registers designated by said internal addresses; and data setting means for setting data in the other data registers not written with data to a predetermined write data.

4. A semiconductor memory device according to claim 1, wherein when said read start address inputted from said external circuit is stored in said address input means, said data in said memory cells is automatically transferred to said data registers and said busy signal is automatically outputted to said external circuit.

5. A semiconductor memory device having a plurality of memory cells disposed in a matrix form, a plurality of data registers for temporarily storing data at each column, and a page read mode for storing page data in said memory cells at a selected row in said data registers and sequentially outputting said page data in said data registers to an external circuit, comprising:

a first mode for sequentially outputting, when said selected row is changed, the contents of said data registers to said external circuit starting from a first predetermined column; and a second mode for sequentially outputting, when said selected row is changed, the contents of said data registers to said external circuit starting from a second predetermined column.

6. A semiconductor memory device having a plurality of memory cells disposed in a matrix form, a plurality of data registers for temporarily storing data at each column, and a page read mode for storing page data in said memory cells at a selected row in said data registers and sequentially outputting said page data in said data registers to an external circuit, comprising:

control means for controlling to sequentially output in a first mode, when said selected row is changed, the contents of said data registers to said external circuit starting from a first predetermined column, and to sequentially output in a second mode, when said selected row is changed, the contents of said data registers to said external circuit starting from a second predetermined column.

* * * * *